(12) United States Patent
Kamiya et al.

(10) Patent No.: US 6,534,867 B1
(45) Date of Patent: Mar. 18, 2003

(54) SEMICONDUCTOR DEVICE, SEMICONDUCTOR ELEMENT AND METHOD FOR PRODUCING SAME

(75) Inventors: Eiji Kamiya, Kamakura (JP); Toshitake Yaegashi, Yokohama (JP); Kazuhiro Shimizu, Yokohama (JP); Riichiro Shirota, Fujisawa (JP); Yuji Takeuchi, Kawasaki (JP); Norihisa Arai, Omiya (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/670,990

(22) Filed: Sep. 26, 2000

(30) Foreign Application Priority Data

Sep. 27, 1999 (JP) .............................. 11-273466
May 1, 2000 (JP) ........................ 2000-132083

(51) Int. Cl.[7] .............................................. H01L 23/48
(52) U.S. Cl. ....................... 257/754; 257/755; 257/758; 257/763; 257/314; 257/382
(58) Field of Search ................................ 257/758, 763, 257/754, 755, 314, 315, 382, 383

(56) References Cited

U.S. PATENT DOCUMENTS 6,236,059 B1 * 5/2001 Wolstenholme et al. ........ 257/3
6,278,163 B1 * 8/2001 Pio et al. ..................... 257/408

FOREIGN PATENT DOCUMENTS

JP          8-64701          3/1996

OTHER PUBLICATIONS

U.S. patent application Ser. No. 09/670,990, filed Sep. 26, 2000, pending.
U.S. patent application Ser. No. 09/925,418, filed Aug. 10, 2001, pending.
U.S. patent application Ser. No. 09/670,990, filed Sep. 26, 2000, pending.
U.S. patent application Ser. No. 09/956,986, filed Sep. 21, 2001, pending.

* cited by examiner

Primary Examiner—T. N. Quach
(74) Attorney, Agent, or Firm—Oblon, Spivak, McClelland, Maier & Neustadt, P.C.

(57) ABSTRACT

A semiconductor device comprises: a semiconductor substrate; a plurality of first diffusion layers having a low impurity density, the first diffusion layers being formed on the surface of the semiconductor substrate; a plurality of second diffusion layers having a high impurity density, the second diffusion layers being formed on the surface of the semiconductor substrate; a plurality of first contacts, each of which contacts the first diffusion layers and each of which is formed of a semiconductor; and a plurality of second contacts, each of which contacts the second diffusion layers and each of which is formed of a metal.

6 Claims, 78 Drawing Sheets

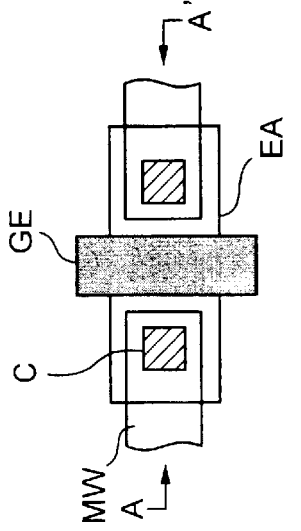
FIG. 1(a) LOW-VOLTAGE NMOS
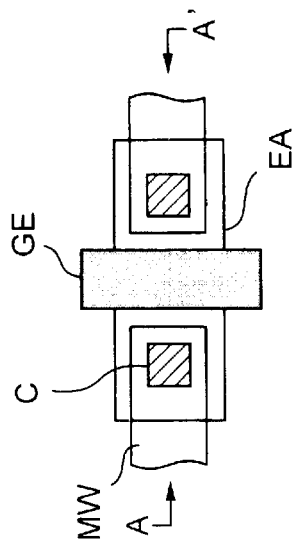
FIG. 1(b) LOW-VOLTAGE PMOS
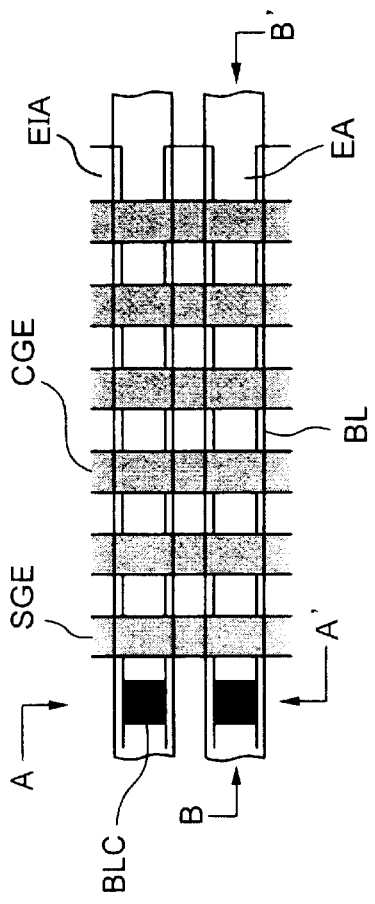
FIG. 1(c) HIGH-VOLTAGE NMOS
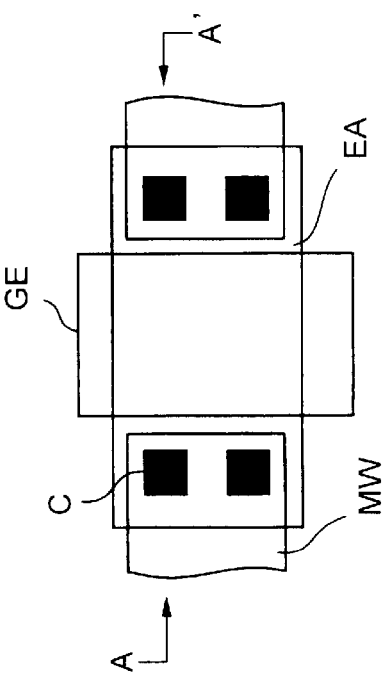
FIG. 1(d) MEMORY CELL PORTION

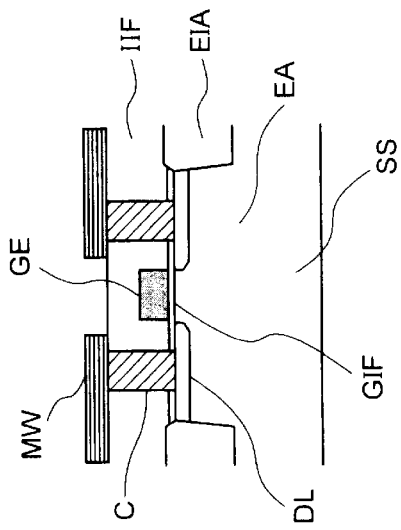
FIG. 2(b) LOW-VOLTAGE PMOS
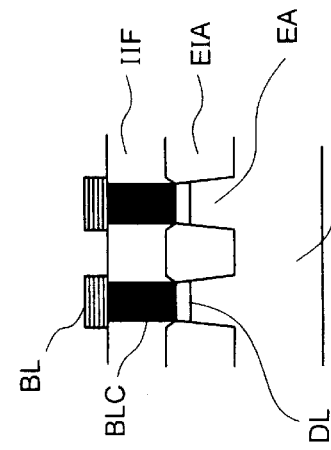
FIG. 2(d) MEMORY CELL PORTION
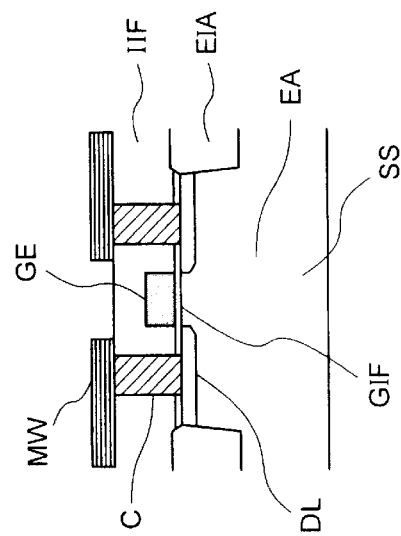
FIG. 2(a) LOW-VOLTAGE NMOS
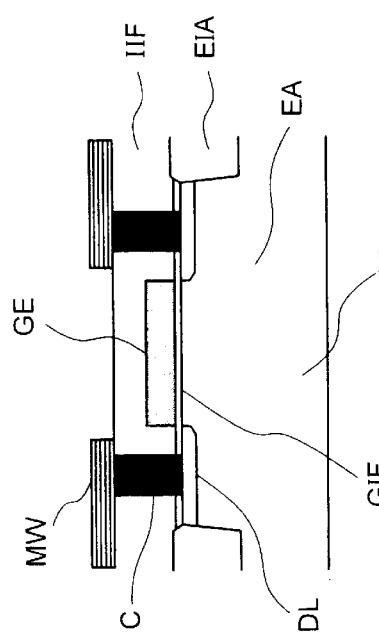
FIG. 2(c) HIGH-VOLTAGE NMOS

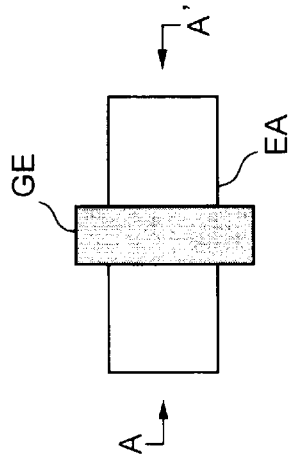
FIG. 4(b) LOW-VOLTAGE PMOS
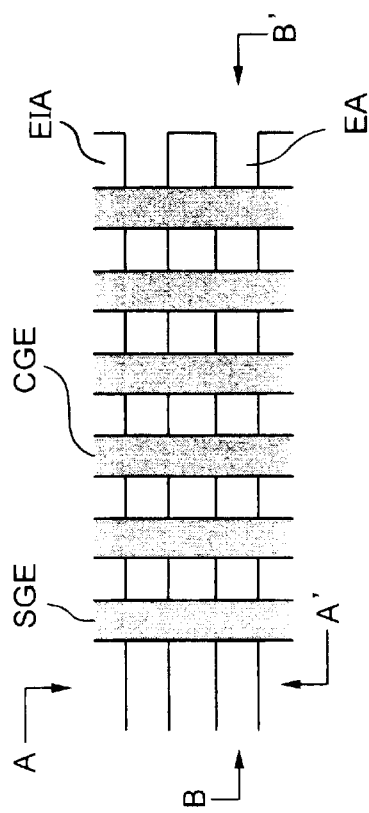
FIG. 4(d) MEMORY CELL PORTION
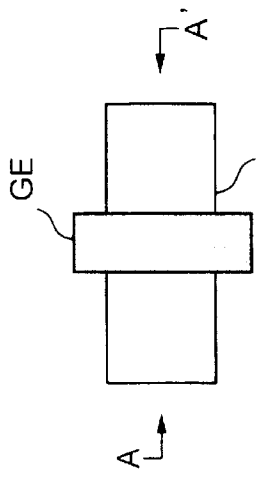
FIG. 4(a) LOW-VOLTAGE NMOS
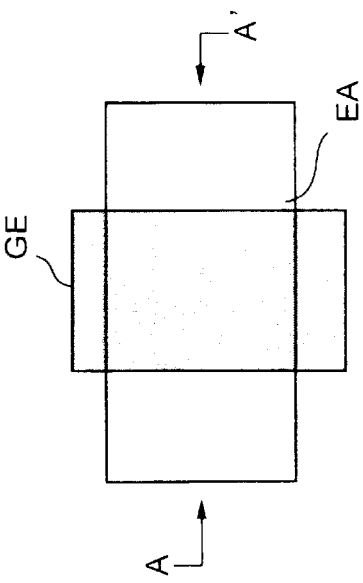
FIG. 4(c) HIGH-VOLTAGE NMOS

LOW-VOLTAGE PMOS

MEMORY CELL PORTION

LOW-VOLTAGE NMOS

HIGH-VOLTAGE NMOS

LOW-VOLTAGE NMOS

LOW-VOLTAGE PMOS

HIGH-VOLTAGE NMOS

MEMORY CELL PORTION

LOW-VOLTAGE PMOS

MEMORY CELL PORTION

LOW-VOLTAGE NMOS

HIGH-VOLTAGE NMOS

LOW-VOLTAGE NMOS

LOW-VOLTAGE PMOS

HIGH-VOLTAGE NMOS

MEMORY CELL PORTION

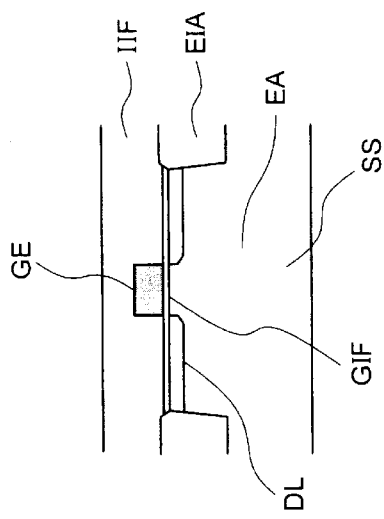
FIG. 9(a) LOW-VOLTAGE NMOS
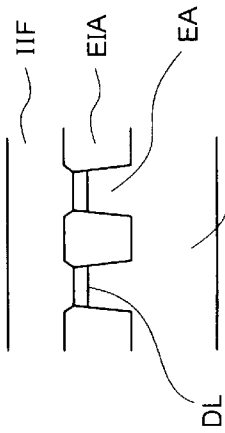
FIG. 9(b) LOW-VOLTAGE PMOS
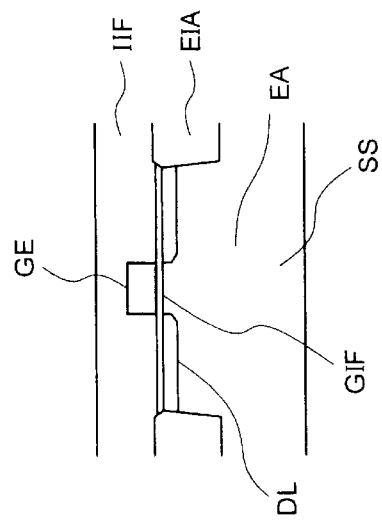
FIG. 9(c) HIGH-VOLTAGE NMOS
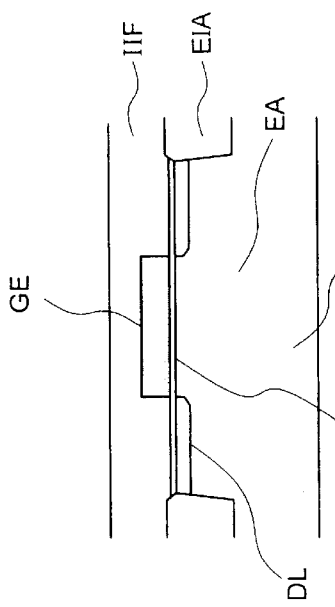
FIG. 9(d) MEMORY CELL PORTION

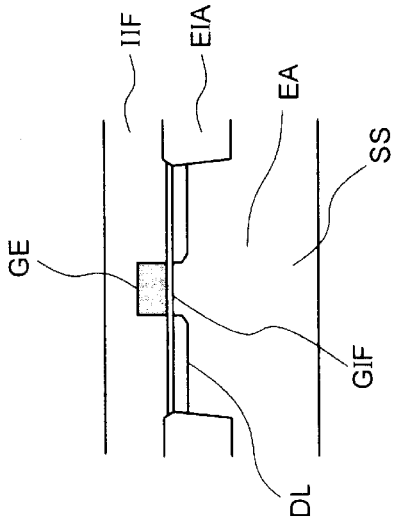
FIG. 10(a) LOW-VOLTAGE NMOS
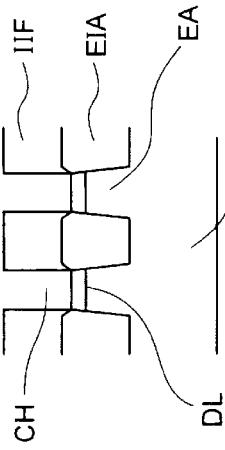
FIG. 10(b) LOW-VOLTAGE PMOS
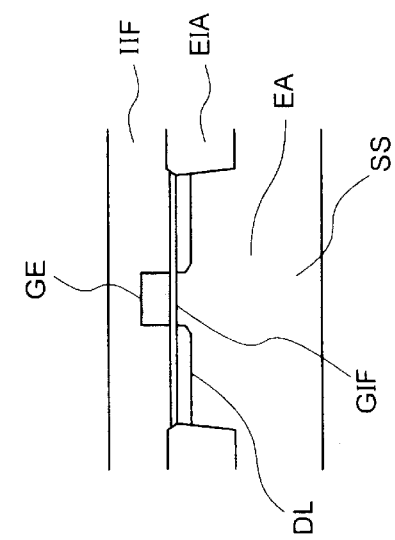
FIG. 10(c) HIGH-VOLTAGE NMOS
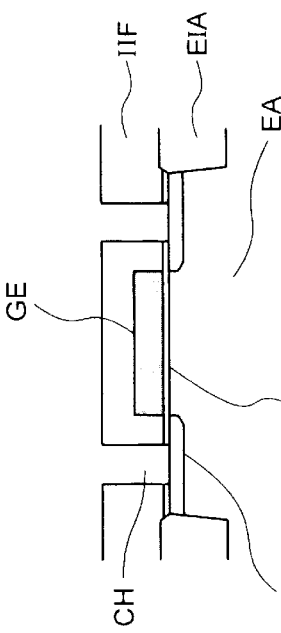
FIG. 10(d) MEMORY CELL PORTION

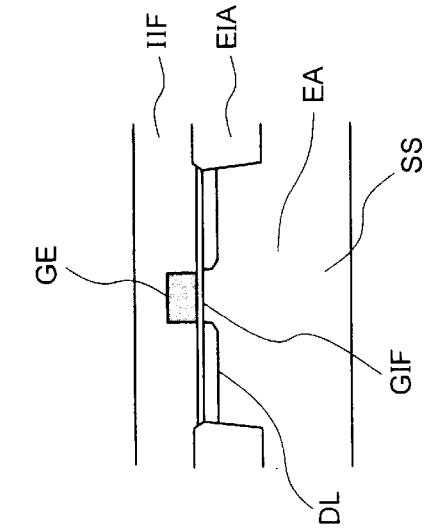
FIG. 11(a) LOW-VOLTAGE NMOS
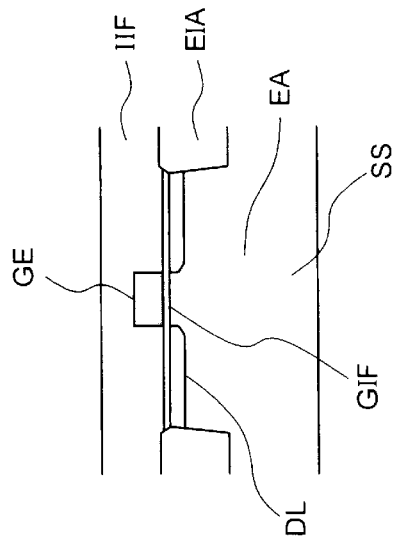
FIG. 11(b) LOW-VOLTAGE PMOS
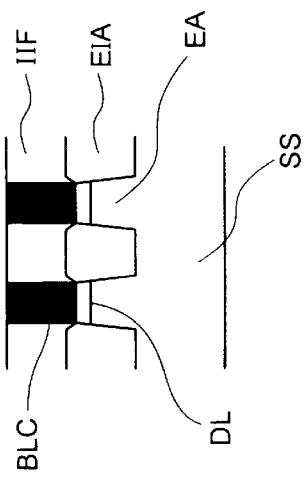
FIG. 11(c) HIGH-VOLTAGE NMOS
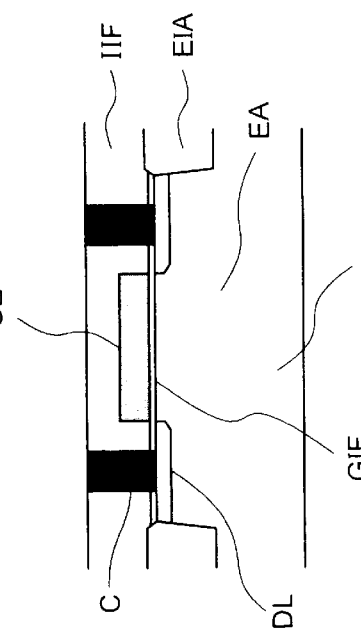
FIG. 11(d) MEMORY CELL PORTION

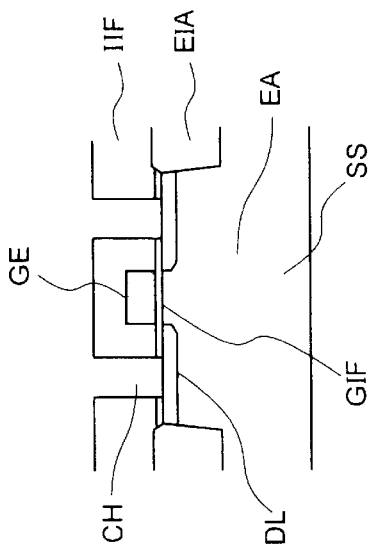
FIG. 12(a) LOW-VOLTAGE NMOS
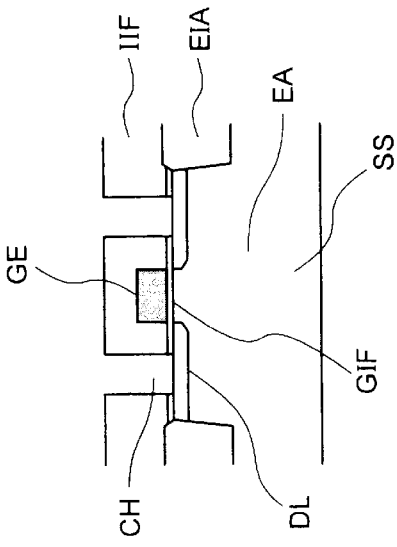
FIG. 12(b) LOW-VOLTAGE PMOS
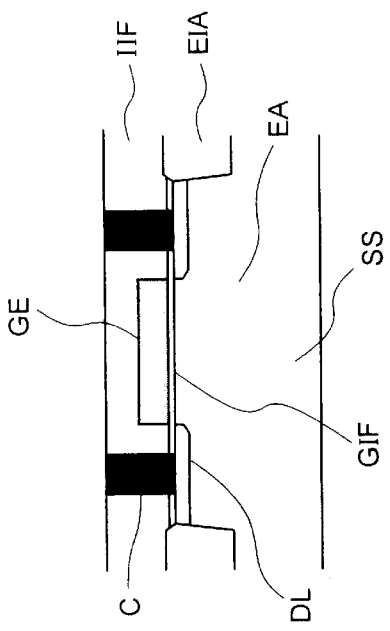
FIG. 12(c) HIGH-VOLTAGE NMOS
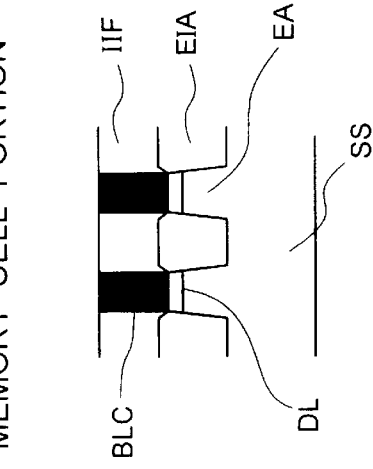
FIG. 12(d) MEMORY CELL PORTION

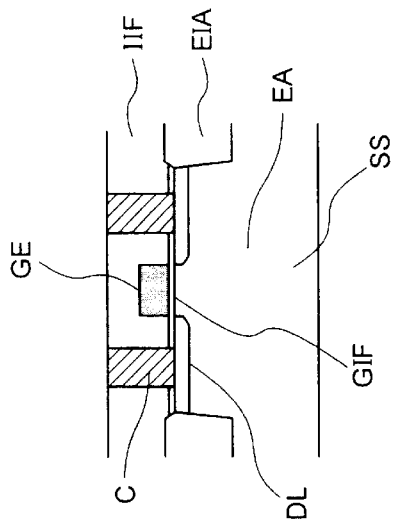
FIG. 13(a) LOW-VOLTAGE NMOS
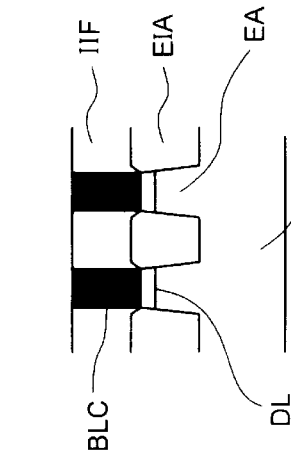
FIG. 13(b) LOW-VOLTAGE PMOS
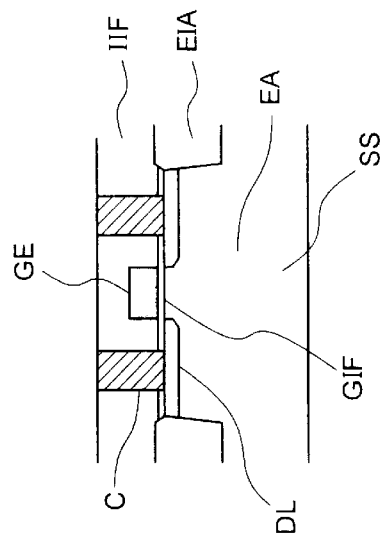
FIG. 13(c) HIGH-VOLTAGE NMOS
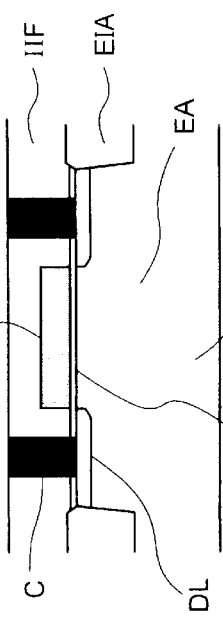
FIG. 13(d) MEMORY CELL PORTION

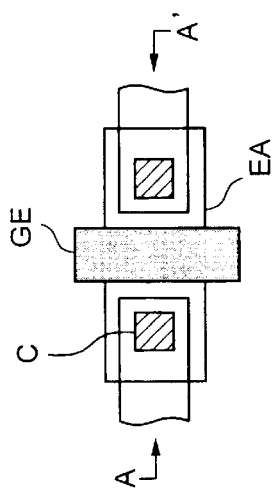
FIG. 19(b) LOW-VOLTAGE PMOS
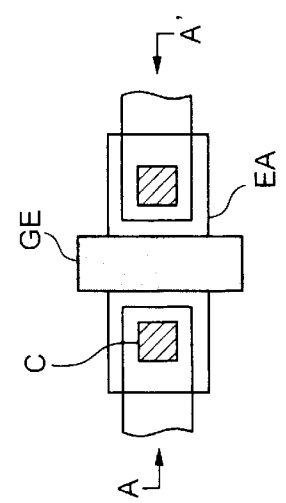
FIG. 19(a) LOW-VOLTAGE NMOS
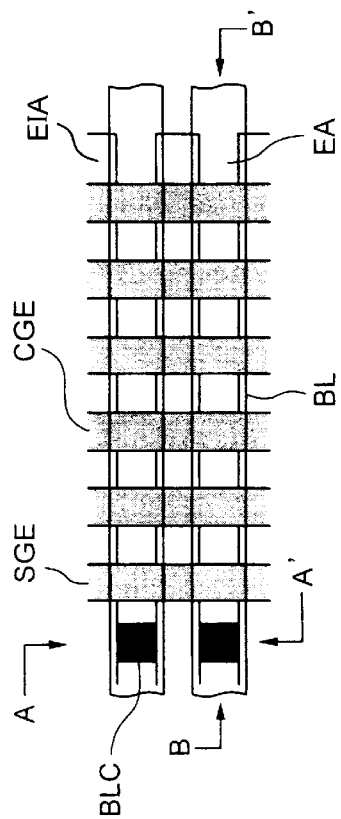
FIG. 19(d) MEMORY CELL PORTION
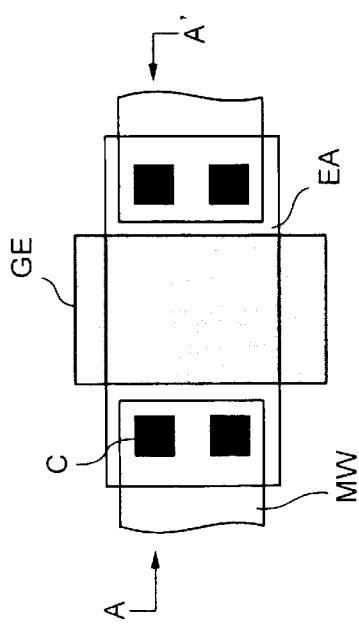
FIG. 19(c) HIGH-VOLTAGE NMOS

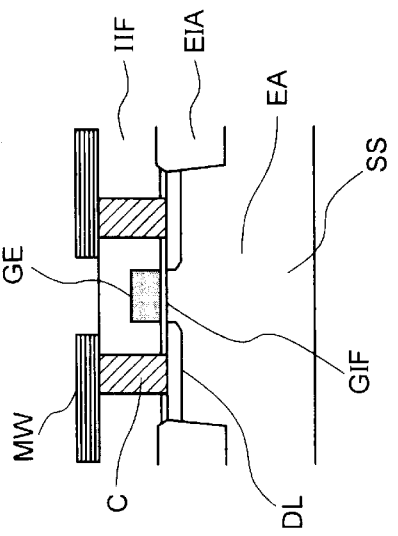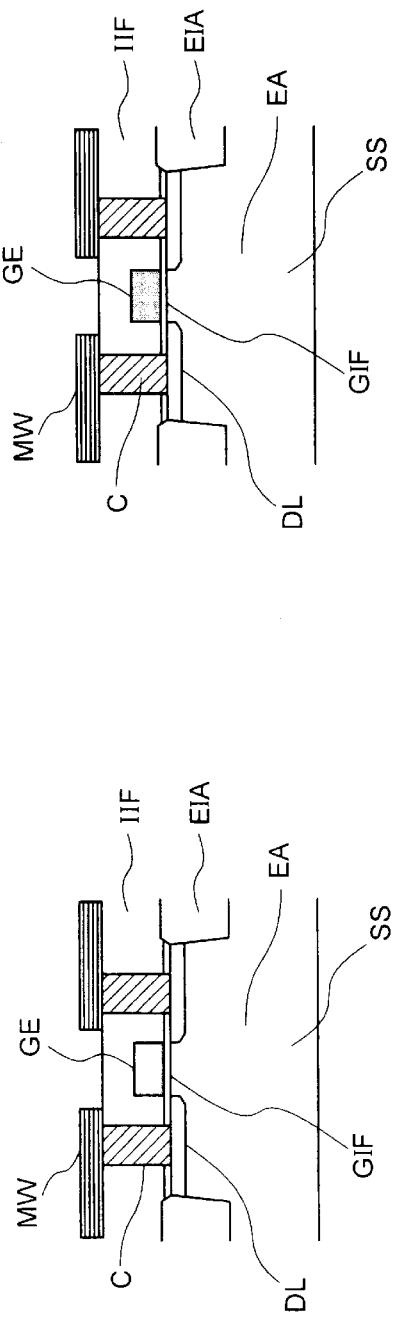

LOW-VOLTAGE NMOS

LOW-VOLTAGE PMOS

HIGH-VOLTAGE NMOS

MEMORY CELL PORTION

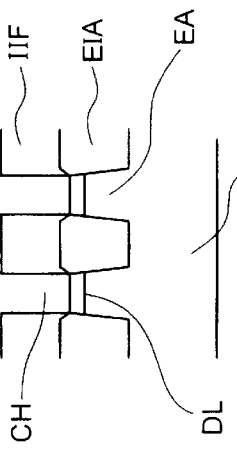
FIG. 23(b) LOW-VOLTAGE PMOS
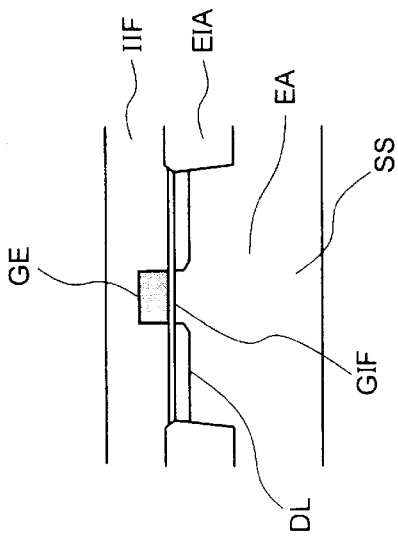
FIG. 23(a) LOW-VOLTAGE NMOS
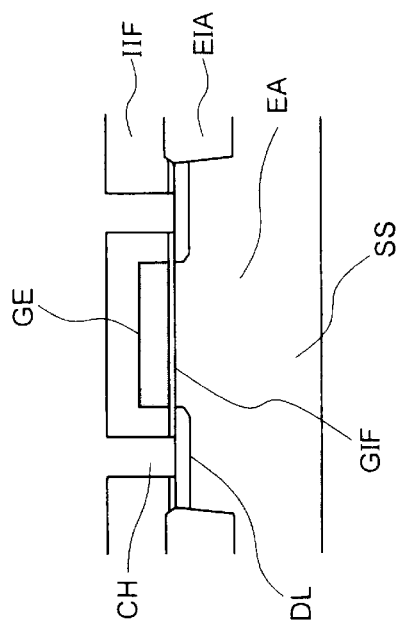
FIG. 23(d) MEMORY CELL PORTION
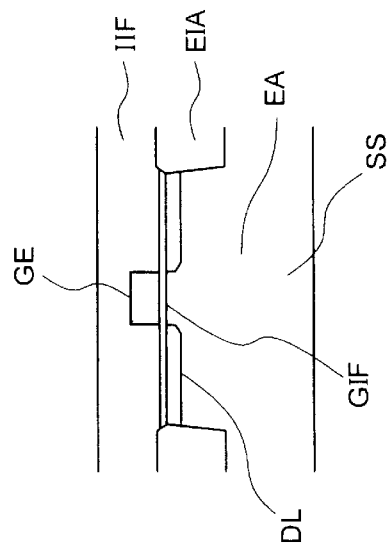
FIG. 23(c) HIGH-VOLTAGE NMOS

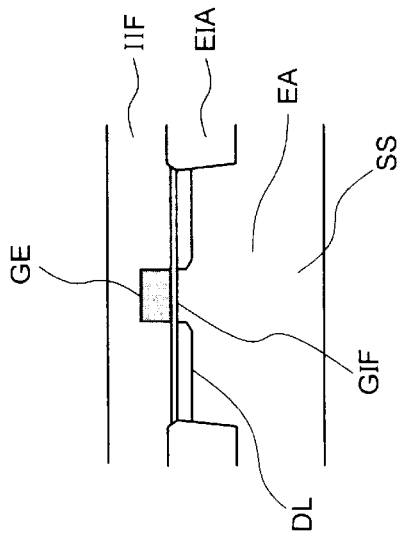
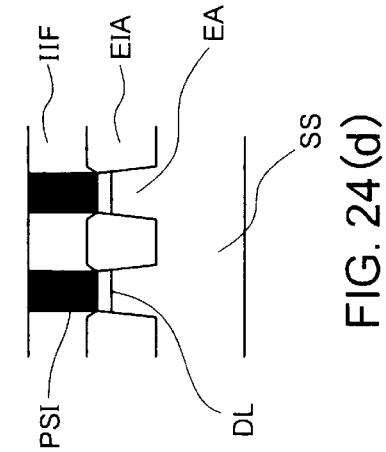
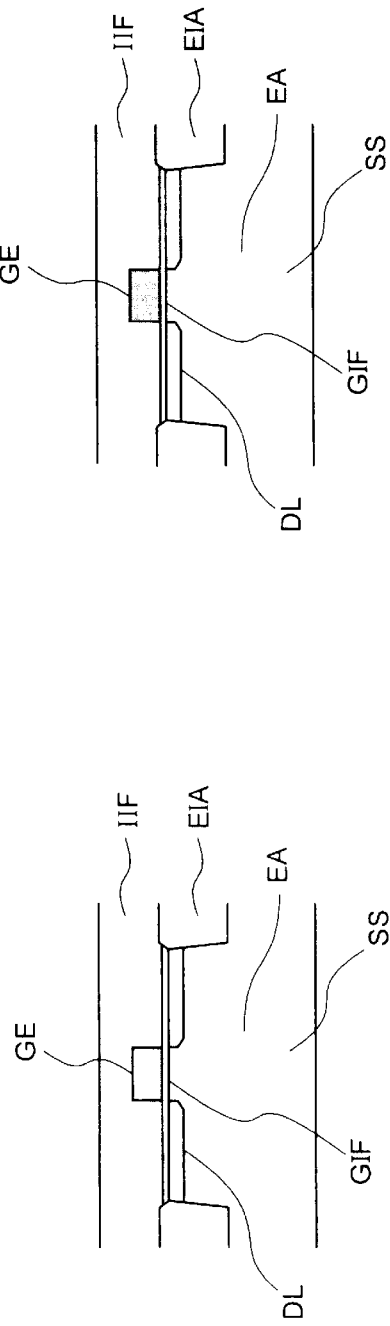
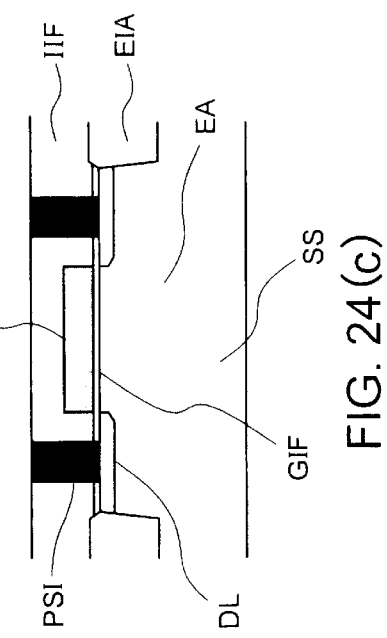

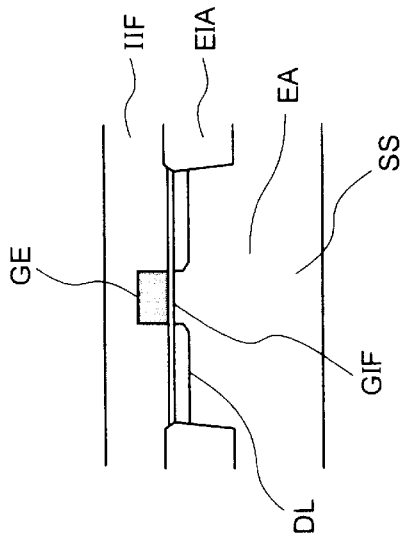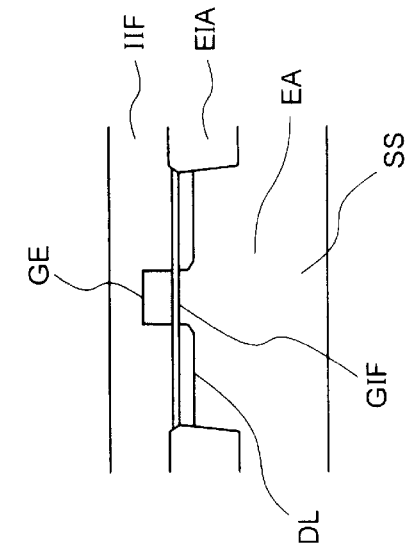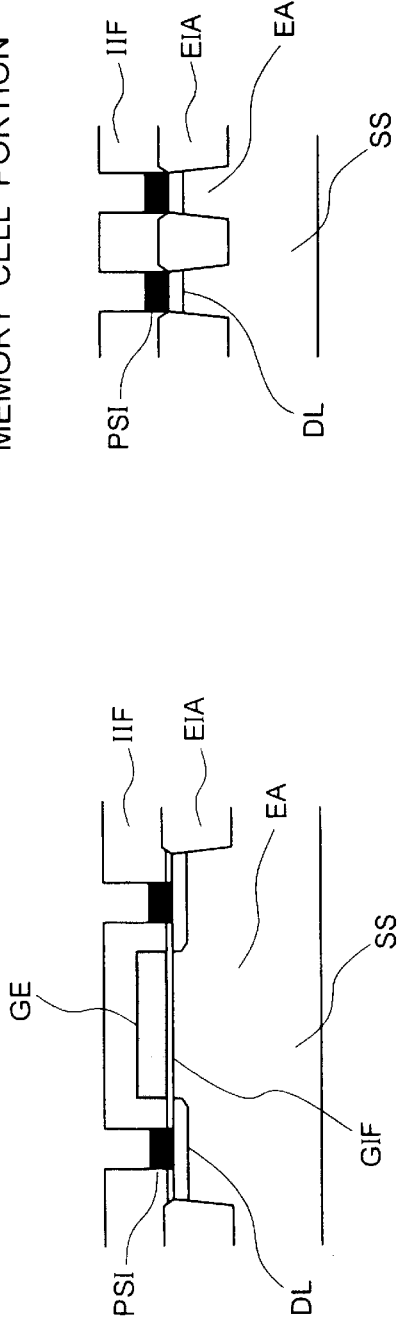

LOW-VOLTAGE NMOS

LOW-VOLTAGE PMOS

HIGH-VOLTAGE NMOS

MEMORY CELL PORTION

LOW-VOLTAGE NMOS

LOW-VOLTAGE PMOS

HIGH-VOLTAGE NMOS

MEMORY CELL PORTION

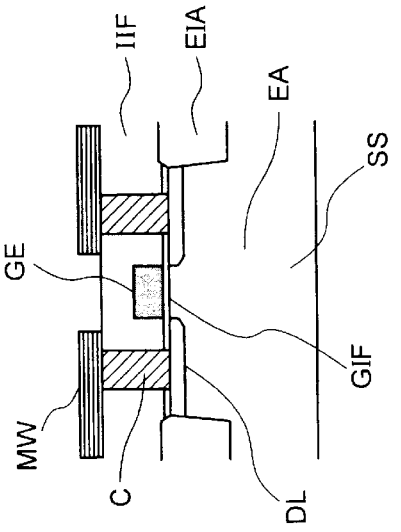
FIG. 28(b) LOW-VOLTAGE PMOS
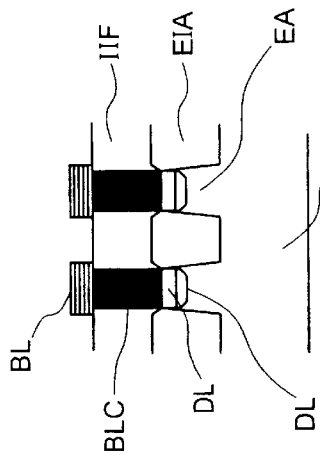
FIG. 28(d) MEMORY CELL PORTION
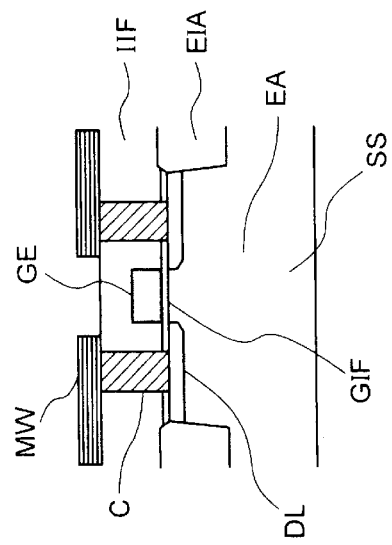
FIG. 28(a) LOW-VOLTAGE NMOS
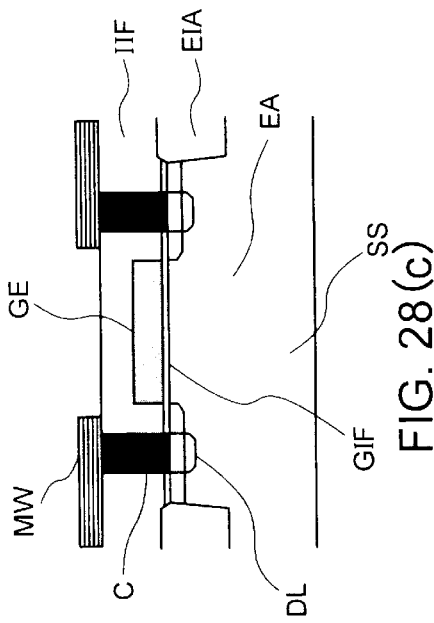
FIG. 28(c) HIGH-VOLTAGE NMOS

LOW-VOLTAGE PMOS

MEMORY CELL PORTION

LOW-VOLTAGE NMOS

HIGH-VOLTAGE NMOS

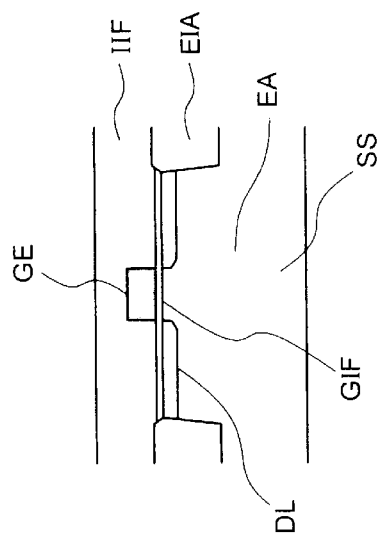
FIG. 30(a) LOW-VOLTAGE NMOS
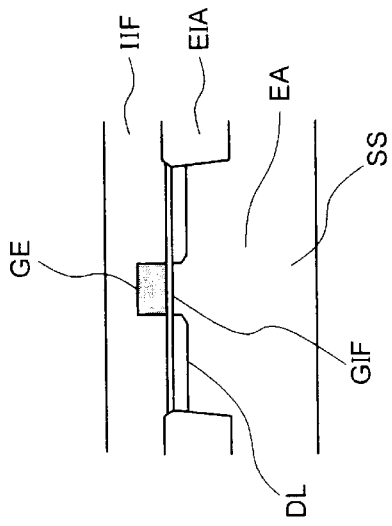
FIG. 30(b) LOW-VOLTAGE PMOS
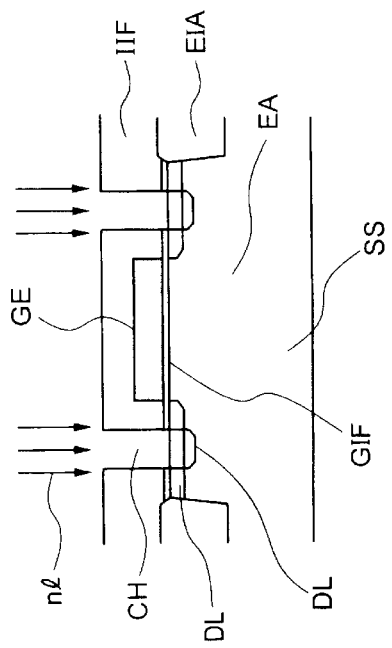
FIG. 30(c) HIGH-VOLTAGE NMOS
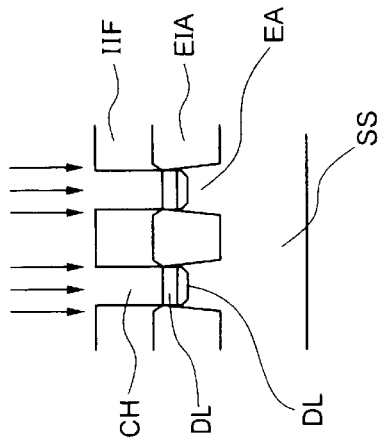
FIG. 30(d) MEMORY CELL PORTION

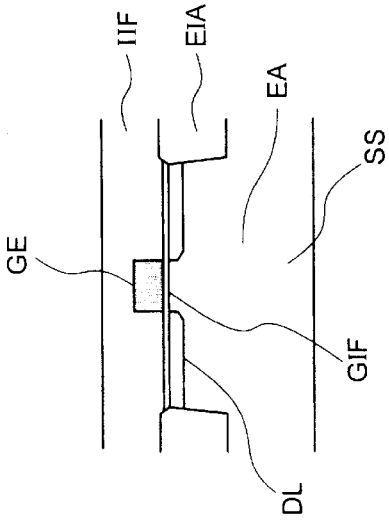
FIG. 31(b) LOW-VOLTAGE PMOS
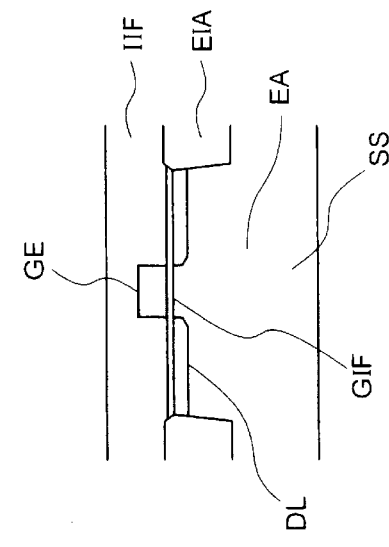
FIG. 31(a) LOW-VOLTAGE NMOS
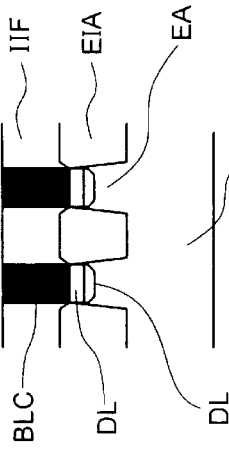
FIG. 31(d) MEMORY CELL PORTION
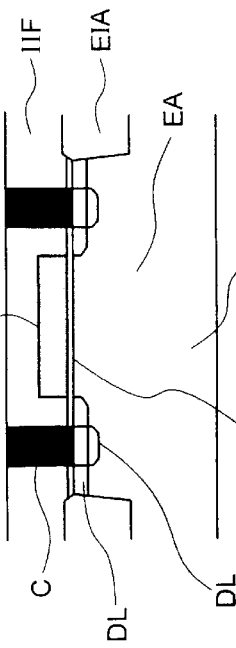
FIG. 31(c) HIGH-VOLTAGE NMOS

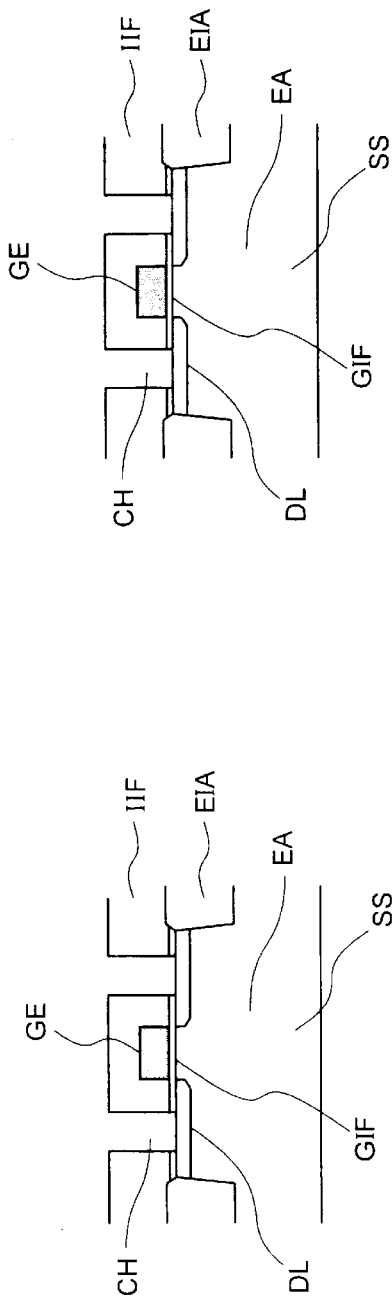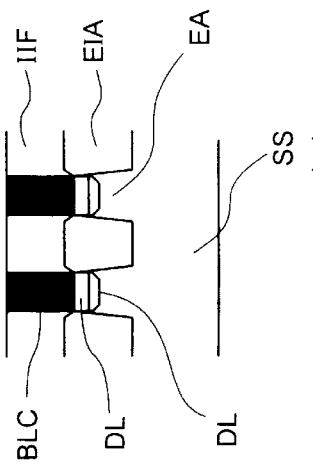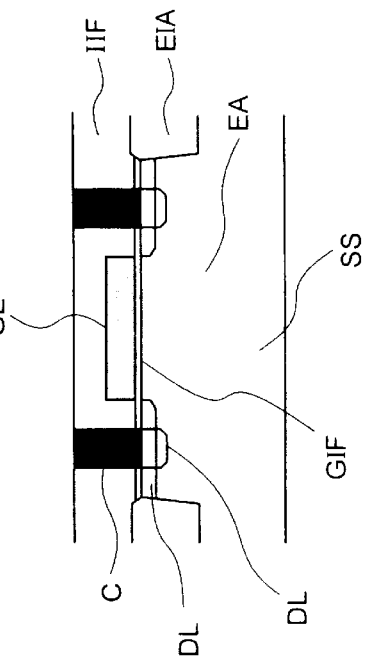

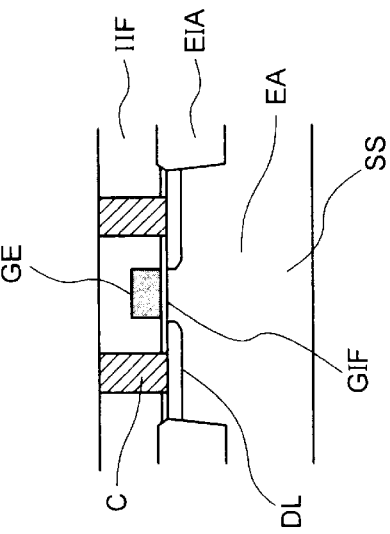
FIG. 33(a) LOW-VOLTAGE NMOS
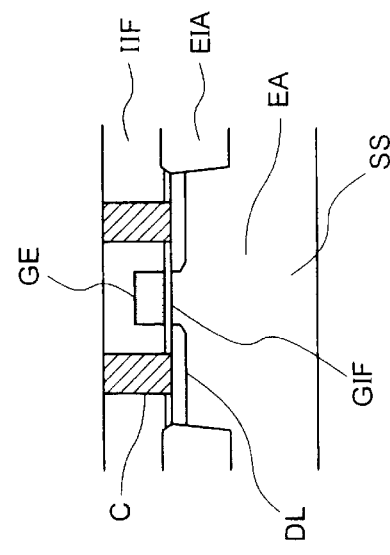
FIG. 33(b) LOW-VOLTAGE PMOS
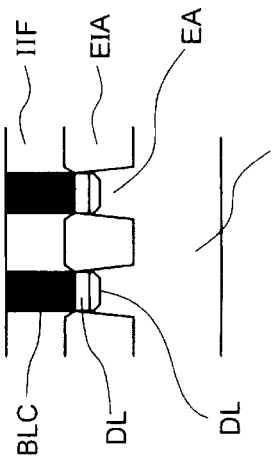
FIG. 33(c) HIGH-VOLTAGE NMOS
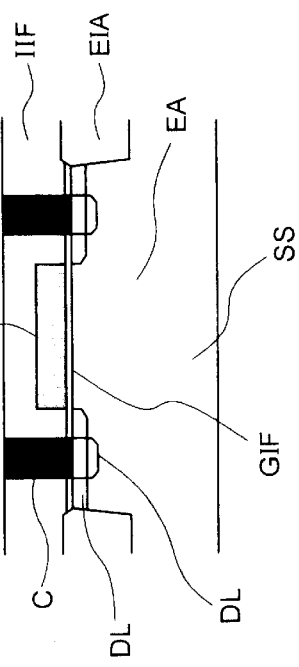
FIG. 33(d) MEMORY CELL PORTION

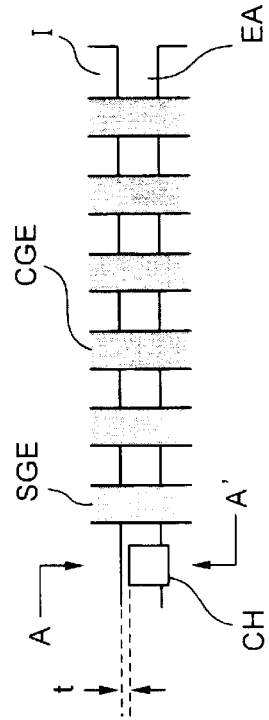
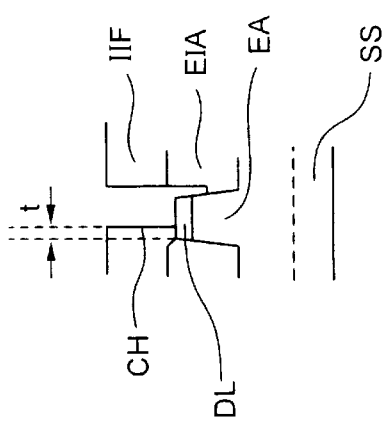
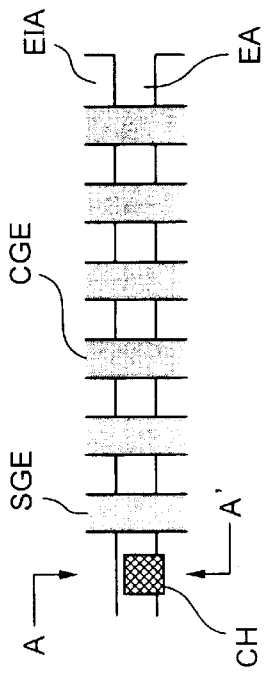
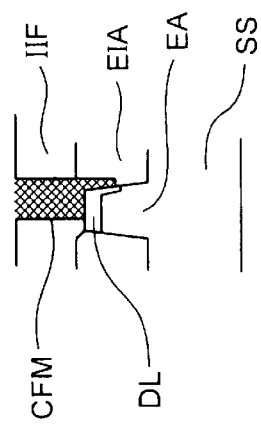
FIG. 35(a)
FIG. 35(b)
FIG. 35(c)
FIG. 35(d)

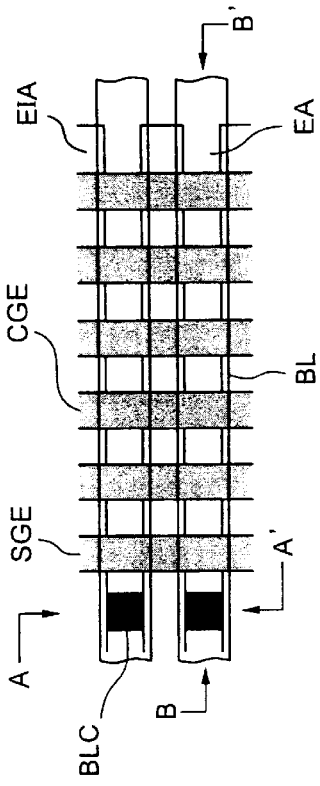
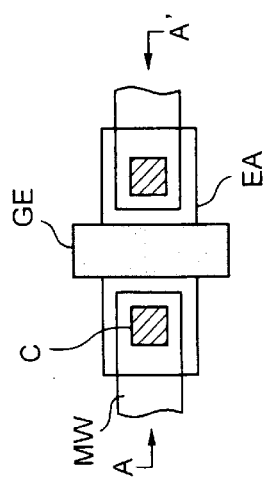
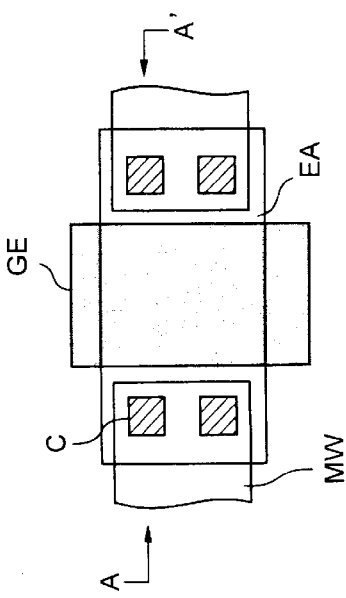
FIG. 37(a) BACKGROUND ART
FIG. 37(b) BACKGROUND ART
FIG. 37(c) BACKGROUND ART
FIG. 37(d) BACKGROUND ART

LOW-VOLTAGE NMOS

LOW-VOLTAGE PMOS

HIGH-VOLTAGE NMOS

MEMORY CELL PORTION

LOW-VOLTAGE PMOS

LOW-VOLTAGE NMOS

MEMORY CELL PORTION

HIGH-VOLTAGE NMOS

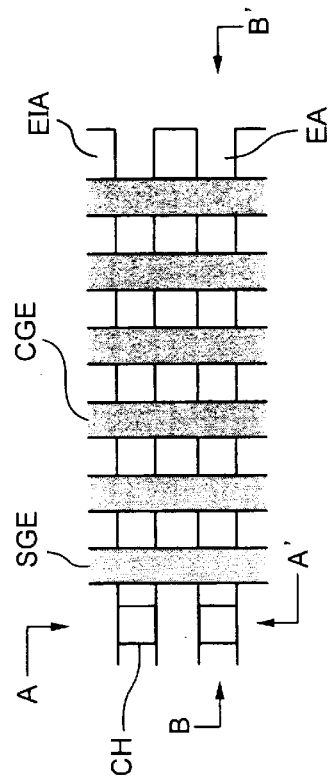
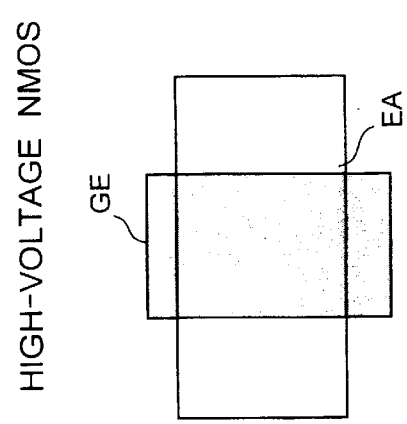
FIG. 41(a) BACKGROUND ART — LOW-VOLTAGE NMOS
FIG. 41(b) BACKGROUND ART — LOW-VOLTAGE PMOS
FIG. 41(c) BACKGROUND ART — HIGH-VOLTAGE NMOS
FIG. 41(d) BACKGROUND ART — MEMORY CELL PORTION

LOW-VOLTAGE PMOS

MEMORY CELL PORTION

LOW-VOLTAGE NMOS

HIGH-VOLTAGE NMOS

LOW-VOLTAGE NMOS

LOW-VOLTAGE PMOS

HIGH-VOLTAGE NMOS

MEMORY CELL PORTION

LOW-VOLTAGE NMOS

LOW-VOLTAGE PMOS

HIGH-VOLTAGE NMOS

MEMORY CELL PORTION

LOW-VOLTAGE PMOS

MEMORY CELL PORTION

LOW-VOLTAGE NMOS

HIGH-VOLTAGE NMOS

LOW-VOLTAGE NMOS

LOW-VOLTAGE PMOS

HIGH-VOLTAGE NMOS

MEMORY CELL PORTION

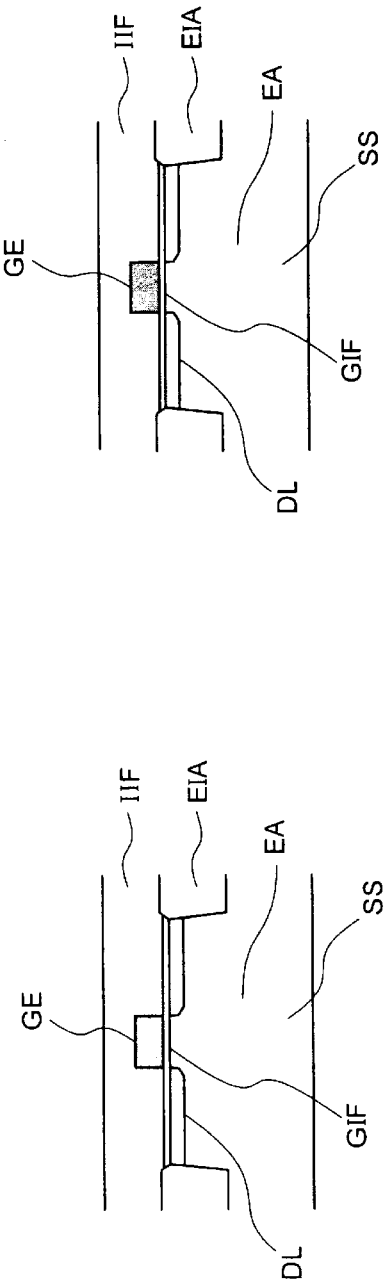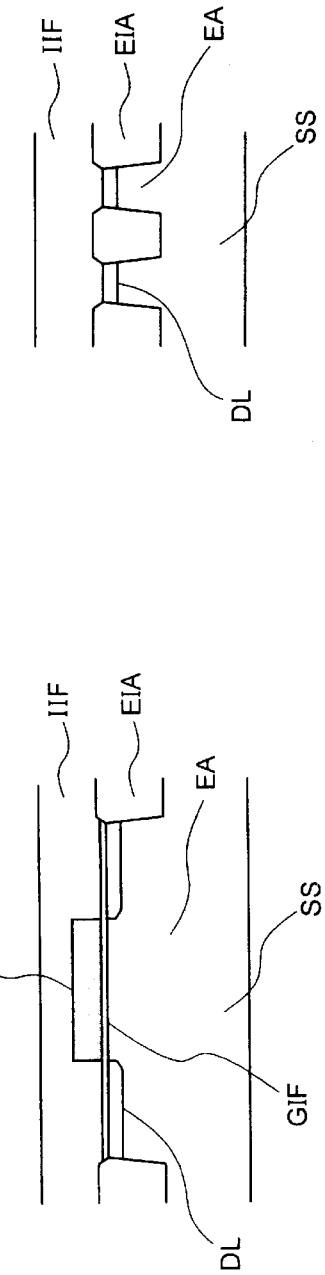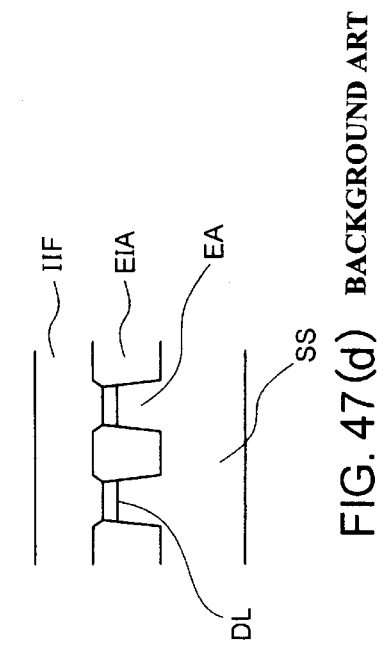

LOW-VOLTAGE NMOS

HIGH-VOLTAGE NMOS

LOW-VOLTAGE PMOS

MEMORY CELL PORTION

LOW-VOLTAGE PMOS

MEMORY CELL PORTION

LOW-VOLTAGE NMOS

HIGH-VOLTAGE NMOS

FIG. 51(a) BACKGROUND ART
LOW-VOLTAGE NMOS

FIG. 51(b) BACKGROUND ART
LOW-VOLTAGE PMOS

FIG. 51(c) BACKGROUND ART
HIGH-VOLTAGE NMOS

FIG. 51(d) BACKGROUND ART
MEMORY CELL PORTION

LOW-VOLTAGE PMOS

MEMORY CELL PORTION

LOW-VOLTAGE NMOS

HIGH-VOLTAGE NMOS

LOW-VOLTAGE PMOS

MEMORY CELL PORTION

LOW-VOLTAGE NMOS

HIGH-VOLTAGE NMOS

SEMICONDUCTOR DEVICE, SEMICONDUCTOR ELEMENT AND METHOD FOR PRODUCING SAME

BACKGROUND OF THE INVENTION

1. Field of The Invention

The present invention relates generally to a device formed on a semiconductor substrate. More specifically, the invention relates to a semiconductor device having both of low-voltage and high-voltage peripheral circuits. As semiconductor devices having both of low-voltage and high-voltage peripheral circuits, there are electrically rewritable non-volatile semiconductor devices (EEPROMs), and consolidated LSIs wherein an EEPROM and another memory or a logic LSI are consolidated. The invention also relates to a semiconductor device, such as an EEPROM which has simultaneously formed cell gate and peripheral gate contact and wherein the area of the peripheral gate contact is intended to reduce. In addition, the invention relates to a semiconductor device, such as an EEPROM wherein the area of a contact in a select gate electrode is intended to reduce. Moreover, the invention relates to a method for producing the semiconductor device.

2. Related Background Art

Of semiconductor devices, electrically rewritable non-volatile semiconductor memory devices (EEPROMs) require a voltage of about 10 to 20 V in order to carry out a writing or erasing operation. In addition, an interface and logic part of such devices are driven by a voltage of, e.g., 2 to 3 V. In such devices, a circuit for handling a high voltage of 10 to 20 V, and a circuit for handling a low voltage of 2 to 3 V are consolidated on the same chip. Because high-voltage and low-voltage transistors can not generally cope with both withstand voltage and driving capacity. In addition, this is the same in the case of a chip wherein an EEPROM and a DRAM or a logic LSI are consolidated.

Each of memory cells of an EEPROM has a charge storage layer which is formed via an insulating film on the surface of a substrate, and a control gate which is formed via an insulating film. An example of a memory cell structure of an EEPROM is shown in FIG. 34. The memory cell of FIG. 34 is provided with a floating gate electrode FGE as a charge storage layer via an insulating film IF which is formed on the surface of a substrate SS. Moreover, a control gate electrode CGF is provided via an insulating film IF which is formed on the surface of the floating gate electrode FGE.

Data are written and erased by the entrance and exit of electrons into and from the floating gate electrode FGE, so that the threshold voltage of a transistor fluctuates.

If a voltage of 0 V is applied to a p-type well and source/drain of a selected memory cell and if a write voltage Vpp(=about 20 V) is applied to a control gate CG, a high voltage is applied between the floating gate electrode FGE and the substrate SS. Then, electrons are injected from the p-type well into a floating gate FG via an FN tunnel by a tunnel current, so that the threshold voltage moves in a positive direction.

On the other hand, if a voltage of vppe(=about 20 V) is applied to the p-type well and the source/drain and if a voltage of 0 V is applied to the control gate, electrons in the floating gate are emitted into the p-type well, so that the threshold voltage moves in a negative direction.

In the above described method, the FN tunnel current using the whole surface of a channel is utilized for the entrance and exit of electrons. As other methods, there are known a method for utilizing an FN tunnel current between the diffusion layer and gate of a transistor, and a method for utilizing the hot electron injection. In either case, a relatively high voltage (about 10 to 20 V) is necessary for write or erase.

A typical peripheral circuit for operating such an EEPROM comprises a MOS transistor. The peripheral circuit for the EEPROM is roughly divided into two kinds of transistors which include a high-voltage transistor and a low-voltage transistor.

The high-voltage transistor is used in a circuit for generating a relatively high voltage (about 10 to 20 V) necessary for write or erase and for applying the voltage to memory cells. The gate oxide film thereof has a thickness of, e.g., 40 nm, so as not to be broken at the high voltage. In order to increase a withstand voltage to a break down voltage in a p-n junction and so forth, the high-voltage transistor is designed so that the distance between a source-drain contact and an element isolating region and the distance between the contact and a gate electrode are long and so that the impurity density of a source/drain diffusion layer is low.

On the other hand, the low-voltage transistor is used in a circuit, to which no high voltage is applied. In order to increase the driving force, the thickness of the gate oxide film of the low-voltage transistor is designed to be smaller than that of the high-voltage transistor. In addition, the low-voltage transistor is designed so that the distance between a source-drain contact and an element isolating region and the distance between the contact and a gate electrode are smaller than those of the high-voltage transistor and so that that the impurity density of a source/drain diffusion layer is higher than that of the high-voltage transistor.

A conventional EEPROM comprising a memory cell array, a high-voltage transistor and a low-voltage transistor as described above is shown in plan views of FIGS. 37(*a*) through 37(*d*). FIGS. 38(*a*) through 38(*d*) and FIGS. 39(*a*) through 39(*d*) are sectional views taken along lines A—A' and B—B' of FIGS. 37(*a*) through 37(*d*), respectively. The peripheral circuit of this EEPROM comprises a low-voltage NMOS, a low-voltage PMOS and a high-voltage NMOS.

A conventional method for producing the semiconductor device shown in FIGS. 37(*a*) through 37(*d*) will be described below.

FIGS. 40(*a*) through 46(*d*) are plan views showing the producing method. In addition, FIGS. 47(*a*) through 53(*d*) and FIGS. 54 through 60 are sectional views taken along lines A—A' and B—B' of FIGS. 40(*a*) through 46(*b*), respectively.

First, particularly as can be seen from FIG. 47(*a*) through 47(*d*), an element region EA defined by an element isolating region AIA is formed on a silicon substrate (a semiconductor substrate) SS. Moreover, a gate electrode GE is formed on the element region EA via a gate insulating film GIF. Then, an impurity diffusion layer, which is to be a source/drain diffusion layer, is formed to form a MOS transistor. Then, the surface of the substrate SS is covered with an interlayer insulating film IIF. Thus, the structure shown in FIGS. 40(*a*) through 40(*d*), FIGS. 47(*a*) through 47(*d*) and FIG. 54 is obtained.

Then, as shown in FIGS. 41(*a*) through 41(*d*), FIGS. 48(*l*) through 48(*d*) and FIG. 55, a contact hole CH is formed in the source/drain diffusion layer DL of the memory cell part.

Subsequently, as shown in FIGS. 42(*a*) through 42(*d*), FIGS. 49(*a*) through 49(*d*) and FIG. 56, a polycrystalline silicon film, in which, e.g., phosphorus, is doped, is embedded in the contact hole CH.

Then, as shown in FIGS. 43(a) through 43(d), FIGS. 50(a) through 50(d) and FIG. 57, a contact hole CH is formed in the source/drain diffusion layer DL of each of low-voltage and high-voltage transistors.

Then, in order to decrease the contact resistance of the contact with the substrate SS, additional impurity ions are injected into the source/drain diffusion layer DL on the bottom of the contact. FIGS. 44(a) through 44(d), FIGS. 51(a) through 51(d) and FIG. 58 show steps of injecting additional n-type ions. That is, the contact hole of the PMOS is covered with a resist PR by the photolithography, to carry out patterning so that the contact hole CH of the NMOS is exposed, and n-type impurity ions are injected.

Thereafter, the resist PR is removed, and additional p-type impurity ions pI are injected as shown in FIGS. 45(a) through 45(d), FIGS. 52(a) through 52(d) and FIG. 59. The contact hole CH of the NMOS is covered with the resist PR, and the resist PR is patterned so that the contact hole CH of the PMOS. Thereafter, the resist PR is removed, and annealing is carried out to activate the ion-implanted impurity. Subsequently, as shown in FIGS. 46(a) through 46(d), FIGS. 53(a) through 53(d) and FIG. 60, the respective contact holes CH are filled with a metal, such as tungsten or aluminum.

Then, a metal wiring MW is formed to complete a semiconductor device shown in FIGS. 37(a) through 37(d), FIGS. 38(a) through 38(d) and FIG. 39.

In the above described producing method, a phosphorus doped polycrystalline silicon film or an amorphous silicon film is used as a filled material for a bit line contact of the cell array part. The reason for this is as follows.

In this example, as shown in FIG. 37(d), a bit line contact BLC is laid out so as to have little margin with respect to the element region EA, in order to reduce the area of the cell array as small as possible. FIG. 38(d) shows the structure wherein alignment is not shifted. However, since the contact hole CH of the bit line contact BLC is actually formed by etching the interlayer insulating film IIF after patterning by the photolithography, the dispersion in the process causes the alignment shift of the contact and the variation in contact diameter. An example of an alignment shift of a contact is shown in FIGS. 35(a) and 35(b). FIG. 35(a) is a sectional view taken along line A—A' of FIG. 35(b). In this example, the position of the contact hole CH projects from the element region EA into the element isolating region EIA by an alignment shift t. As a result, when the contact hole CH is etched, the insulating film embedded in the element isolating region EIA is also etched, so that the side wall portion of the element region EA underlying the source/drain diffusion layer is exposed to the bottom of the contact hole. If a metal, such as tungsten or aluminum, is filled in the contact hole in this state, a short-circuit is established between the wiring and the p-type well in the side wall portion of the element region wherein the source/drain diffusion layer is not formed, so that malfunction is caused.

On the other hand, when the phosphorus doped polycrystalline silicon film or amorphous silicon film is embedded in the contact hole, even if the side wall of the element region is exposed, phosphorus is diffused into the p-type well from the embedded polycrystalline silicon film or amorphous silicon film to form a p-n junction. Therefore, the short-circuit between the wiring and the p-type well is not established. This state is shown in FIGS. 35(c) and 35(d). FIG. 35(c) is a sectional view taken along line A—A' of FIG. 35(d).

In addition, if the contact portion of the peripheral transistor part has a parasitic resistance, the current flowing therethrough decreases to decrease the operating speed, so that the resistance of the contact portion must be lower. Therefore, the metal, such as tungsten or aluminum, which has a lower resistance than that of the polycrystalline silicon film, is used as the filled material.

When the metal is filled in the contact hole, the resistance of the junction formed between the metal and the semiconductor substrate is high unless the impurity density of the bottom of the contact is sufficiently high. Therefore, it is required to carry out the additional ion implantation to increase the impurity density to reduce the influence of the potential barrier.

Then, the problems of the semiconductor device produced by the above described producing method will be described below.

As described above, after the additional ion implantation is carried out from the contact hole, annealing is carried out to activate the injected impurity.

The interlayer insulating film is typically made of a material, the flowability of which increases when being heated. The interlayer insulating film is formed of, e.g., a BPSG film. Such an insulating film can not be sufficiently embedded in a narrow space, such as a space between gate electrodes, by only depositing the insulating film. Thereafter, a heat treatment is carried out at a temperature of, e.g., about 800 to 900° C., to increase the flowability of the film to embed the interlayer insulating film into the narrow space.

FIG. 36(a) shows a state that a contact hole CH is formed. Thereafter, as shown in FIG. 36(b), an additional ion implantation is carried out. Thereafter, annealing is carried out to activate the ion-implanted impurity. This annealing fluidizes the interlayer insulating film IIF around the contact hole to bend the contact hole as shown in FIG. 36(c), so that there is some possibility of causing malfunction. That is, if the contact hole is bent, it is difficult to completely fill the metal, so that wiring open and leak are caused.

The space between gate electrodes decreases with the scale down of elements, so that it is required to use an interlayer insulating film having a higher flowability in order to embed the interlayer insulating film in the space. Then, the problem that the contact is bent becomes obvious.

In order to solve the above described problem, it is required that the impurity density of the source/drain diffusion layer is previously sufficiently high, in order to prevent the contact resistance between the filled metal and the substrate in the contact portion from increasing even if the additional ion implantation into the source/drain diffusion layer and the annealing for activating the impurity are stopped.

However, if the impurity density of the source/drain diffusion layer is increased, the breakdown withstand voltage of the p-n junction and the source-to-drain withstand voltage of the transistor decrease. In particular, it is difficult to ensure a withstand voltage of, e.g., 20 V or higher, which is necessary for the high-voltage transistor.

From the point of view which is slightly different from the foregoing, the prior art will be described below.

As one of non-volatile semiconductor memories, there is known a NAND type flash EEPROM having a memory cell array part which is shown in, e.g., FIG. 64. The memory cell array part of the NAND type flash EEPROM comprises a plurality of NAND cell units NCN. Each of the NAND cell units has a NAND column which comprises a plurality of (e.g., 16) memory cells connected in series, a source-side select gate transistor which is connected between one end of the NAND column and a source line SL, and a drain-side select gate transistor which is connected between the other end of the NAND column and a bit line BLi.

Each of the memory cells comprises a floating gate electrode FG, control gate electrodes (word lines) CG0 through CG15, and an n-type diffusion layer. The select gate transistor contacts a silicon-substrate-side gate electrode of a double-layer gate structure, i.e., a gate electrode which is formed in the same layer as the floating gate electrode layer of the memory cell, to function as a transistor. The select gate electrode contacts the wiring on the upper layer at a plurality of places (one place every hundreds bit lines).

The contact for the select gate electrode is formed of a barrier metal (comprising, e.g., titanium nitride and titanium) and a metal (e.g., tungsten), similar to the contact for the gate electrode of the transistor constituting the peripheral circuit. On the other hand, if the contact for connecting the diffusion layer on one end of the NAND column to the source line SL, and the contact for connecting the diffusion layer on the other end of the NAND column to the bit line BLi are formed of a barrier metal and a metal, there is some possibility that the barrier metal is not completely filled by the alignment shift so that conducting failure is caused. Therefore, these contacts are made of a polysilicon containing an n-type impurity.

There is an advantage in that the contact of the barrier metal and the metal has a smaller resistance than that of the contact of the polysilicon. However, if the alignment shift between the contact hole and the contact region of the gate electrode is caused, there is some possibility that the barrier metal is not completely filled. Therefore, it is required to take a sufficient alignment margin for the photolithography between the contact hole and the contact region of the gate electrode.

Referring to the accompanying drawings, the above described contact region of the conventional select gate electrode will be described below.

FIG. 78 is a plan view of a contact region (a region XS in FIG. 77) of the source-side select gate electrode. The area of the contact region S1 is determined in view of the alignment shift between a double-layer gate pattern S2 of a select gate electrode and a contact hole SC in the gate electrode. As shown in FIG. 78, it is assumed that the alignment shift between S1 and S2 is a, the alignment shift between SC and S1 is b, the alignment shift between SC and S2 is c (it is also assumed that the alignment shift between the contact hole in the source diffusion layer and S2 is c), the gate length of the select gate electrode is g, the minimum width capable of being worked by the photolithography process is n (the distance between the control gate electrodes is set to be n), the distance between S1 and the control gate electrode is m, the diameter of the contact hole in the gate electrode is R, and the diameter of the contact hole in the source diffusion layer is R. In this case, in order to electrically separate S1 from the control gate electrode, m must be (a+n) or higher. The minimum value of the distance between the facing CG15 and CG15 on both sides of the contact region S1 may be (2 n+2g+2c+R) if the contact region S1 does not exist, but it is (2m+2b+R) if the contact region S1 is considered. Usually, (2m+2b+R) is greater than (2n+2g+2c+R) because of limitations of alignment shifts of m and b, so that the distance 1 between the select gate electrode SGS and the control gate electrode CG15 must be greater than n. This causes problems when the area of the cell array region is reduced.

As can be seen from the foregoing, in the conventional semiconductor device having both of low-voltage and high-voltage circuits, there is a disadvantage in that the contact is bent. In addition, in the conventional non-volatile semiconductor memory having the double-layer gate structure, there is a disadvantage in that the contact region is large with respect to the contact portion of the select gate. Moreover, in such a memory device, it is an important request that the area of the contact portion is reduced with respect to the peripheral gate contact.

In addition, in order to realize a high-density NAND type flash memory device at low costs, it is naturally required to scale down a memory cell transistor having a double-layer gate electrode structure of a floating gate electrode and a control gate electrode, and it is also required to realize the scale down of a peripheral transistor having no floating gate electrode at low costs.

Therefore, as shown in FIGS. 84(a) and 84(b), as a conventional applied example of part of peripheral transistors, there is an example wherein the electrode material of a floating gate constituting a memory cell transistor is utilized as a gate electrode material of the peripheral transistors.

In this example, part of peripheral transistors are formed as follows. That is, a part of the electrode material of a control gate constituting a memory cell transistor is peeled off and removed to expose a floating gate electrode. A contact hole 113 is formed in this region, and an electrode material is filled therein. That is, the floating gate electrode material constituting a memory cell transistor is utilized as the gate electrode of the peripheral transistors.

If the peripheral transistor is thus formed, the electrode material of the gate constituting the peripheral transistor is formed of the material of a part of the memory cell transistor, so that it can be clearly seen that the number of steps of the producing process is decreased to reduce the costs. However, it is not possible to avoid the fact that a factor of inhibiting densification remains as follows.

That is, in order to form a contact hole 113 in a gate electrode constituting a peripheral transistor, it is required to provide an alignment shift margin 115 between a wiring pattern of a gate electrode and the contact hole 113, an alignment shift margin 114 between an exposed floating gate electrode material 104 and the contact hole 113, and an alignment margin 116 between the exposed floating gate electrode material 104 and a source/drain diffusion layer 109 constituting a transistor. Each of these margins will be described. First, the alignment margin 114 will be considered. If the margin 114 is not ensured, a contact hole intended region is small. Therefore, the variation in contact resistance is not only caused, but it is also possible to ensure an ohmic characteristic necessary for a gate electrode wiring. In addition, although a protective (BPSG) film 110 is etched and removed when a contact hole is formed, a field oxide film 102 provided for element isolation has no etching selectivity since it is made of $SiO_2$ similar to the BPSG film 110. Thus, if an alignment shift is caused between the contact hole 113 and an exposed gate electrode material, the field oxide film directly underlying the contact hole 113 is etched. Therefore, the wiring layer embedded in the contact hole is not only cut due to an abrupt difference in level of an underlayer, but a silicon substrate 101 and the gate electrode 104 are sometimes electrically short-circuited. From these points of view, it is not possible to avoid decreasing yields and reliability.

Then, the alignment margin 115 will be considered. If the margin 115 is not sufficiently ensured, the contact hole intended region is small similar to the alignment margin 114. Therefore, the variation in contact resistance is not only caused, but it is also possible to ensure an ohmic characteristic necessary for a gate electrode wiring. In addition, as a difference in level of an underlayer directly below the contact hole, there is a difference in level between the thickness of the film of a control gate electrode material 106 constituting the memory cell transistor and the thickness of the film of a control gate electrode material 107 which is used as an etching mask for the electrode material of the control gate, so that it is not possible to prevent a wiring layer, which is embedded in the contact hole, from being cut due to the difference in level.

Then, the alignment margin 116 will be considered. If the margin 116 is not sufficiently ensured, when the gate electrode material 104, which is ensured so as to be sufficiently widely ensured, reaches the channel portion of the transistor due to an alignment shift, the effective width of the gate is not only reduced, but the characteristics of the transistor also vary in accordance with the alignment directions.

As described above, in the conventional example shown in FIG. 6, the three alignment shift margins 114, 115 and 116 must be ensured. This has harmful effects on the enhancement of the density of the element, and causes the increase of the area of the chip.

The alignment shift margin 115 between the wiring layer pattern 107 of the gate electrode and the contact hole 113, the alignment shift margin 114 between the exposed floating gate electrode material 104 and the contact hole 113, and the alignment margin 116 between the exposed floating gate electrode material 104 and the source/drain diffusion layer 109 constituting the transistor, which are disadvantages of the device in the above described example, disappear. In place of these margins, there are an alignment margin 215 between a gate electrode wiring layer pattern 207 and the contact hole, and an alignment margin 216 between the gate electrode wiring layer 207 and a source/drain diffusion layer 209 constituting a transistor. These margins are sufficiently smaller than the margin 114 and margin 116 which are shown in FIG. 84(*b*). This can be seen from the following.

In this example, the first gate electrode wiring layer pattern serving as the electrode material of the floating gate in the memory cell transistor, which functions as the gate electrode in the peripheral transistor, and the second gate electrode wiring pattern serving as the electrode material of the control gate are different patterns, respectively, directly below the contact hole 113.

Non-volatile memories, such as NAND type flash memories, have a plurality of power supply voltages, such as a relatively high power supply voltage during write/erase operations, in addition to a power supply voltage during a reading operation. In order to select one of these power supplies during a desired operation, a resistive division is conventionally used. In order to realize this, a resistive element having a high resistance of about 1 MΩ is required in order to supply a stable power supply voltage. As a technique for forming such a resistive element, an electrode gate material of a floating gate having a relatively high resistance constituting a memory cell transistor is generally used. It is also considered that a control gate electrode material constituting a memory cell transistor and a diffusion layer resistance are used. In the former control gate electrode, a polycide structure of a metal having a high melting point is used as a relatively low resistance material necessary for cell operations. Therefore, a resistive element having a resistance of MΩ must be provided on the same substrate, so that a large forming region is required. On the other hand, when the latter diffusion layer resistance is used, it is possible to provide a relatively high resistance as compared with the control gate electrode material constituting the above described memory cell transistor. However, this can not be utilized as a stable resistive element since it has remarkable temperature characteristics. Therefore, a floating gate electrode material having a small fluctuation in resistance value due to temperature and a relatively high sheet resistance is widely used.

Thus, in the example shown in FIG. 84, if the floating gate electrode constituting the memory cell transistor is used as the gate electrode of the peripheral transistor, it is required to sufficiently ensure alignment margins relating to the formation of the contact hole in the floating gate electrode terminal, so that the area of the chip is increased.

SUMMARY OF THE INVENTION

It is therefore an object of the present invention to eliminate the aforementioned disadvantages and to provide measures to solve the problems.

In order to accomplish the aforementioned and other objects, according to one aspect of the present invention, a semiconductor device comprises: a semiconductor substrate; a plurality of first diffusion layers having a low impurity density, the first diffusion layers being formed on the surface of the semiconductor substrate; a plurality of second diffusion layers having a high impurity density, the second diffusion layers being formed on the surface of the semiconductor substrate; a plurality of first contacts, each of which contacts the first diffusion layers and each of which is formed of a semiconductor; and a plurality of second contacts, each of which contacts the second diffusion layers and each of which is formed of a metal.

According to another aspect of the present invention, there is provided a method for producing a semiconductor device having a semiconductor filled contact or a metal filled contact for a plurality of diffusion layers, the method comprising the steps of: forming a plurality of contact holes; filling a semiconductor in each of the first contact holes; carrying out a thermal treatment; forming a plurality of second contact holes; and filling a metal in each of the second contact holes.

According to another aspect of the present invention, there is provided a semiconductor device comprising: a memory cell part having a plurality of non-volatile memory cells, each of which has a floating gate electrode, a control gate and an insulating film arranged therebetween; a peripheral circuit having a plurality of peripheral transistors each having a gate electrode made of the material of the floating gate electrode; a plurality of cell gate contacts, each of which contacts a corresponding one of the control gate electrodes for activating a corresponding one of the memory cells; and a plurality of peripheral gate contacts, each of which contacts a corresponding one of the floating gate electrodes for activating a corresponding one of the peripheral circuits, each of the peripheral gate contacts being electrically connected to both of the corresponding one of the floating gate electrodes and the corresponding one of the control gate electrodes.

According to another aspect of the present invention, there is provided a method for producing a semiconductor device which comprises: a memory cell part having a plurality of non-volatile memory cells, each of which has a floating gate electrode, a control gate and an insulating film arranged therebetween; a peripheral circuit having a plurality of peripheral transistors each having a gate electrode made of the material of the floating gate electrode; a plurality of cell gate contacts, each of which contacts a corresponding one of the control gate electrodes for activating a corresponding one of the memory cells; and a plurality of peripheral gate contacts, each of which contacts a corresponding one of the floating gate electrodes for activating a corresponding one of the peripheral circuits, each of the peripheral gate contacts being electrically connected to both of the corresponding one of the floating gate electrodes and the corresponding one of the control gate electrodes, the method comprising the steps of:

simultaneously etching the floating gate electrodes and the insulating films to form contact holes; and filling a contact material in the contact holes to form the peripheral gate contacts.

According to another aspect of the present invention, there is provided a semiconductor device comprising a memory cell array including memory transistors having a double-layer gate structure, and select gate transistors serving as gates for transmitting and receiving data to and from the memory transistors, wherein contacts with the gate electrodes of the select gate transistors are formed of a polysilicon.

According to another aspect of the present invention, there is provided a semiconductor high resistive element formed in a semiconductor substrate, in the substrate double-layer electrode type transistors are formed by sequentially forming at least four layers of a first gate insulating film, a first gate electrode, a second gate insulating film and a second gate electrode, wherein a pair of contact holes are formed in at least a material layer of the second gate electrode and a material layer of the second gate insulating film of the four layers at regular intervals, a wiring material is filled in each of the pair of contact holes so as to be electrically connected to a material layer of the first gate electrode, and an insulating material is arranged on an inner surface of each of the pair of contact holes to electrically isolate the wiring material from said material layer of the second gate electrode, so that the material layer of said first gate electrode is used as a resistive material.

According to another aspect of the present invention, there is provided a semiconductor high resistive element formed in a semiconductor substrate, in the substrate double-layer electrode type transistors are formed by sequentially forming at least four layers of a first gate insulating film, a first gate electrode, a second gate insulating film and a second gate electrode, wherein a pair of contact holes are formed in at least a material layer of the second gate electrode and a material layer of the second gate insulating film of the four layers at regular intervals, a wiring material is filled in each of the pair of contact holes so as to be electrically connected to a material layer of the first gate electrode, and the material layer of the second gate electrode is electrically cut at least one place between the pair of contact holes, so that the material layer of the first gate electrode is used as a resistive material.

According to a further aspect of the present invention, there is provided a method for producing a semiconductor element comprising a double-layer electrode type transistor formed on a semiconductor substrate by sequentially forming at least four layers of a first gate insulating film, a first gate electrode, a second gate insulating film and a second gate electrode on the semiconductor substrate, the method comprising the steps of: forming an insulating film in a specific region on the semiconductor substrate; sequentially forming three layers of a material layer of the first gate electrode, a material layer of the second gate insulating film, and a material layer of the second gate electrode, on the insulating film; etching the material layer of the second gate electrode and the material layer of the gate insulating layer to form at least a pair of contact holes for exposing the material layer of the first gate electrode functioning as a resistive element material; selectively forming another insulating film on side walls of the contact holes; and filling a wiring material in the contact holes so that the wiring material is electrically insulated from the material layer of the second gate electrode by the another insulating film although the wiring material is electrically conducted to the material layer of the first gate electrode.

According to a still further aspect of the present invention, there is provided a method for producing a semiconductor element comprising a double-layer electrode type transistor formed on a semiconductor substrate by sequentially forming at least four layers of a first gate insulating film, a first gate electrode, a second gate insulating film and a second gate electrode on the semiconductor substrate, the method comprising the steps of: forming an insulating film in a specific region on the semiconductor substrate; sequentially forming three layers of a material layer of the first gate electrode, a material layer of the second gate insulating film, and a material layer of the second gate electrode, on the insulating film; etching, removing and cutting the material layer of the second gate electrode between a pair of contact hole intended regions to form a cut portion; etching the material layer of the second gate electrode and the material layer of the gate insulating layer to form at least a pair of contact holes for exposing the material layer of the first gate electrode functioning as a resistive element material; and filling a wiring material in the contact holes so that the wiring material is electrically conducted to the material layer of the first gate electrode.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIGS. 1(a) through 1(d) are plan views showing the first preferred embodiment of the present invention;

FIGS. 2(a) through 2(d) are sectional views taken along line A—A' of FIGS. 1(a) through 1(d), respectively;

FIGS. 4(a) through 4(d) are plan views showing a producing process in the first preferred embodiment;

FIGS. 9(a) through 9(d) are sectional views taken along line A—A' of FIGS. 4(a) through 4(d), respectively, which show the producing process in the first preferred embodiment;

FIGS. 10(a) through 10(d) are sectional views taken along line A—A' of FIGS. 5(a) through 5(d), respectively, which show the producing process in the first preferred embodiment;

FIGS. 11(a) through 11(d) are sectional views taken along line A—A' of FIGS. 6(a) through 6(d), respectively, which show the producing process in the first preferred embodiment;

FIGS. 12(a) through 12(d) are sectional views taken along line A—A' of FIGS. 7(a) through 7(d), respectively, which show the producing process in the first preferred embodiment;

FIGS. 13(a) through 13(d) are sectional views taken along line A—A' of FIGS. 8(a) through 8(d), respectively, which show the producing process in the first preferred embodiment;

FIGS. 19(a) through 19(d) are plan views showing the second preferred embodiment of the present invention;

FIGS. 20(a) through 20(d) are sectional views taken along line A—A' of FIGS. 19(a) through 19(d), respectively;

FIGS. 23(a) through 23(d) are sectional views taken along line A—A' of FIGS. 19(a) through 19(d), respectively, which show a producing process in the second preferred embodiment;

FIGS. 24(a) through 24(d) are sectional views taken along line A—A' of FIGS. 19(a) through 19(d), respectively, which show producing process in the second preferred embodiment;

FIGS. 25(a) through 25(d) are sectional views taken along line A—A' of FIGS. 19(a) through 19(d), respectively, which show producing process in the second preferred embodiment;

FIGS. 28(a) through 28(d) are sectional views showing the third preferred embodiment of the present invention;

FIGS. 30(a) through 30(d) are sectional views showing a producing process in the third preferred embodiment;

FIGS. 31(a) through 31(d) are sectional views showing a producing process in the third preferred embodiment;

FIGS. 32(a) through 32(d) are sectional views showing a producing process in the third preferred embodiment;

FIGS. 33(a) through 33(d) are sectional views showing a producing process in the third preferred embodiment;

FIGS. 35(a) through 35(d) are illustrations for explaining the reason why a bit line contact is embedded in a semiconductor;

FIGS. 37(a) through 37(d) are plan views of a conventional semiconductor device;

FIGS. 41(a) through 41(d) are plan views showing a process for producing a conventional semiconductor device;

FIGS. 47(a) through 47(d) are sectional views taken along line A—A' of FIGS. 40(a) through 40(d), respectively, which show the process for producing the conventional semiconductor device;

FIGS. 51(a) through 51(d) are sectional views taken along line A—A' of FIGS. 44(a) through 44(d), respectively, which show the process for producing the conventional semiconductor device;

DESCRIPTION OF THE PREFERRED EMBODIMENTS

Figure 3:
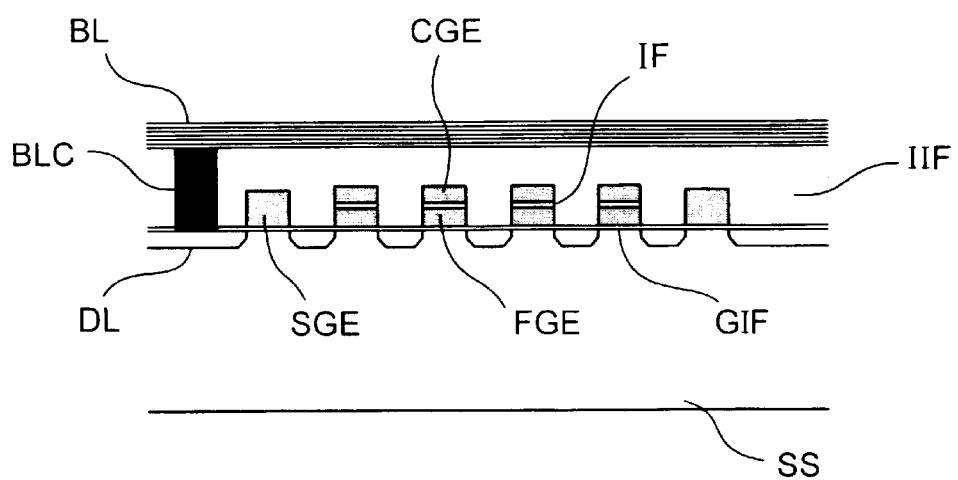
FIG. 3 is a sectional view taken along line B—B' of FIG. 1(d)
Figure 5B:
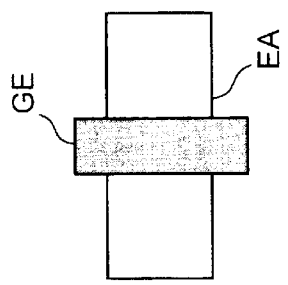
FIGS. 5(a) through 5(d) are plan views showing a producing process in the first preferred embodiment.
Figure 5D:
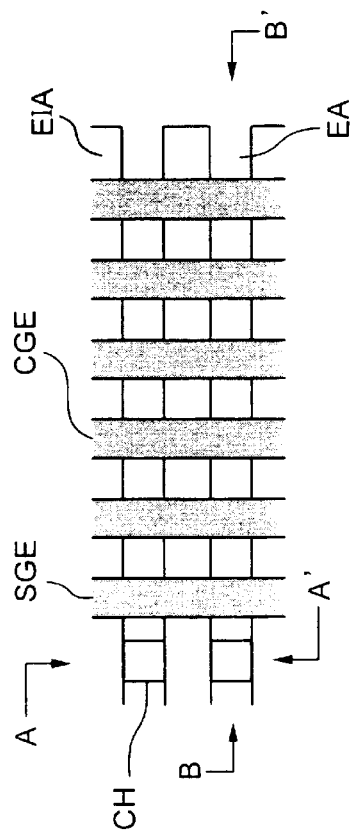
Figure 5A:
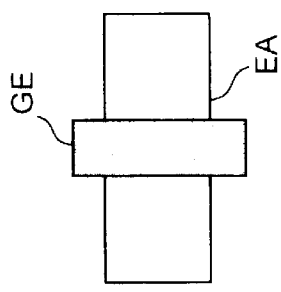
Figure 5C:
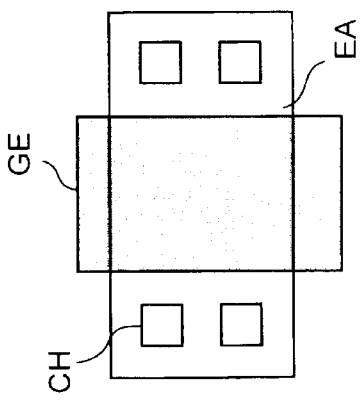
Figure 6A:
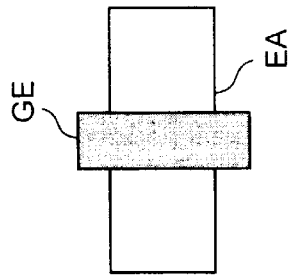
FIGS. 6(a) through 6(d) are plan views showing a producing process in the first preferred embodiment.
Figure 6B:
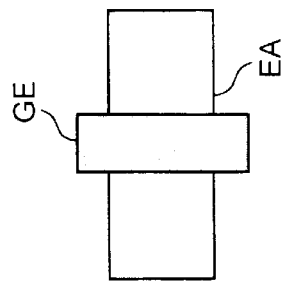
Figure 6C:
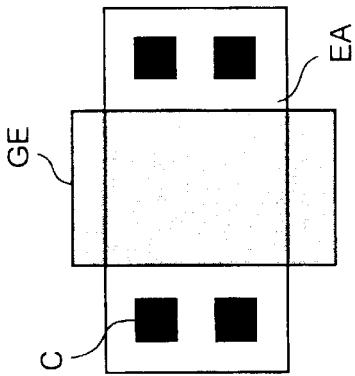
Figure 6D:
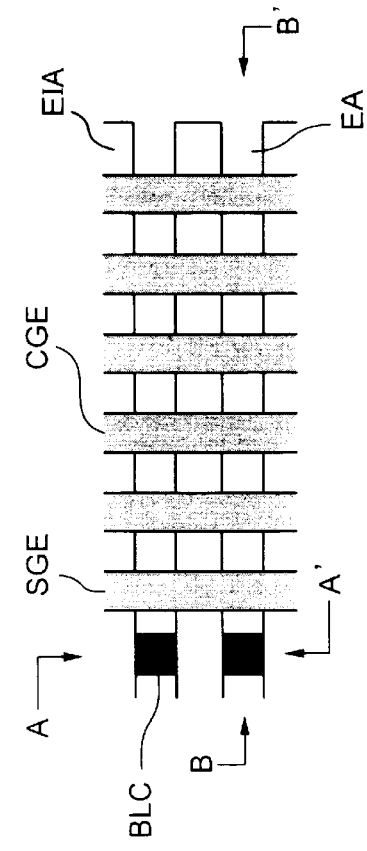
Figure 7B:
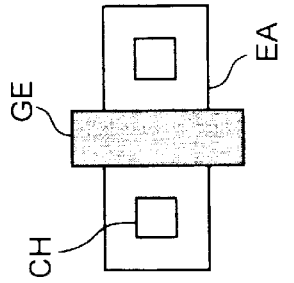
FIGS. 7(a) through 7(d) are plan views showing a producing process in the first preferred embodiment.
Figure 7D:
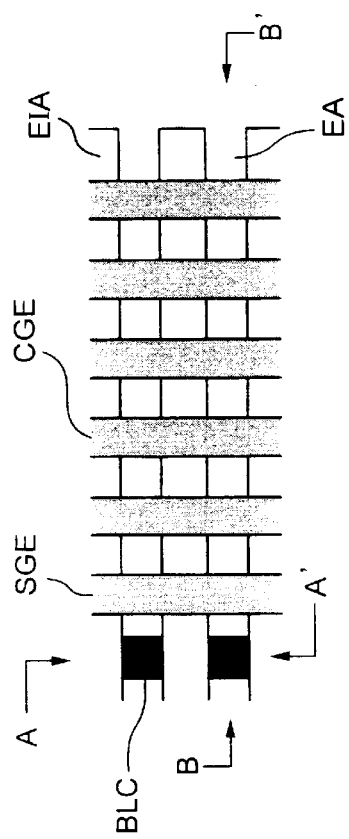
Figure 7A:
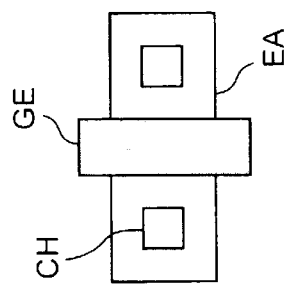
Figure 7C:
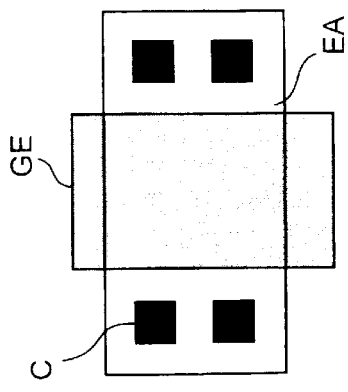
Figure 8A:
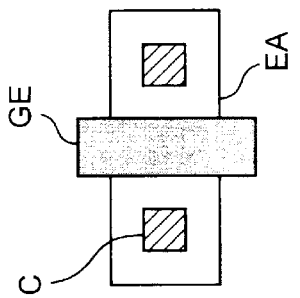
FIGS. 8(a) through 8(d) are plan views showing a producing process in the first preferred embodiment.
Figure 8B:
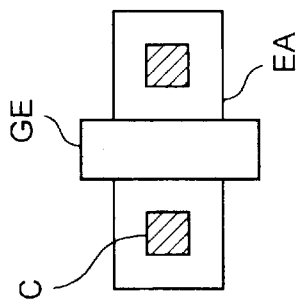
Figure 8C:
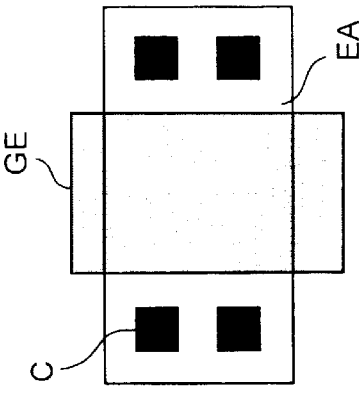
Figure 8D:
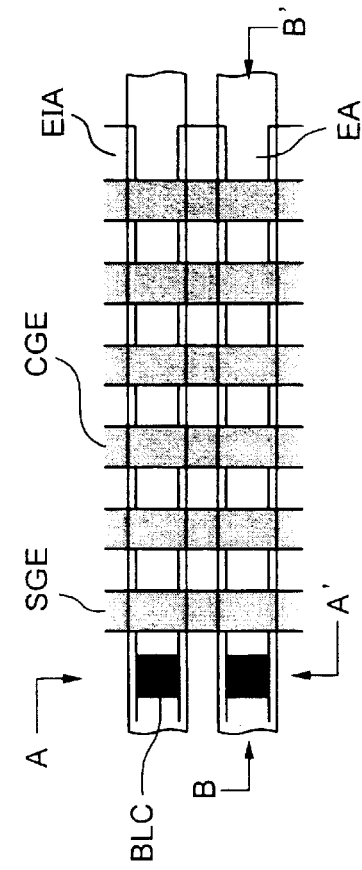
Figure 14:
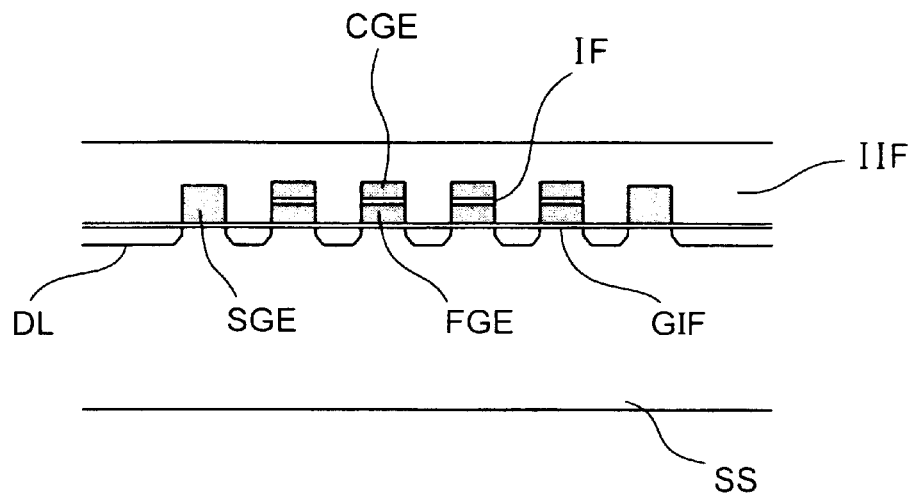
FIG. 14 is a sectional view taken along line B—B' of FIG. 4(d) which shows the producing process in the first preferred embodiment.
Figure 15:
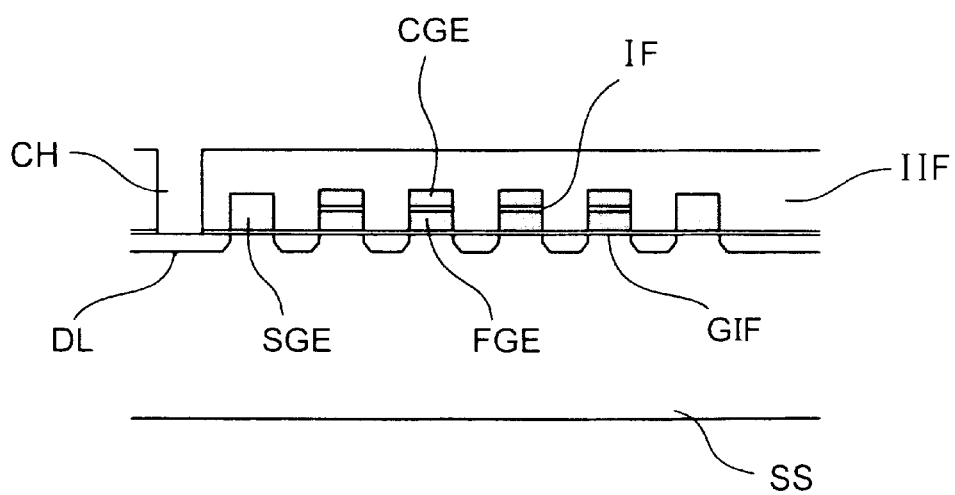
FIG. 15 is a sectional view taken along line B—B' of FIG. 5(d) which shows the producing process in the first preferred embodiment.
Figure 16:
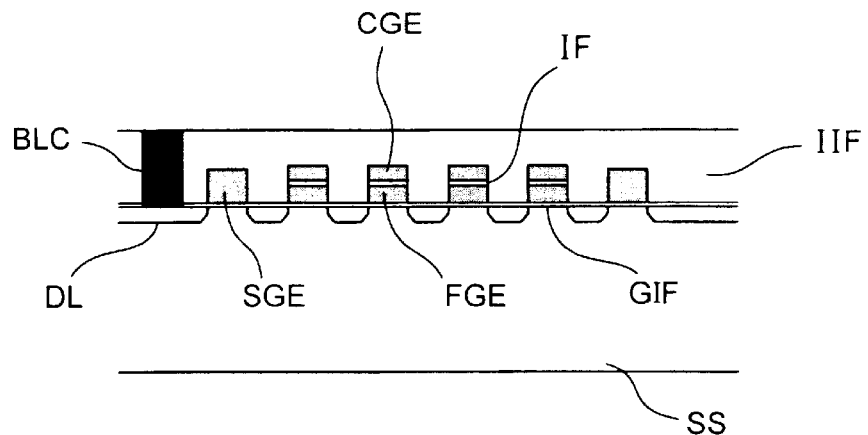
FIG. 16 is a sectional view taken along line B—B' of FIG. 6(d) which shows the producing process in the first preferred embodiment.
Figure 17:
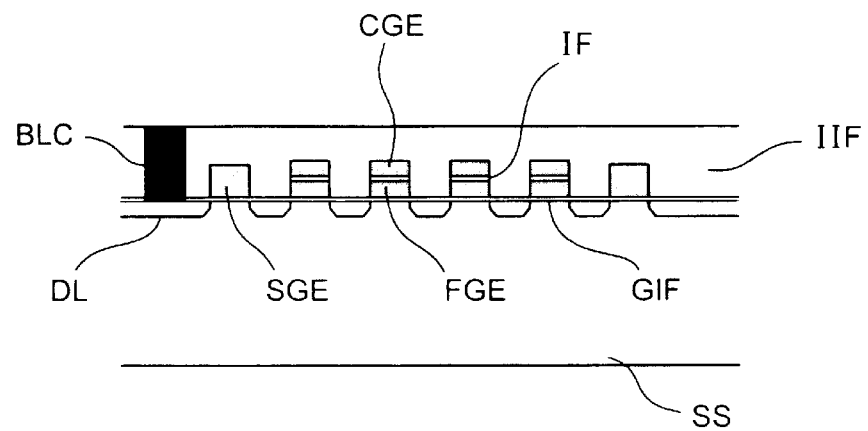
FIG. 17 is a sectional view taken along line B—B' of FIG. 7(d) which shows the producing process in the first preferred embodiment.
Figure 18:
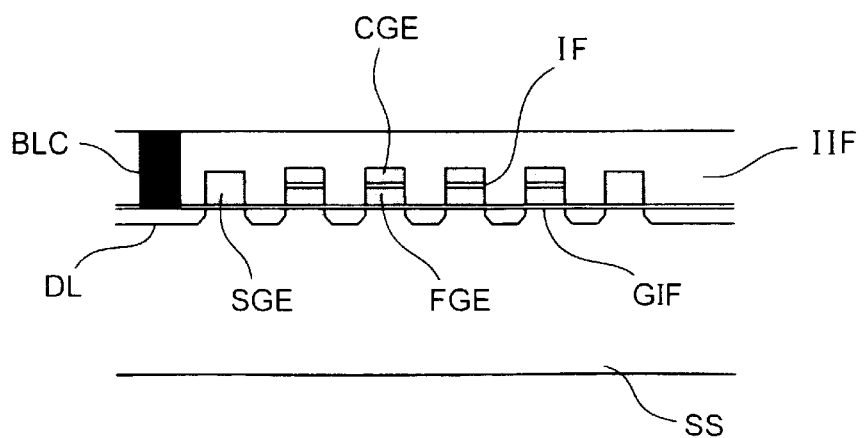
FIG. 18 is a sectional view taken along line B—B' of FIG. 8(d) which shows the producing process in the first preferred embodiment.

Referring now to the accompanying drawings, the preferred embodiments of the present invention will be described below.

First through fourth preferred embodiments will be briefly described below.

In a semiconductor device having both of low-voltage and high-voltage circuits, a metal, such as tungsten or aluminum, is used as a material which is filled in a contact formed in a diffusion layer of the low-voltage circuit portion, and a polycrystalline silicon or the like is used as the material of the high-voltage circuit portion. Thus, there are the following advantages. That is, since it is not required to carry out a heat process while the contact is open, it is possible to prevent the heat process from causing the bending failure. In addition, since it is possible to omit the impurity ion implantation after forming the contact, it is possible to reduce the process costs. Moreover, it is possible to reduce the size of the high-voltage circuit portion without reducing withstand voltage.

(1) First Preferred Embodiment

FIGS. 1(a) through 1(d) are plan views showing the first preferred embodiment of an EEPROM according to the present invention. FIGS. 2(a) through 2(d) are sectional views taken along lines A—A' and B—B' of FIGS. 1(a) through 1(b), respectively.

The EEPROM in this preferred embodiment is an example of a non-volatile memory device called a NAND type EEPROM wherein a plurality of memory transistors are connected in series. However, the present invention may be applied to various EEPROMs, such as NOR, AND and DiNOR types EEPROMs, in addition to the NAND type EEPROM. Moreover, the present invention may be applied to various semiconductor devices having both of high-voltage and low-voltage circuits, in addition to EEPROMs.

In this preferred embodiment, a low-voltage NMOS, a low-voltage PMOS, a high-voltage NMOS, and a memory cell array are provided on a semiconductor substrate. One of the features of this preferred embodiment is that a metal is filled in the contacts of the low-voltage NMOS and PMOS portions, and a polycrystalline silicon is filled in the contact of the high-voltage NMOS and the bit line contact of the memory cell portion.

A method for producing the semiconductor device of FIGS. 1(a) through 1(d) will be described below.

FIGS. 4(a) through 8(d) are plan views showing the steps of the producing method. FIGS. 9(a) through 13(d) and FIGS. 14 through 18 are sectional views taken along lines A—A' and B—B' of FIGS. 4(a) through 8(d), respectively.

First, as can be seen from FIGS. 9(a) through 9(d) and FIG. 14, an element region EA, a gate insulating film GIF and a gate electrode GE are formed on a silicon substrate (a semiconductor substrate)SS. Then, a source/drain diffusion layer DL is formed. A diffusion layer DL is formed in each of a low-voltage NMOS, a high-voltage NMOS and a memory cell array using an n-type impurity. In general, the high-voltage NMOS must have a high breakdown withstand voltage in a p-n junction. Therefore, a diffusion layer having a lower density than that of the low-voltage NMOS is used.

Thereafter, as shown in FIGS. 9(a) through 9(d) and FIG. 14, the surface is covered with an interlayer insulating film ILIF.

Subsequently, as shown in FIGS. 5(a) through 5(d), FIGS. 10(a) through 10(d) and FIG. 15, contact holes CH are formed in the high-voltage NMOS portion and the memory cell portion.

Then, as shown in FIGS. 6(a) through 6(d), FIGS. 11(a) through 11(d) and FIG. 16, an n-type impurity doped polycrystalline silicon PSI is filled in the contact holes CH. For example, after the contact holes are formed, a phosphorus doped polycrystalline silicon is deposited by the LPCVD method, and then, the excessive polycrystalline silicon on the interlayer insulating film is removed by the chemical mechanical polishing (CMP) to selectively leave the polycrystalline silicon in the contact holes. Furthermore, the filled material may be, e.g., an amorphous silicon. In addition, a method for doping an impurity by, e.g., ion implantation or diffusion, after filling a polycrystalline or amorphous silicon in which no impurity is doped may be used.

Thereafter, if necessary, a heat treatment may be carried out at a temperature of about 800 to 900° C. By this heat treatment, the n-type impurity is diffused into the semiconductor substrate SS from the polycrystalline silicon film embedded in the contact hole, so that it is possible surely form the p-n junction. At this time, according to the present invention, the polycrystalline silicon film embedded in the contact hole functions as a support, so that it is possible to prevent the contact hole from being bent due to the flow of the interlayer insulating film during the heat treatment.

Subsequently, as shown in FIGS. 7(a) through 7(d), FIGS. 12(a) through 12(d) and FIG. 17, contact holes CH are formed in the low-voltage NMOS portion and the low-voltage PMOS portion, and a metal is filled therein as shown in FIGS. 8(a) through 8(d), FIGS. 13(a) through 13(d) and FIG. 18. The filled metal is, e.g., tungsten, aluminum metal including at least one of tungsten, aluminum and titanium. Thereafter, a metal wiring is formed on the interlayer insulating film to complete a semiconductor device shown in FIGS. 1(a) through 3.

The metal filled in the contact holes may be the same as or different from the metal for forming the wiring. The metal filled in the contact holes and the metal for wiring may be simultaneously formed.

According to the producing method in this preferred embodiment, it is possible to prevent the bending of the contact hole which causes malfunction while ensuring a sufficient breakdown withstand voltage in the high-voltage transistor portion.

In addition, as compared with those of the conventional producing method, the advantages of the producing method in this preferred embodiment will be described. First, in the conventional producing method, the ion implantation after forming the contact holes takes a lot of time due to high density, and it is required to separately carry out the ion implantation for the n-type diffusion layer and the ion implantation for the p-type diffusion layer, so that it is required to carry out a photolithography process in order to divide the ion implantation processes. On the other hand, according to the producing method of the present invention, it is not required to carry out the ion re-implantation process and photolithography process which must be carried out in the conventional method, so that it is possible to greatly reduce the producing costs.

In addition, the space between gates generally decreases with the scale down of elements, so that it is required to use a material having a higher flowability as the interlayer insulating material which is filled in the space. Therefore, there is conventionally a problem in that the contact is more easily bent as the flowability increases. According to the present invention, this problem can be solved.

(2) Second Preferred Embodiment

FIGS. 19(a) through 19(d) are plan views of the second preferred embodiment of an EEPROM according to the present invention. FIGS. 20(a) through 20(d) are sectional views taken along lines A—A' and B—B' of FIGS. 19(a) through 19(d), respectively.

Figure 21:
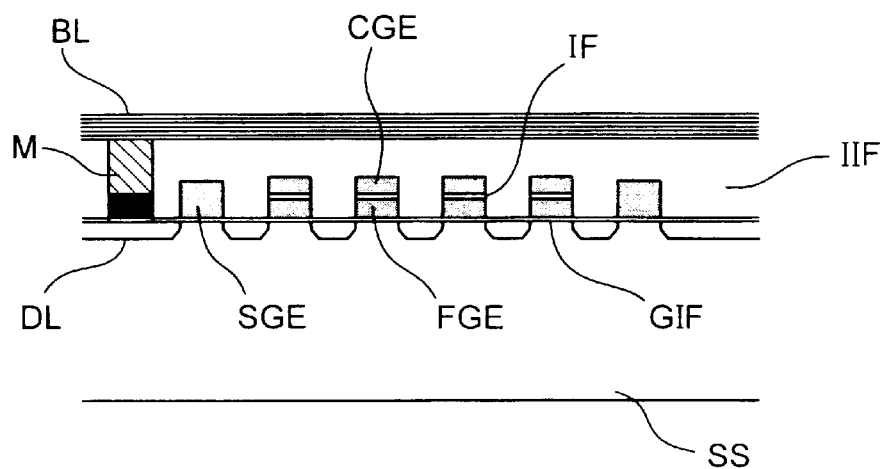
FIG. 21 is a sectional view taken along line B—B' of FIG. 19(d)
Figure 22A:
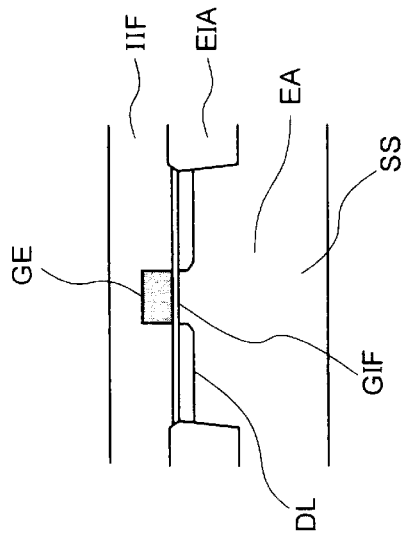
FIGS. 22(a) through 22(d) are sectional views taken along line A—A' of FIGS. 19(a) through 19(d), respectively, which show a producing process in the second preferred embodiment.
Figure 22B:
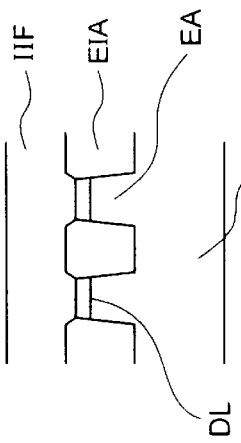
Figure 22C:
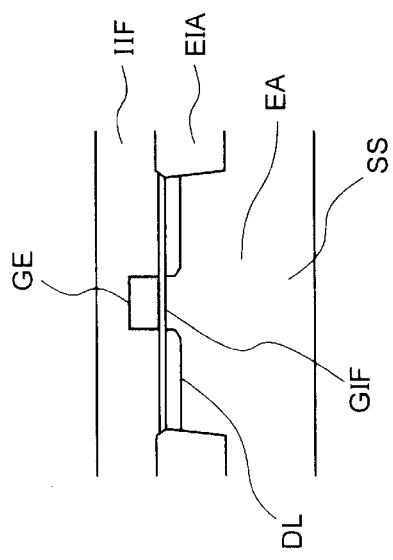
Figure 22D:
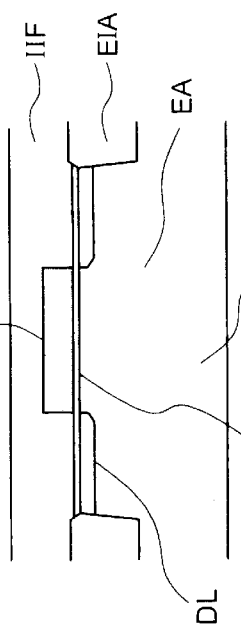
Figure 26A:
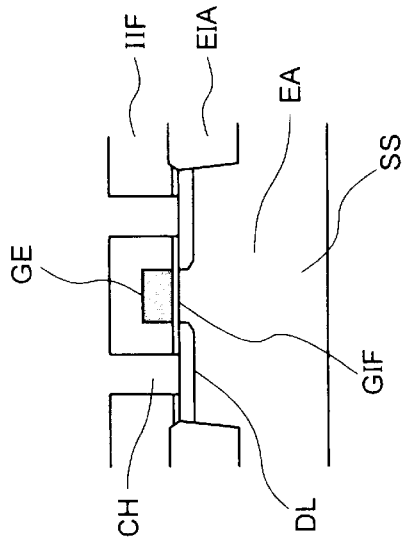
FIGS. 26(a) through 26(d) are sectional views taken along line A—A' of FIGS. 19(a) through 19(d), respectively, which show a producing process in the second preferred embodiment.
Figure 26B:
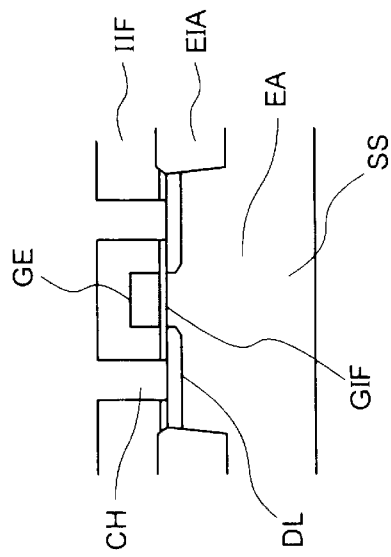
Figure 26C:
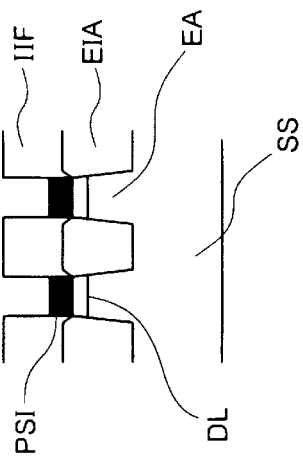
Figure 26D:
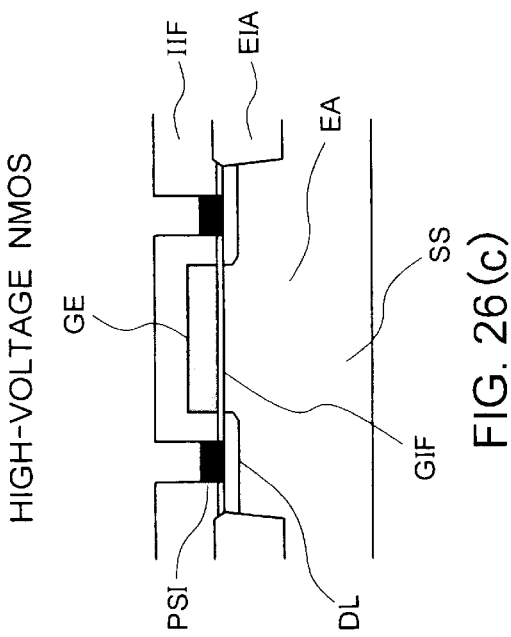
Figure 27A:
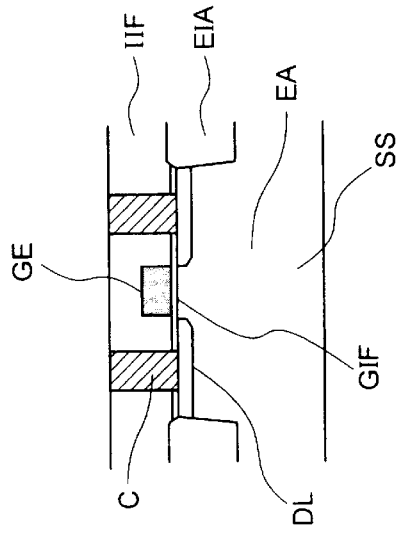
FIGS. 27(a) through 27(d) are sectional views taken along line A—A' of FIGS. 19(a) through 19(d), respectively, which show a producing process in the second preferred embodiment.
Figure 27B:
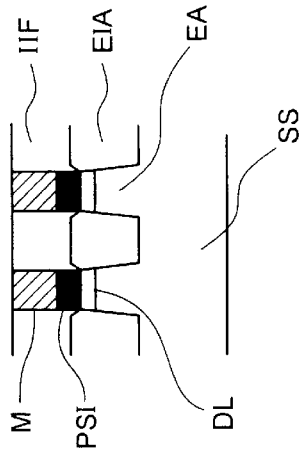
Figure 27C:
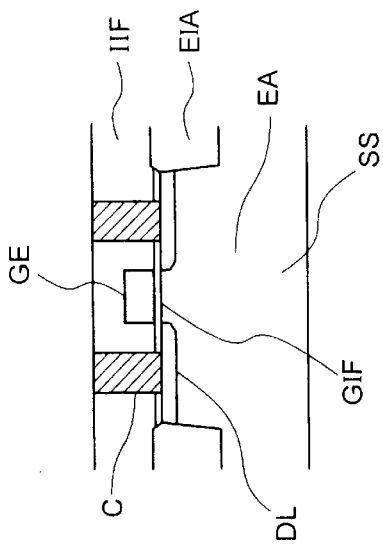
Figure 27D:
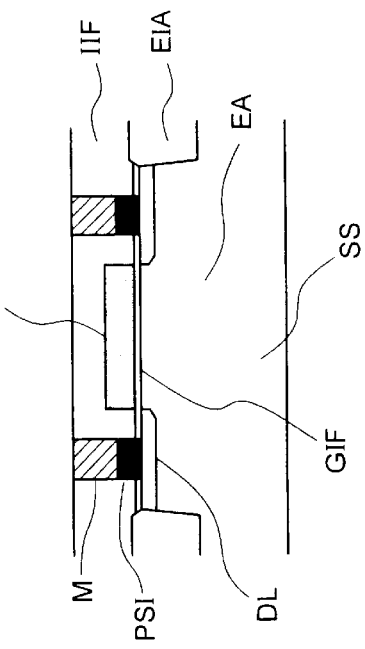
Figure 29B:
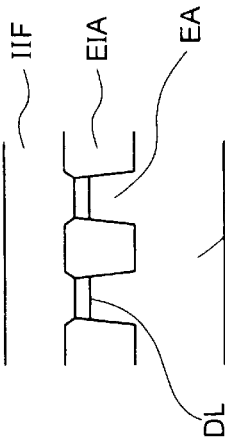
FIGS. 29(a) through 29(d) are sectional views showing a producing process in the third preferred embodiment.
Figure 29D:
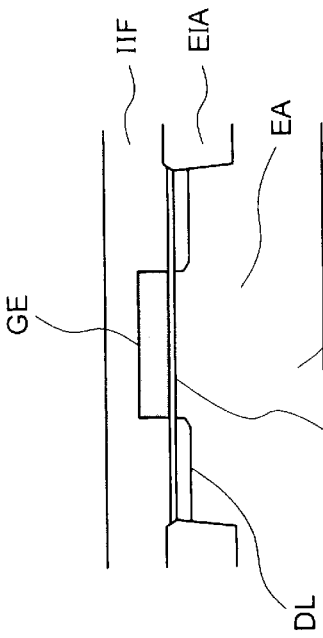
Figure 29A:
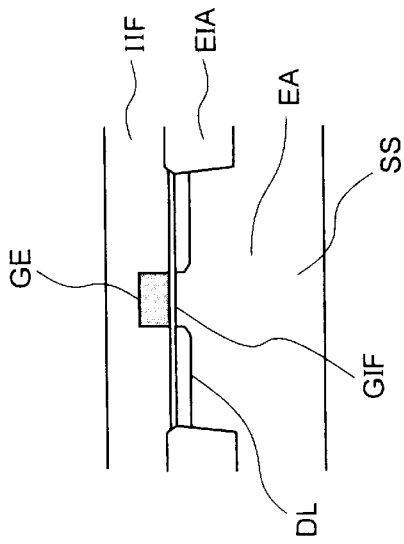
Figure 29C:
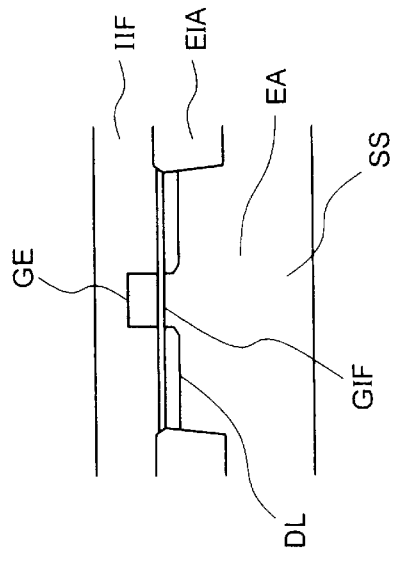
Figure 34:
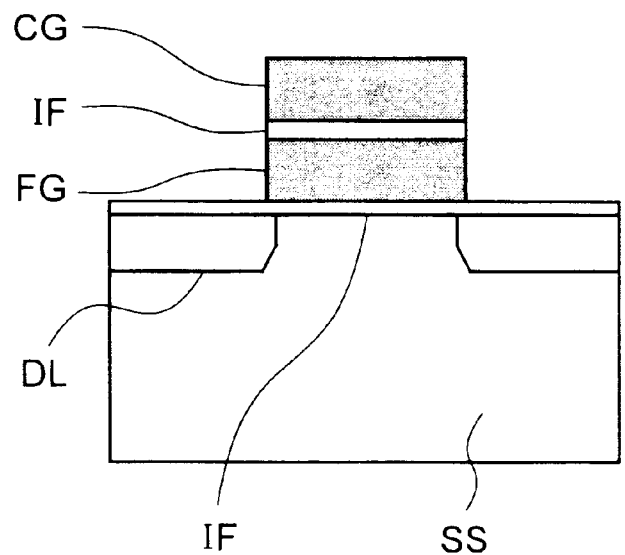
FIG. 34 is a sectional view showing an EEPROM.
Figure 36B:
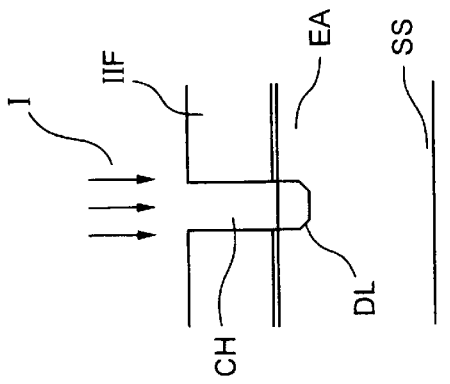
FIGS. 36(a) through 36(c) are illustrations showing problems of a conventional semiconductor device.
Figure 36C:
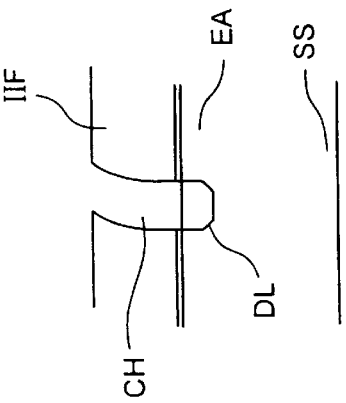
Figure 36A:
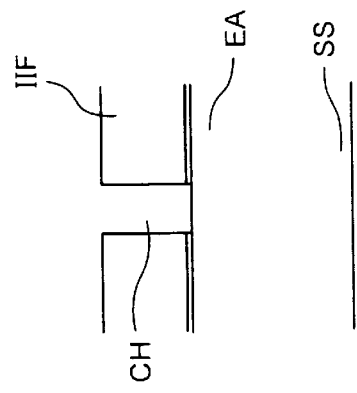
Figure 38A:
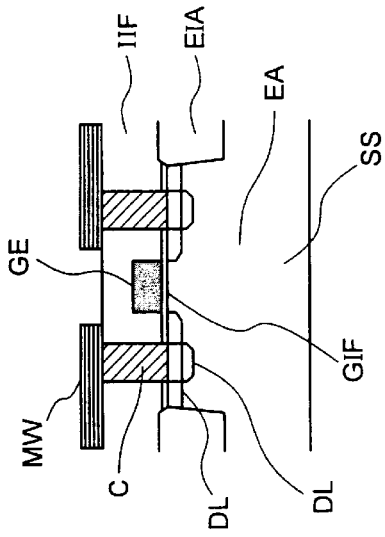
FIGS. 38(a) through 38(d) are sectional views taken along line A—A' of FIGS. 37(a) through 37(d), respectively.
Figure 38B:
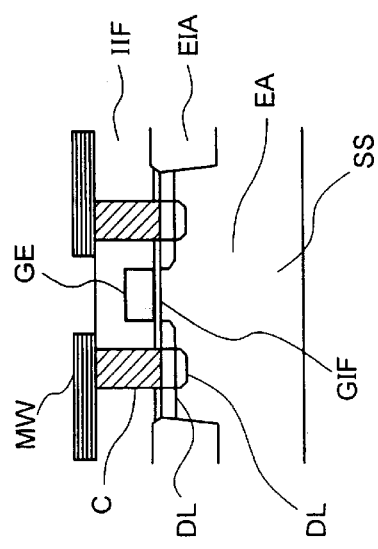
Figure 38C:
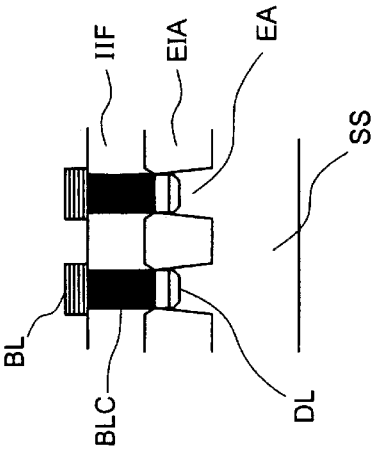
Figure 38D:
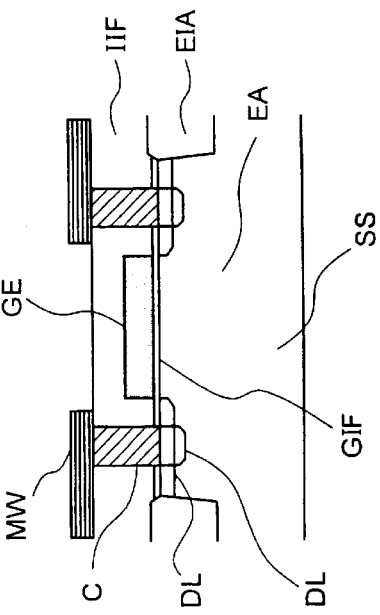
Figure 39:
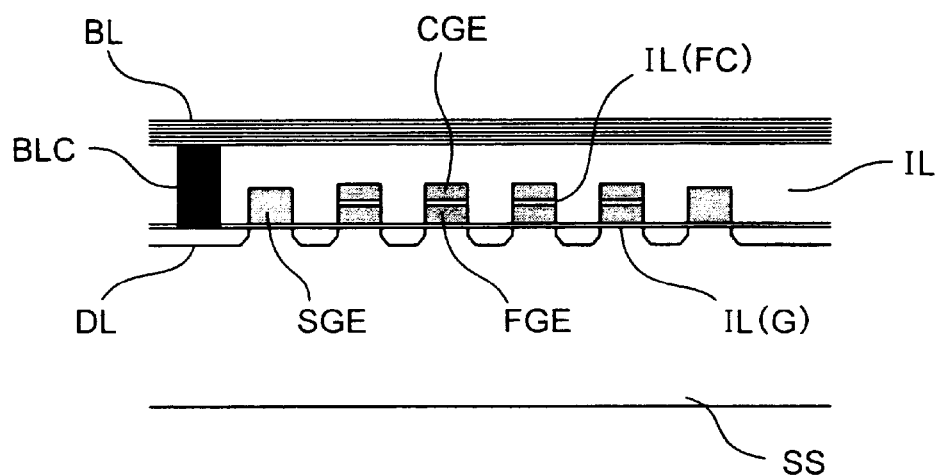
FIG. 39 is a sectional view taken along line B—B' of FIG. 37(d)
Figure 40B:
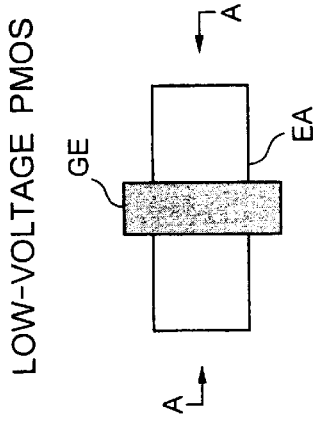
FIGS. 40(a) through 40(d) are plan views showing a process for producing a conventional semiconductor device.
Figure 40A:
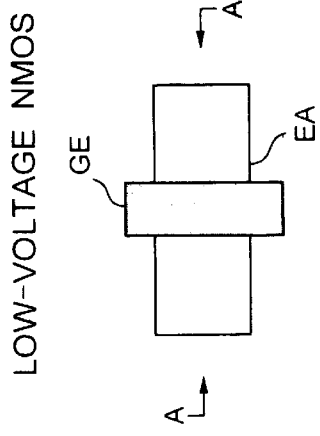
Figure 40D:
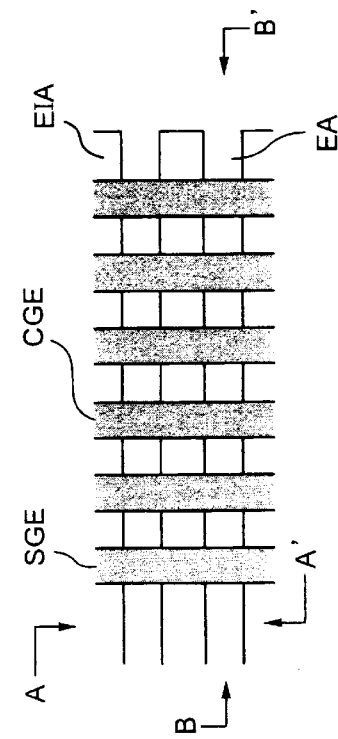
Figure 40C:
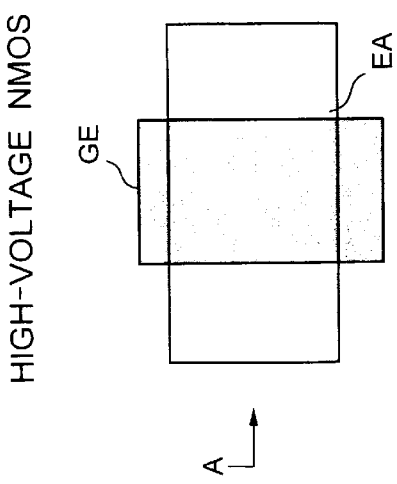
Figure 42B:
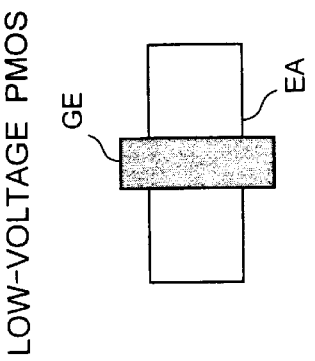
FIGS. 42(a) through 42(d) are plan views showing a process for producing a conventional semiconductor device.
Figure 42D:
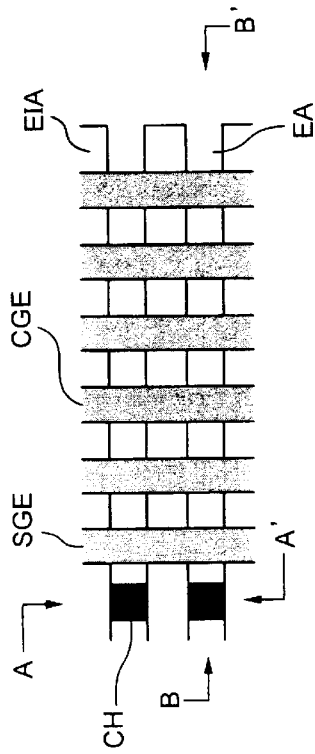
Figure 42A:
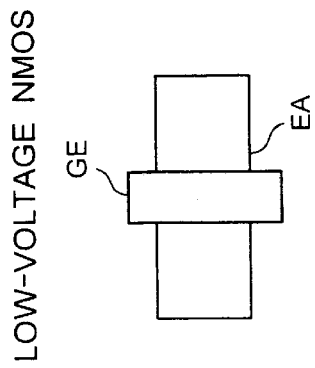
Figure 42C:
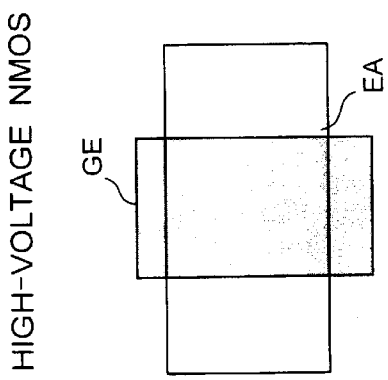
Figure 43A:
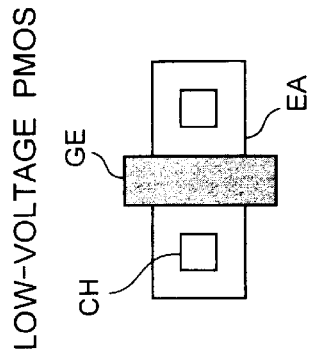
FIGS. 43(a) through 43(d) are plan views showing a process for producing a conventional semiconductor device.
Figure 43B:
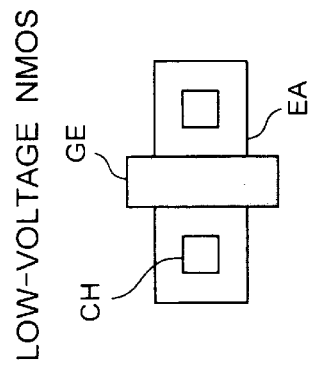
Figure 43C:
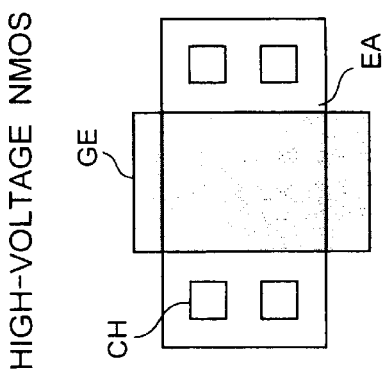
Figure 43D:
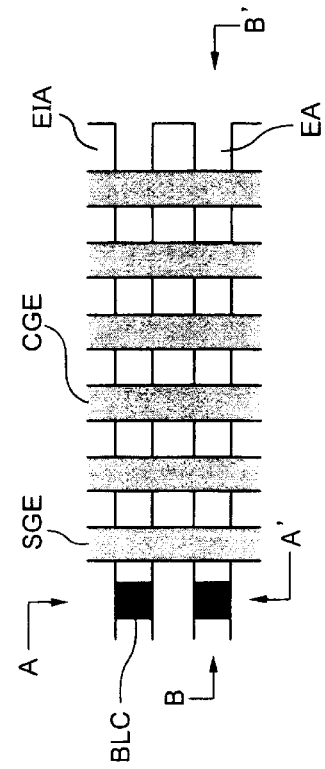
Figure 44A:
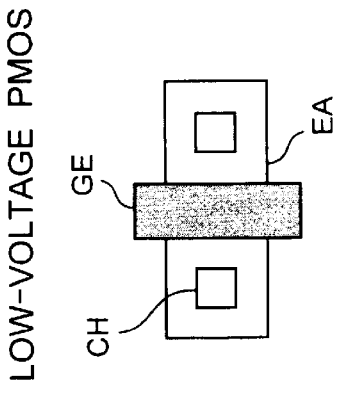
FIGS. 44(a) through 44(d) are plan views showing a process for producing a conventional semiconductor device.
Figure 44B:
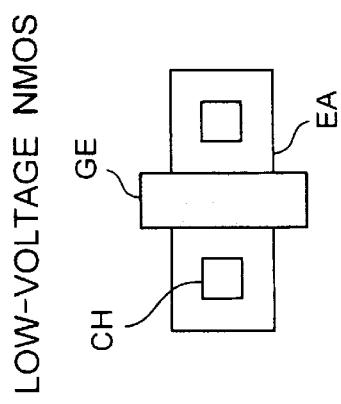
Figure 44C:
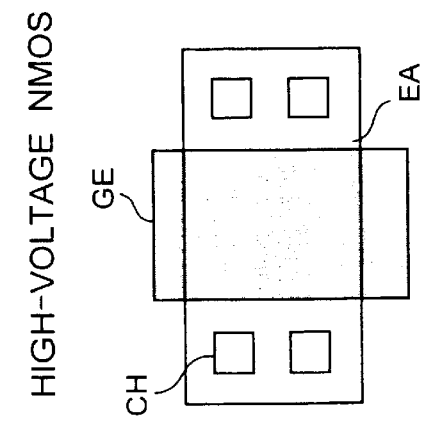
Figure 44D:
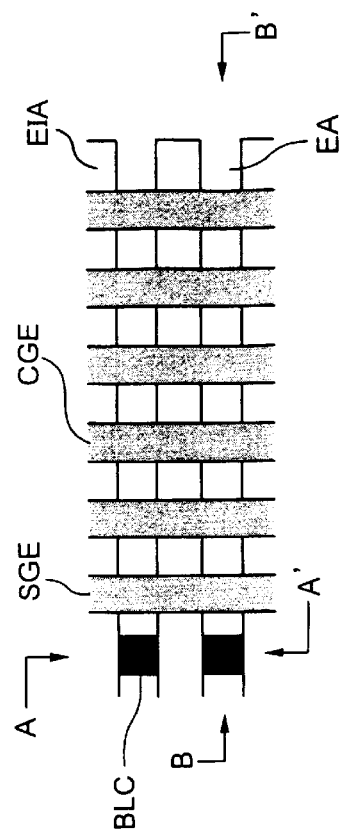
Figure 45B:
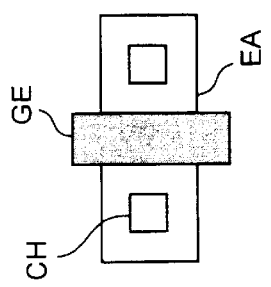
FIGS. 45(a) through 45(d) are plan views showing a process for producing a conventional semiconductor device.
Figure 45D:
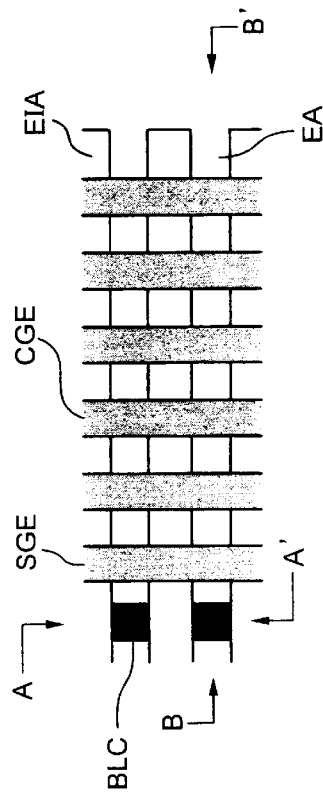
Figure 45A:
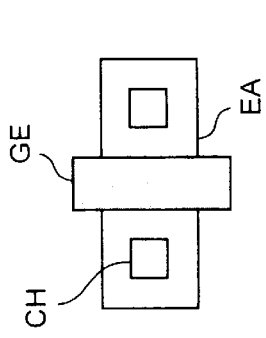
Figure 45C:
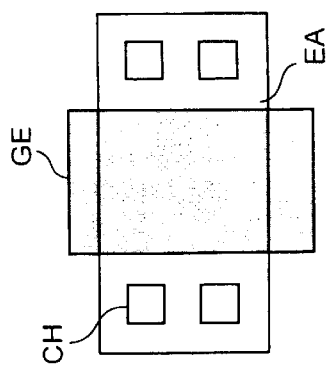
Figure 46A:
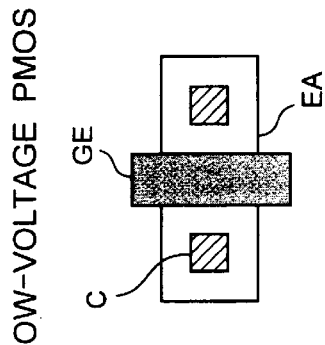
FIGS. 46(a) through 46(d) are plan views showing a process for producing a conventional semiconductor device.
Figure 46B:
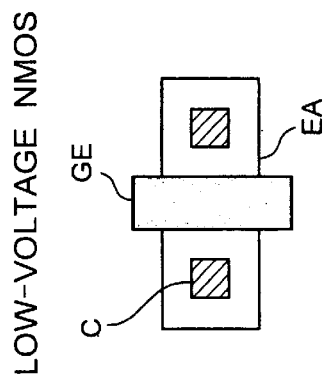
Figure 46C:
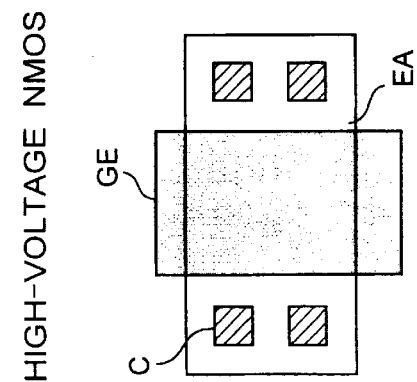
Figure 46D:
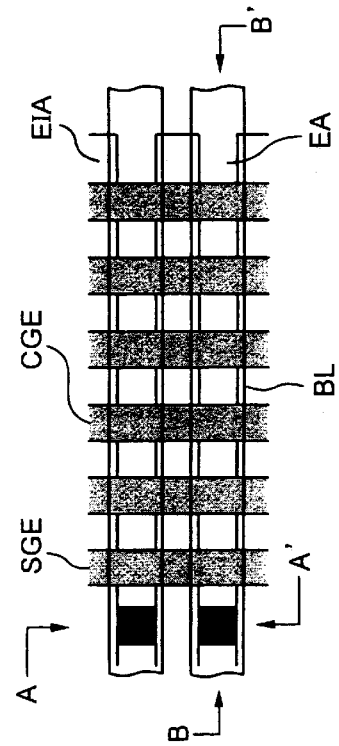
Figure 48A:
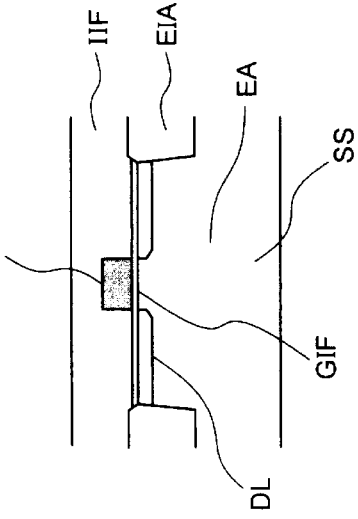
FIGS. 48(a) through 48(d) are sectional views taken along line A—A' of FIGS. 41(a) through 41(d), respectively, which show the process for producing the conventional semiconductor device.
Figure 48B:
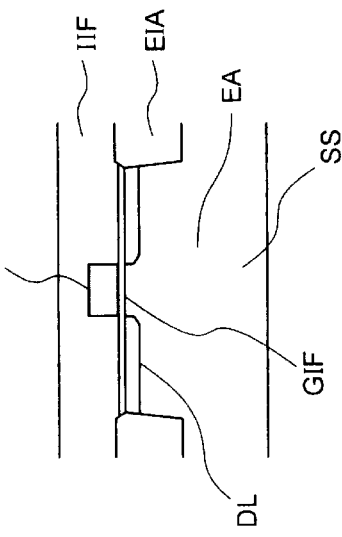
Figure 48C:
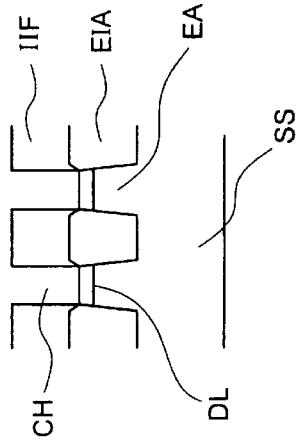
Figure 48D:
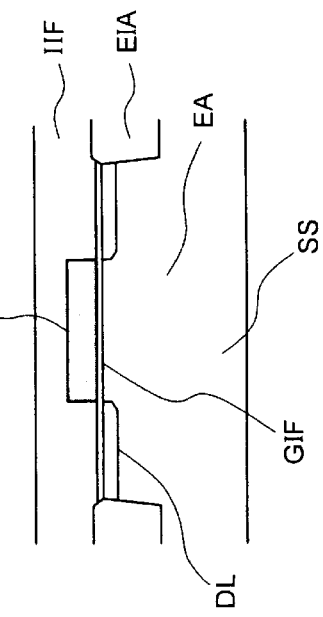
Figure 49A:
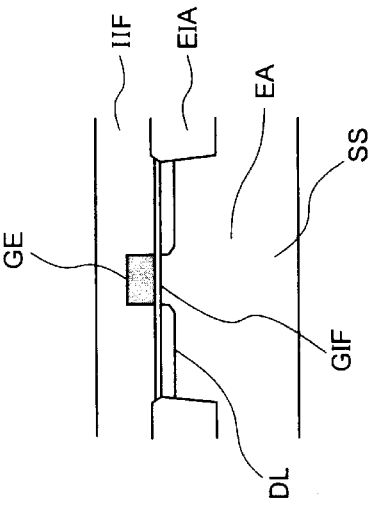
FIGS. 49(a) through 49(d) are sectional views taken along line A—A' of FIGS. 42(a) through 42(d), respectively, which show the process for producing the conventional semiconductor device.
Figure 49C:
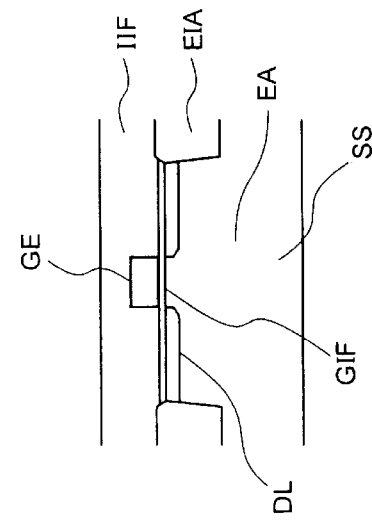
Figure 49B:
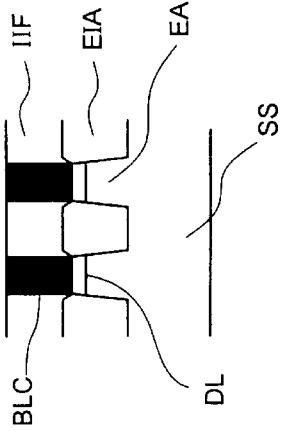
Figure 49D:
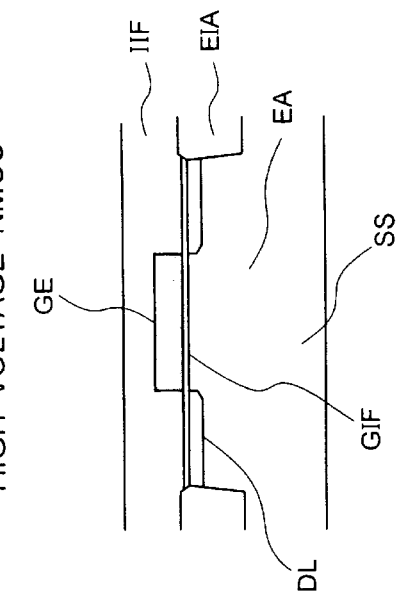
Figure 50B:
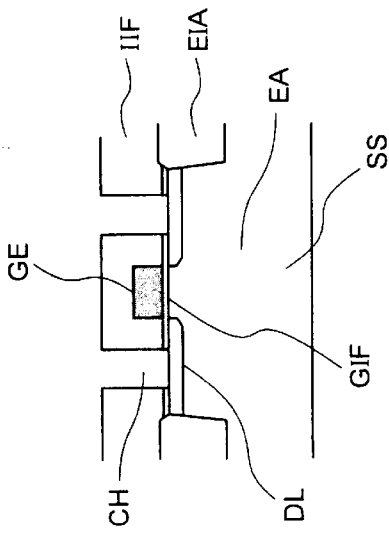
FIGS. 50(a) through 50(d) are sectional views taken along line A—A' of FIGS. 43(a) through 43(d), respectively, which show the process for producing the conventional semiconductor device.
Figure 50D:
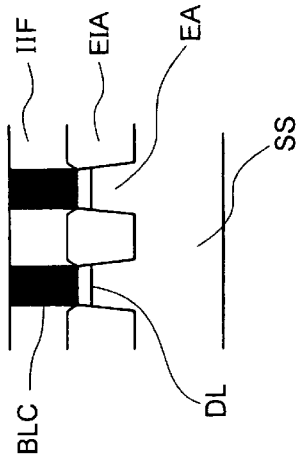
Figure 50A:
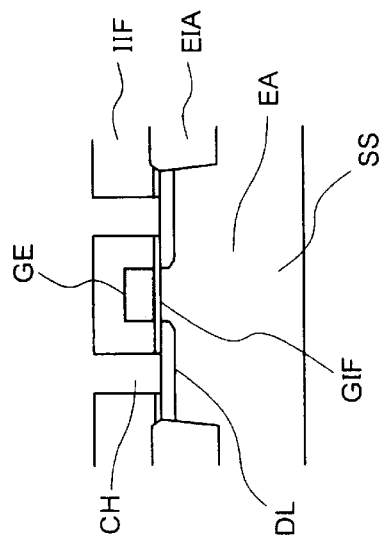
Figure 50C:
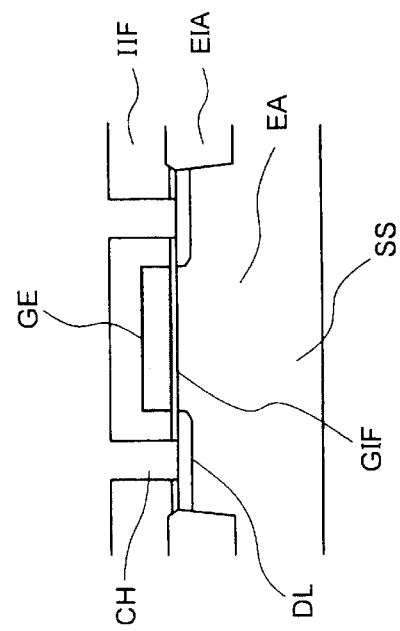
Figure 52B:
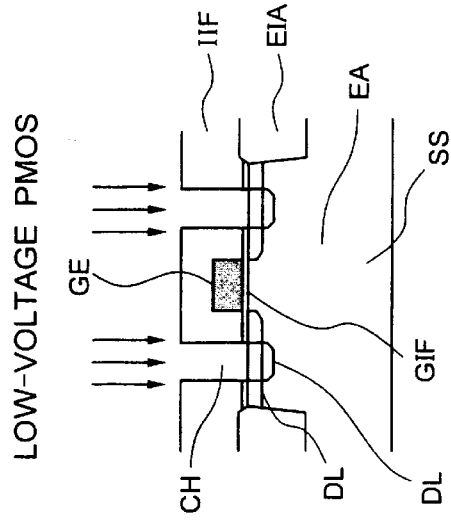
FIGS. 52(a) through 52(d) are sectional views taken along line A—A' of FIGS. 45(a) through 45(d), respectively, which show the process for producing the conventional semiconductor device.
Figure 52D:
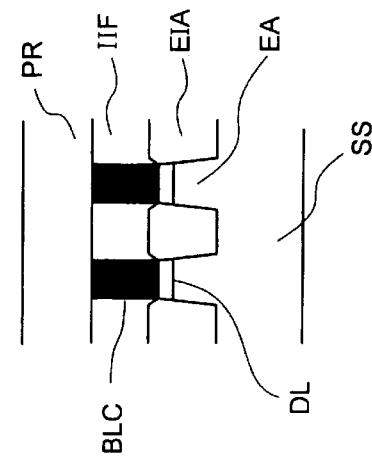
Figure 52A:
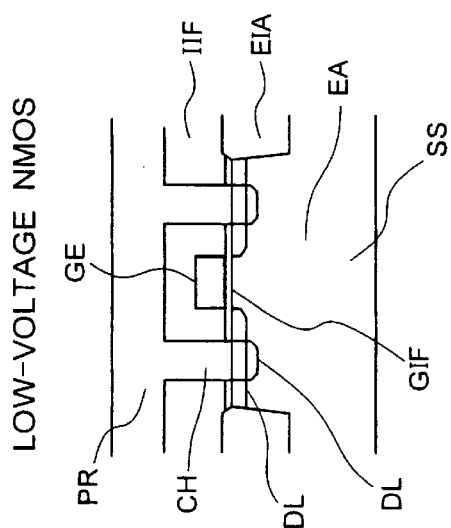
Figure 52C:
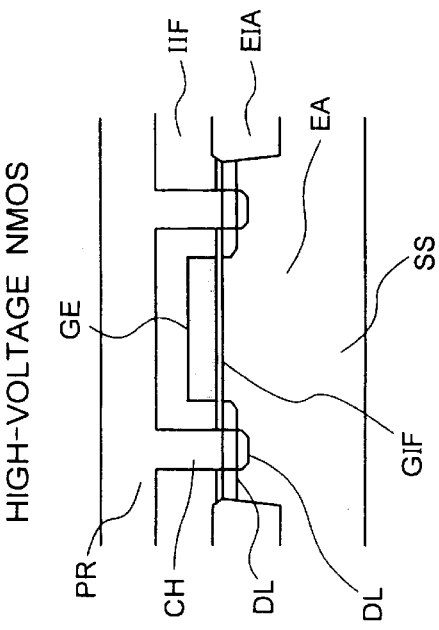
Figure 53B:
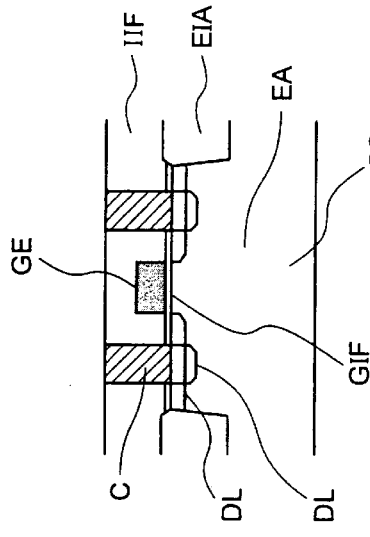
FIGS. 53(a) through 53(d) are sectional views taken along line A—A' of FIGS. 46(a) through 46(d), respectively, which show the process for producing the conventional semiconductor device.
Figure 53D:
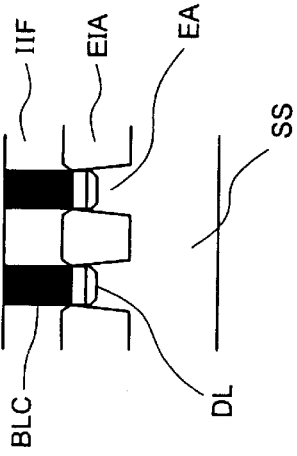
Figure 53A:
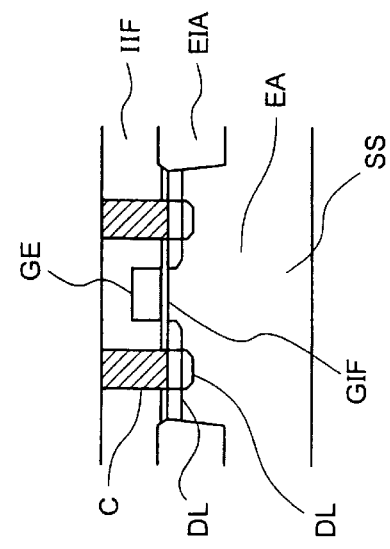
Figure 53C:
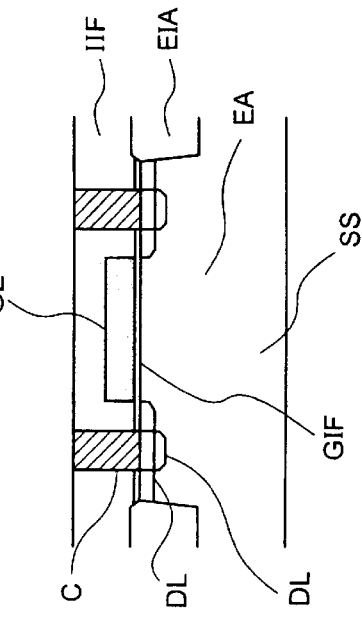
Figure 54:
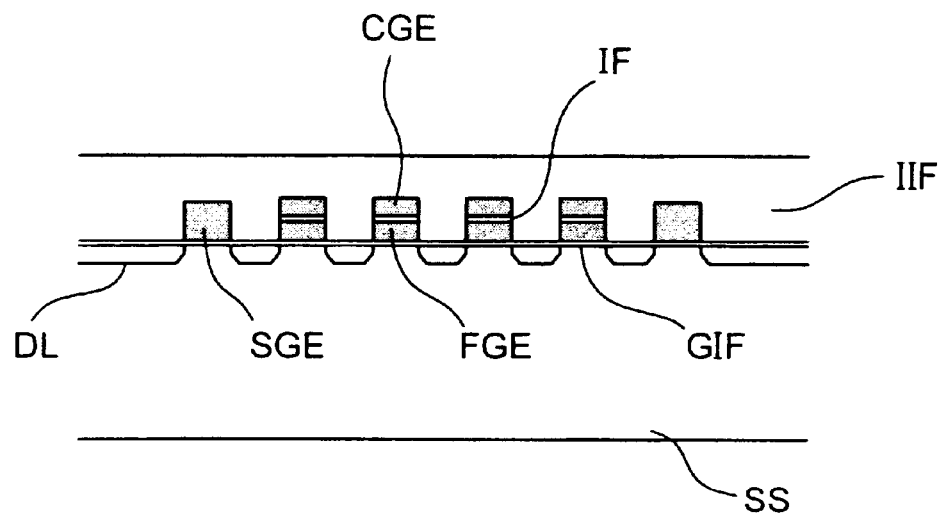
FIG. 54 is a sectional view taken along line B—B' of FIG. 40(d) which shows the process for producing the conventional semiconductor device.
Figure 55:
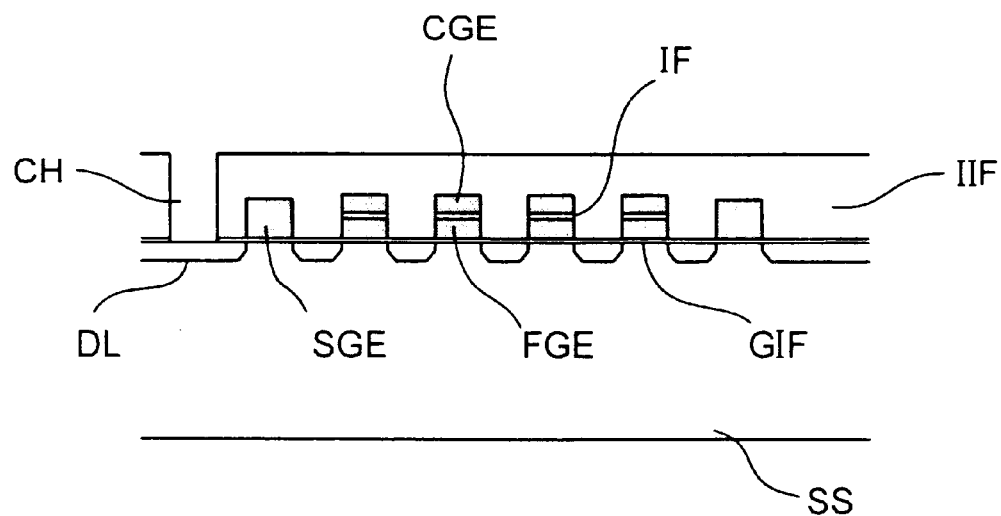
FIG. 55 is a sectional view taken along line B—B' of FIG. 41(d) which shows the process for producing the conventional semiconductor device.
Figure 56:
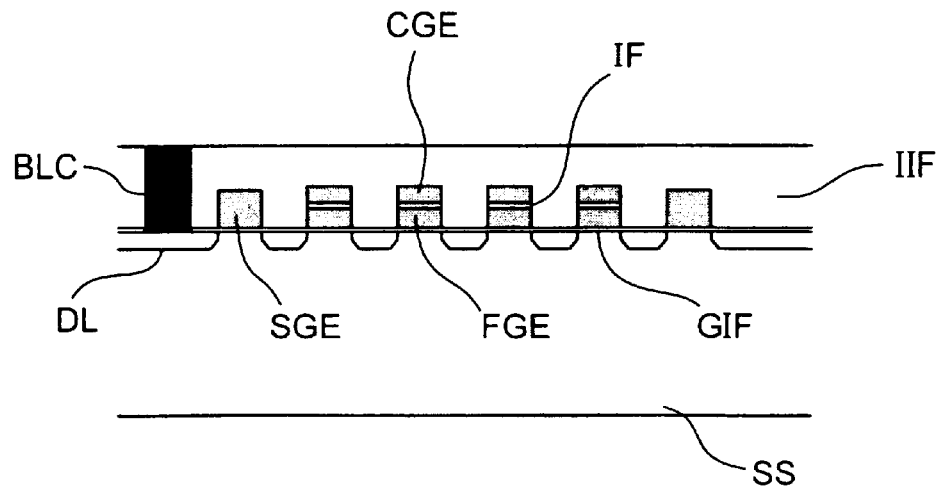
FIG. 56 is a sectional view taken along line B—B' of FIG. 42(d) which shows the process for producing the conventional semiconductor device.
Figure 57:
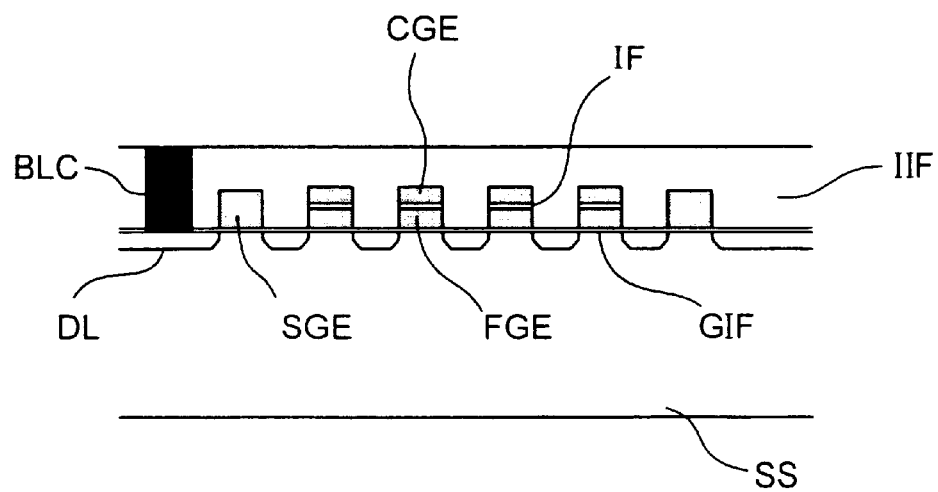
FIG. 57 is a sectional view taken along line B—B' of FIG. 43(d) which shows the process for producing the conventional semiconductor device.
Figure 58:
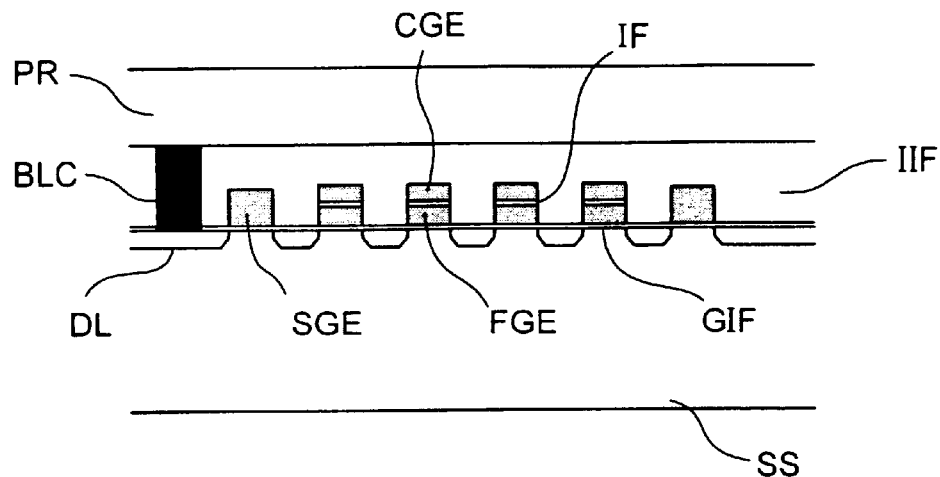
FIG. 58 is a sectional view taken along line B—B' of FIG. 44(d) which shows the process for producing the conventional semiconductor device.
Figure 59:
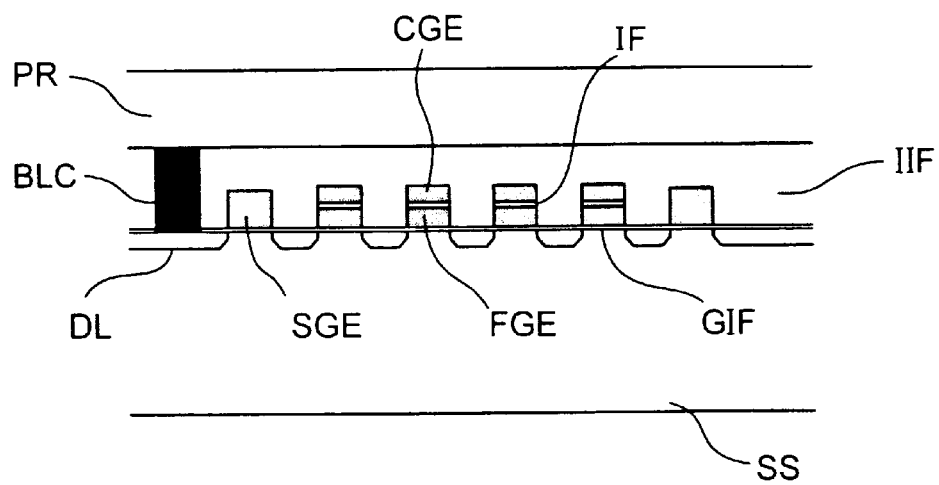
FIG. 59 is a sectional view taken along line B—B' of FIG. 45(d) which shows the process for producing the conventional semiconductor device.
Figure 60:
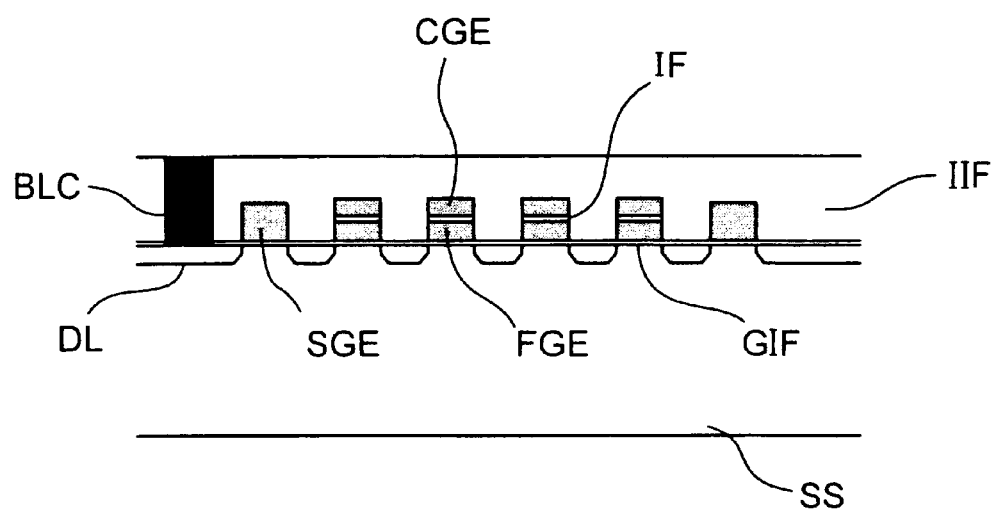
FIG. 60 is a sectional view taken along line B—B' of FIG. 46(d) which shows the process for producing the conventional semiconductor device.

As can be seen from these figures, particularly as can been seen from FIGS. 20(c), 20(d) and 21, the second preferred embodiment is different from the first preferred embodiment at the point that a polycrystalline silicon PSI is filled in the bottom portion of each of the contact holes of the high-voltage NMOS portion and cell array portion, which contacts the substrate SS, and a metal M is filled in the top portion thereof. In place of the polycrystalline silicon, an amorphous silicon may be used. The metal M may be, e.g., tungsten or aluminum. Thus, if a metal having a lower resistance than that of the polycrystalline silicon is used as a part of the contact filling material, the resistance of the contact can be lower than that when the whole contact hole is filled with the polycrystalline silicon, so that it is possible to increase the operating speed.

Each of the contacts C of the low-voltage NMOS portion and low-voltage PMOS portion is filled with a metal. This metal may be the same as or different from the metal filled in the contacts of the high-voltage NMOS portion and cell array portion.

The method for producing the semiconductor device shown in FIGS. 19(a) through 21 will be described below.

Until the contact holes are formed, the steps of the producing method are the same as those in the first preferred embodiment. That is, after an element region EA, a gate insulating film GIF and a gate electrode GE are formed on a silicon substrate, a source/drain diffusion layer DL is formed, and the surface is covered with an interlayer insulating film IIF as shown in FIG. 22.

Thereafter, as shown in FIGS. 23(a) through 23(d), contact holes CH are formed in the high-voltage NMOS portion and memory cell portion.

Then, as shown in FIGS. 24(a) through 24(d), an n-type impurity doped polycrystalline silicon is filled in the contact holed CH. If necessary, a heat treatment may be carried out in order to diffuse the impurity from the filled polycrystalline silicon film PSIF into the substrate SS.

Then, as shown in FIGS. 25(a) through 25(d), a part of the polycrystalline silicon film PSIF embedded in the contact holes is removed.

Subsequently, as shown in FIGS. 26(a) through 26(d), contact holes CH are formed in the low-voltage NMOS portion and low-voltage PMOS portion, and a metal is filled therein as shown in FIGS. 27(a) through 27(d).

Thereafter, a metal wiring MW is formed on the interlayer insulating film IIF. Thus, a semiconductor device shown in FIGS. 19(a) through 21 is completed.

According to the producing method in this preferred embodiment, while it is possible to ensure a sufficient breakdown withstand voltage in the high-voltage transistor, it is not required to carry out a heat treatment while nothing is filled in contact holes after the contact holes are formed. Therefore, it is possible to prevent the flow of the interlayer insulating film, and it is possible to prevent the contact holes from being bent. Moreover, since a metal having a low resistance is used as a part of the contact filling material, the resistance of the contact can be lower than that when the polycrystalline silicon is filled in the whole contact as the first preferred embodiment.

(3) Third Preferred Embodiment

FIGS. 28(a) through 28(d) are sectional views showing the third preferred embodiment of an EEPROM according to the present invention.

In this preferred embodiment, a diffusion layer DLL having a low density is formed in a high-voltage NMOS portion, and a diffusion layer DLH having a higher density than that of the diffusion layer DLL is formed only near the bottom of contacts.

In general, an electric field tends to concentrate in a portion contacting a gate electrode or in a source/drain diffusion layer in the end of an element region. Therefore, if the impurity density in this portion is high, the breakdown withstand voltage of the transistor tends to lower. However, in this preferred embodiment, the withstand voltage is difficult to deteriorate since the impurity density in the above described portion is low. Moreover, since the bottom of contacts is the high-density diffusion layer, the resistance of contacts can be lower than those in the first and second preferred embodiments.

FIGS. 29(a) through 33(d) are sectional views showing a producing method.

The producing method in this preferred embodiment is the same as those in the first and second preferred embodiment until contact holes are formed in the high-voltage NMOS portion and the cell array portion. That is, an element region EA, a gate insulating film GIF, a gate electrode GE and a source/drain diffusion layer DL are formed on a semiconductor substrate SS, and the surface is covered with an interlayer insulating film IIF as shown in FIGS. 29(a) through 29(d).

After the contact holes CH are formed, an n-type impurity nI is ion-implanted into the substrate on the bottom of the contact to form a high-density source/drain diffusion layer as shown in FIGS. 30(a) through 30(d). The ion implantation may be carried out as a whole, or a part of the surface of the wafer may be covered by, e.g., the photolithography, to carry out the ion implantation into only a required portion. Alternatively, different ions may be injected into the high-voltage NMOS portion and the cell array portion. Since the impurity density in the bottom portion of the contact increases by the ion implantation, it is possible to decrease the contact resistance between the polycrystalline silicon PSI filled in the contact and the substrate SS.

After the ion implantation into the bottom portion of the contact, a polycrystalline silicon is filled in the contact as shown in FIGS. 31(a) through 31(d). Thereafter, in order to activate the impurity of the high-density source/drain diffusion layer DL formed by the ion implantation, a heat treatment is carried out at a temperature of, e.g., 700 to 800° C. At this time, since the polycrystalline silicon is filled in the contact, this serves as a support to prevent the interlayer insulating film from being fluidized, so that it is possible to prevent the contact from being bent.

Then, as shown in FIGS. 32(a) through 32(d), after a contact hole CH is formed in each of the low-voltage NMOS portion and the low-voltage PMOS portion, a metal M is filled in each of the contact holes as shown in FIGS. 33(a) through 33(d). Subsequently, a metal wiring MW is formed to complete a semiconductor device shown in FIGS. 28(a) through 28(d).

(4) Fourth Preferred Embodiment

Also in the above described EEPROM, the reduction of the area of the pattern and the reduction of the number of steps are important. For example, a flash EEPROM has a memory cell array portion and a peripheral circuit portion provided around the memory cell array portion. The memory cell array portion has a plurality of NAND cell units, each of which has a plurality of non-volatile memory cells arranged in series. Each of the memory cells of the NAND cell unit is activated by a word line during access. Each of the word lines receives an output from a row decoder. The output from the row decoder is transmitted to the word line (control gate) via a contact (a cell gate contact). On the other hand, the peripheral circuit portion has peripheral transistors for carrying out various operations. The control of these peripheral transistors is carried out by transmitting a control signal via a contact (a peripheral gate contact).

Thus, the cell gate contact and the peripheral gate contact are often simultaneously formed by substantially the same process. That is, contact holes are formed in the same process to be filled with a contact material to realize the cell gate contact and the peripheral gate contact.

In this fourth preferred embodiment, even if the cell gate contact and the peripheral gate contact are simultaneously formed and even if the non-volatile memory cell has an NON film as an element, it is possible to reduce the number of steps and to reduce the area of the peripheral contact portion of the two kinds of gate contacts.

Figure 61A:
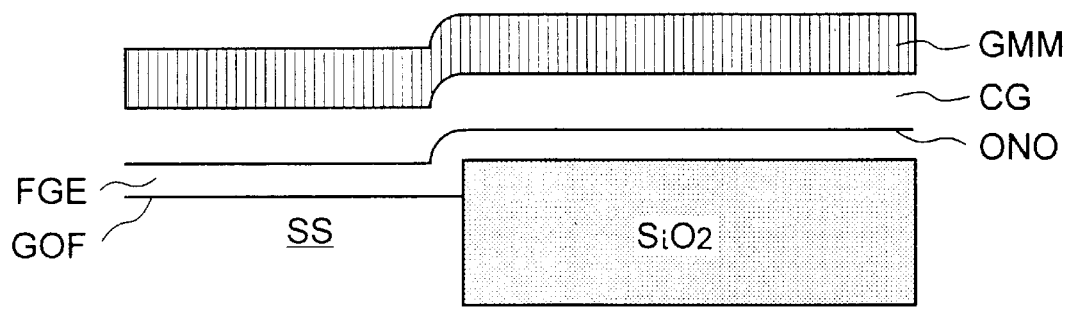
FIGS. 61(a) through 61(c) are sectional and plan views showing the fourth preferred embodiment of a producing process according to the present invention.
Figure 61B:
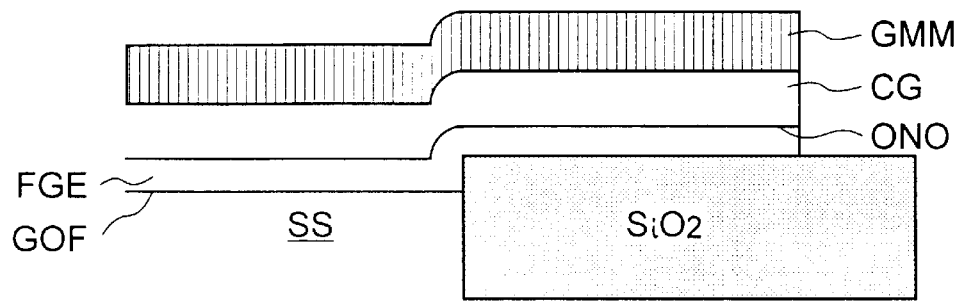
Figure 61C:
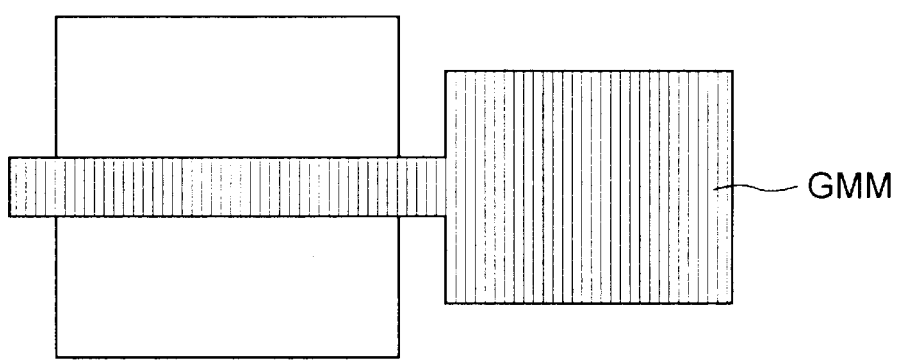
Figure 62A:
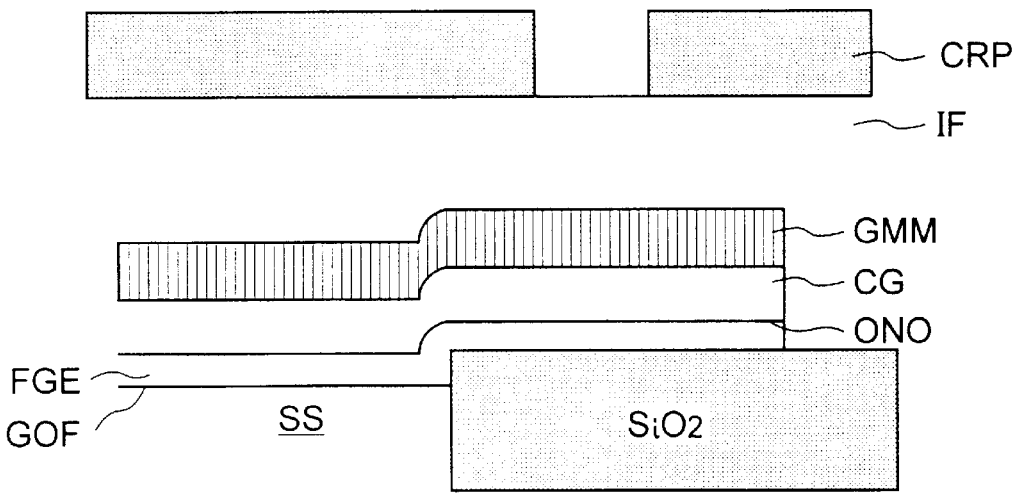
FIGS. 62(a) and 62(b) are sectional views showing the fourth preferred embodiment of a producing process according to the present invention.
Figure 62B:
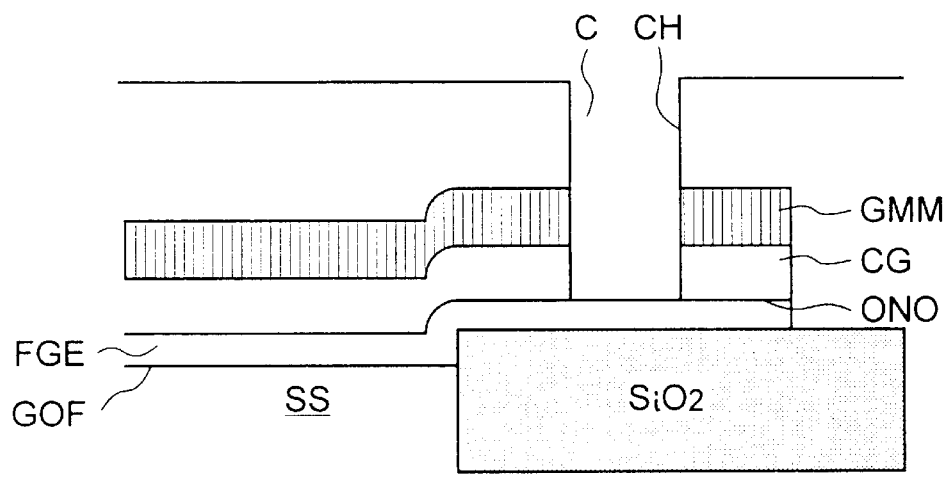
Figure 63A:
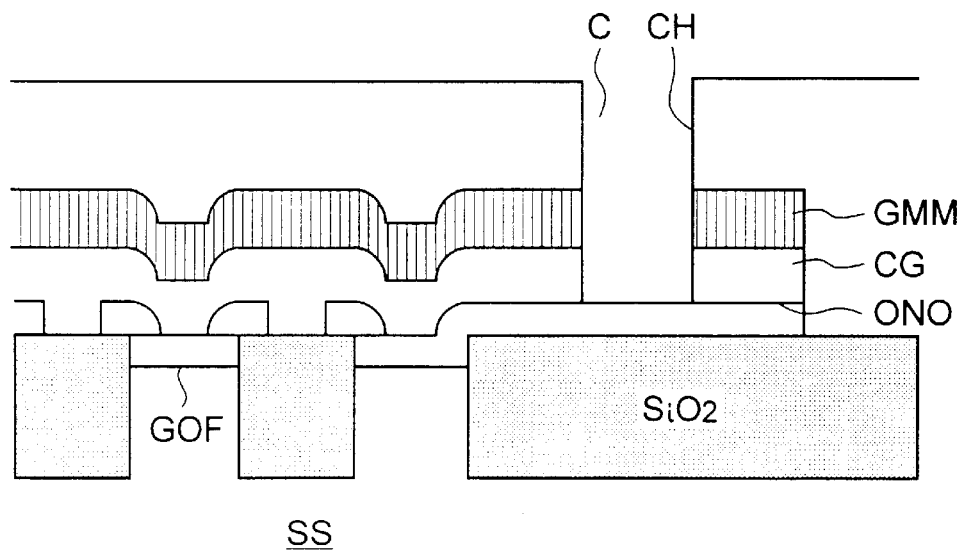
FIGS. 63(a) and 63(b) are sectional views showing the fourth preferred embodiment of a producing process according to the present invention.
Figure 63B:
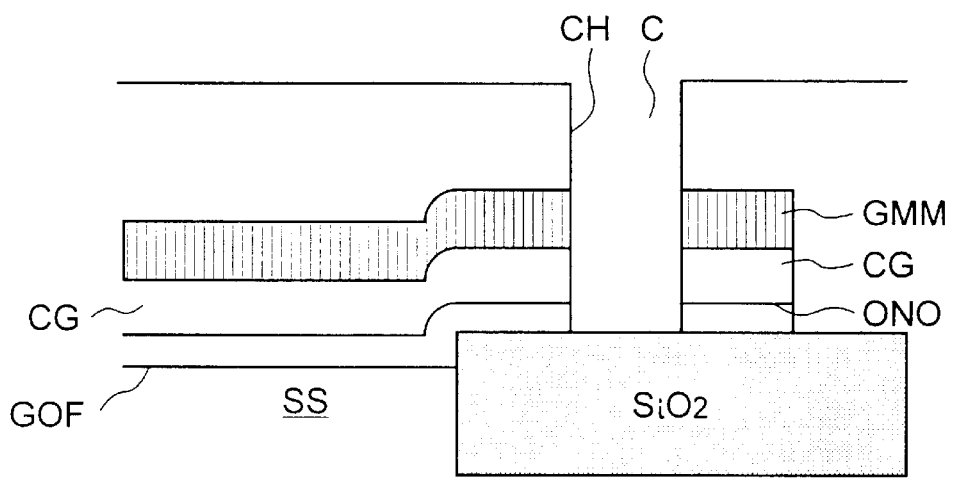

FIGS. 61(l), 61(b), 61(c) and FIGS. 62(a) and 62(b) show a peripheral gate contact. FIG. 63(b) shows its modified example, and FIG. 63(a) shows a cell gate contact. In FIG. 62(b) showing the peripheral gate contact, a contact C, to which a control signal is transmitted, is connected to a floating gate electrode FGE on the bottom thereof. In FIG. 63(b), the side of the contact C is connected to the floating gate electrode. In both cases shown in FIGS. 62(b) and 63(b), the side of the contact C is also connected to a control gate CG as a result of its structure. In addition, in FIG. 63(a) showing the cell gate contact, the side of the contact C is connected to the control gate CG. The bottom of the contact C is connected as a result of its structure.

In this preferred embodiment, such a structure is intended to be realized.

An example of a NAND type flash EEPROM shown in FIGS. 61(a) through 63(b) will be described below. This EEPROM is produced by the following process.

First, as can be seen from FIG. 61(a), a gate oxide film GOF (particularly on the left side in the figure) and a floating gate electrode FGE are formed on a silicon substrate SS. As shown on the right side in the figure, a trench is formed to be filled with an oxide film $SiO_2$. Then, a floating gate electrode FGE is formed thereon. Thus, the floating gate electrode FGE is formed as shown in the figure. More specifically, as described above, the two floating gate electrodes FGE are stacked at two steps. Then, an ONO film, a control gate CG and a gate mask material GMM are sequentially formed. This mask material GMM is used as a mask for etching a plurality of underlying layers.

Then, as can be seen from FIGS. 61(b) and 61(c), the mask material GMM is patterned to form a pattern shown in FIG. 61(c). The mask material GMM is used for etching and removing the control gate CG, the ONO film and the floating gate electrode IGE up to the surface of the oxide film $SiO_2$ in the trench.

Then, as can be seen from FIG. 62(a), an interlayer insulating film IIF is formed thereon, and a contact resist pattern CRP is formed thereon. This pattern CRP is used as a mask for etching along the hole to extend the hole up to the surface of the floating gate electrode FGE to form a contact hole CH. That is, the interlayer insulating film IIF, the gate mask material GMM, the control gate CG and the ONO film are etched along the hole C to form the contact hole CH to expose the floating gate electrode FGE. By embedding a contact therein, the contact is electrically connected to the floating gate electrode FGE.

Simultaneously with the formation of the contact hole CH shown in FIG. 62(b), a contact hole for a contact (a cell portion gate contact) on the control gate is also formed. FIG. 63(a) shows the state that the contact hole for the cell gate contact is formed. By embedding a contact in the contact hole CH, the side wall portion of the contact is electrically connected to the control gate CG. Thereafter, a flash EEPROM is completed after general processes.

Furthermore, the contact hole shown in FIG. 62(b) can be formed up to the surface portion of the underlying oxide film $SiO_2$ in the trench.

As can be seen from the foregoing, in the production of the peripheral gate contact, the gate pattern GP shown in FIG. 61(c) may be formed even under the presence of the NON film. That is, if only the contact formed portion of the pattern has a size sufficient to form the contact, the contact hole can be easily formed. That is, as shown in FIG. 62(a), since the pattern CRP is used as a mask for etching the interlayer insulating film IIF, the gate mask material GMM, the control gate CG and the ONO film without exposing the floating gate FG, the contact is aligned directly with the gate, so that it is possible to reduce the area of the pattern. In addition, as can be seen from FIG. 63(a), in the cell gate contact, the contact C contacts the floating gate FG on the side of the contact C, so that the contact hole can be etched simultaneously with the etching of the peripheral gate contact. That is, the contact hole for the peripheral gate contact and the contact hole for the cell gate contact can be formed at the same step, so that it is possible to reduce the number of steps.

(5) Fifth Preferred Embodiment

In this preferred embodiment, there is shown an example of a flash EEPROM which can reduce the area of a contact region of a select gate electrode.

This preferred embodiment will be briefly described below.

In a non-volatile semiconductor memory having a double-layer gate structure, a contact for a select gate electrode is formed of a polysilicon so that it is not necessary to consider an alignment shift between the contact and the contact region of the select gate electrode. Thus, it is possible to reduce the area of the contact region of the select gate electrode. In this case, if the contact is formed simultaneously with contacts for connecting the source of a memory cell to a source line, and the drain thereof to a bit line, respectively, it is possible to obtain the above described effects without increasing the number of steps. In addition, by forming the contact of the polysilicon, a part of the contact projects from the contact region of the select gate electrode. Therefore, it is possible to reduce the area of the contact region of the select gate electrode regardless of the area of the contact.

Referring to the accompanying drawings, this preferred embodiment will be described below.

Figure 64:
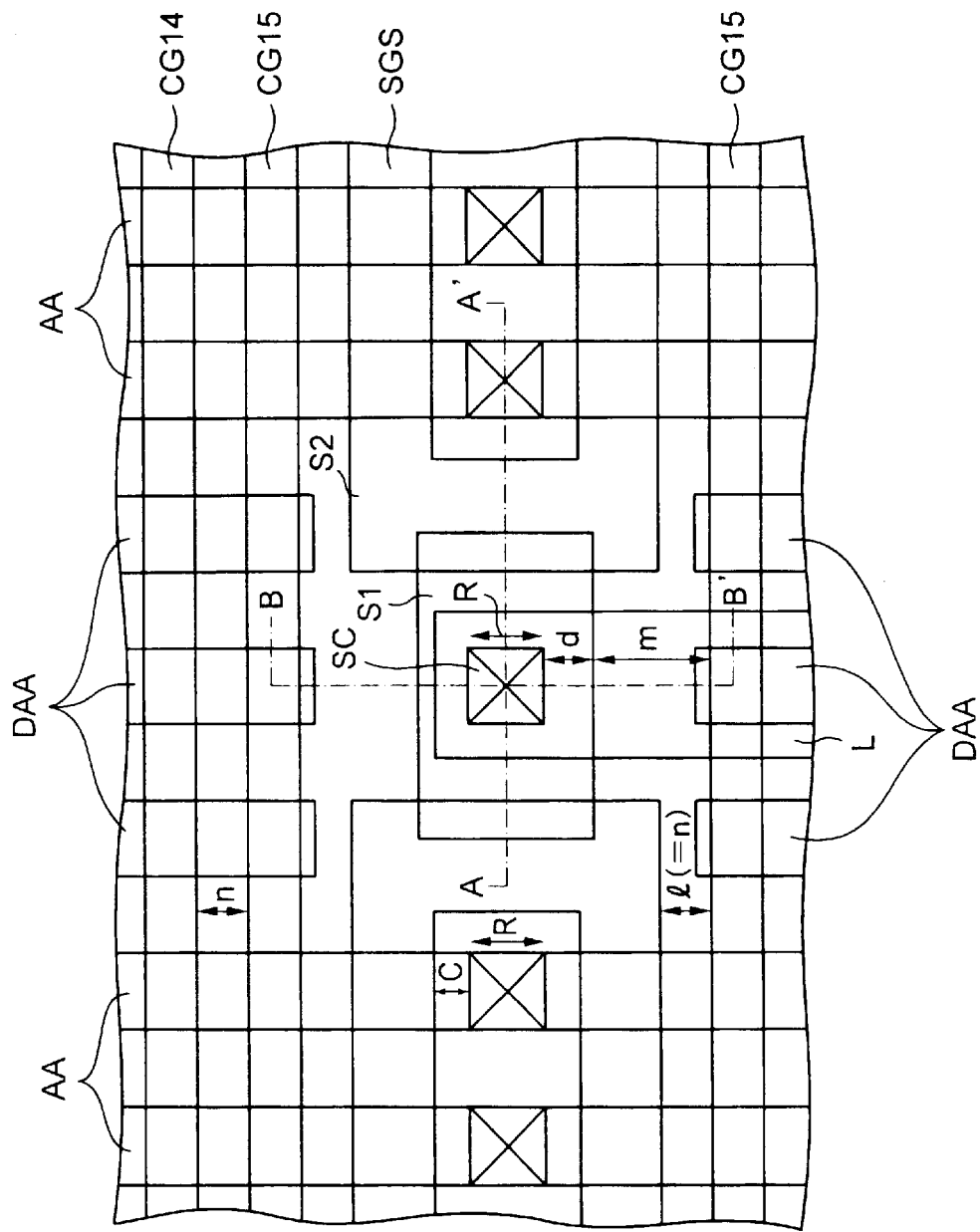
FIG. 64 is a plan view of the first preferred embodiment of a NAND type EEPROM according to the present invention.

FIG. 64 shows a plane pattern of the contact region of the gate electrode of a source-side select gate transistor of the fifth preferred embodiment of a NAND type flash EEPROM according to the present invention. In FIG. 64, AA denotes an activated region, DAA denotes a dummy activated region, and L denotes a wiring. In addition, FIG. 65 is a sectional view taken along line A—A' of FIG. 64, and FIG. 66 is a sectional view taken along line B—B' of FIG. 64.

Figure 65:
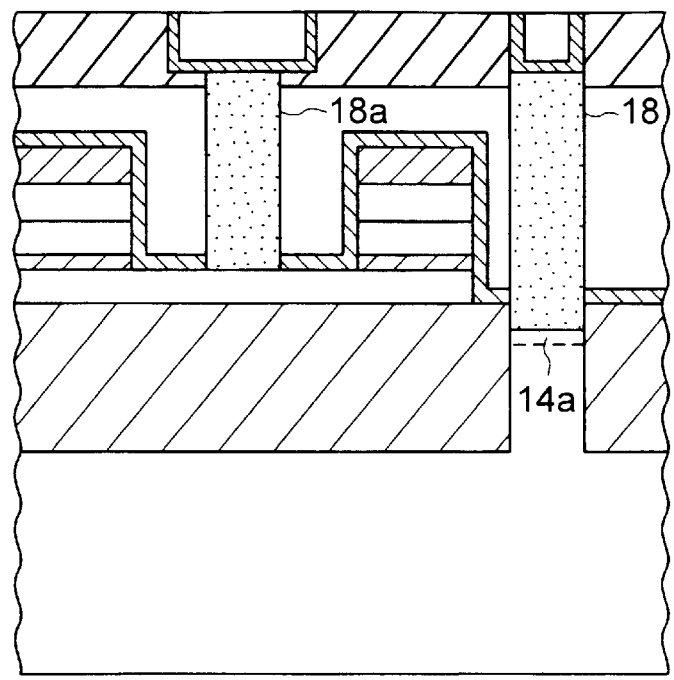
FIG. 65 is a sectional view taken along line A—A' of FIG. 64.
Figure 66:
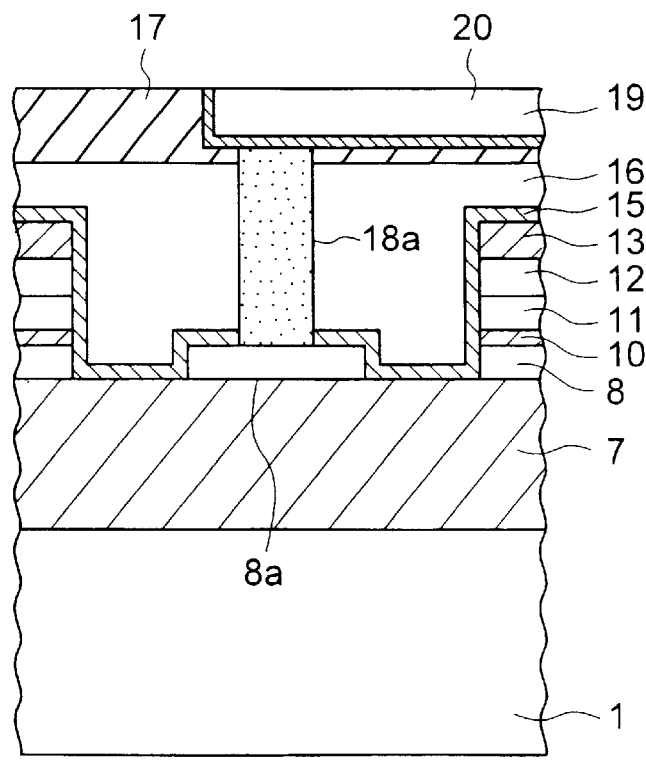
FIG. 66 is a sectional view taken along line B—B' of FIG. 64.

In FIGS. 65 and 66, an element isolating film 7 having a shallow trench isolation (STI) structure is formed on a silicon substrate 1, and a NAND cell unit comprising, e.g., 16 memory cells and two select gate transistors, is arranged in an element region surrounded by the element isolating film 7.

Each of the memory cells has a floating gate electrode FGE, a control gate electrode CGE and an n-type diffusion layer. The floating gate electrode FGE is formed of a polysilicon 8, and the control gate electrode CGE is formed of a polysilicon 11 and a tungsten silicide film 12. The select gate transistor contacts a gate electrode 8a, which is formed of the same polysilicon 8 as the floating gate electrode layer of the memory cell, to function as a transistor. The contact with the select gate electrode is formed simultaneously with the contact with a diffusion layer 14a, and formed of a polysilicon 18a.

Figure 67:
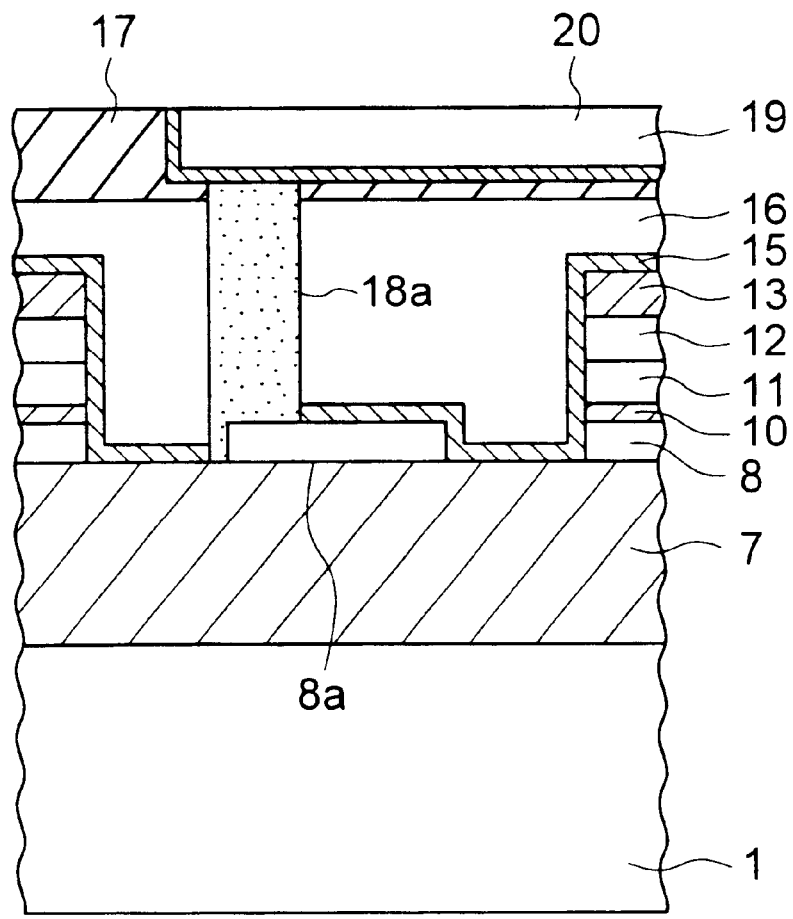
FIG. 67 is a sectional view taken along line B—B' of FIG. 64.

Thus, if the contact with the select gate electrode is formed of the polysilicon, even if the pattern of a contact hole projects from the contact region of the gate electrode, the polysilicon is completely filled in the contact hole, so that the select gate electrode can be electrically connected to the wiring of the upper layer. FIG. 67 shows a sectional view taken along line B—B' of FIG. 64 when an alignment shift is caused. Therefore, the area of the contact region of the select gate electrode can be decreased regardless of the alignment shift between the PEP of the contact region and the PEP of the contact.

Specifically, as shown in FIG. 64, it is assumed that the alignment shift between the contact region S1 of the select gate electrode SGS and the double-layer gate pattern S2 of the select gate electrode is a, the alignment shift between the contact hole SC and S1 is b, the alignment shift between SC and S2 is c (the alignment shift between the contact hole to the diffusion layer and S2 is also c), the gate length of the select gate electrode is g, the minimum width, at which working can be carried out by the photolithography, is n, the distance between S1 and the control gate electrode is m, and the diameter of the contact holes to the gate electrode and diffusion layer is R. Then, in order to electrically separate S1 from the control gate electrode, m must be (a+n) or higher. The minimum value of the distance between CG15 and CG15 facing each other via the contact region S1 is (2m+R) since it is not required to consider the alignment margin between SC and S1 (the distance d between the outer periphery of S1 and SC may be smaller than b) in the contact region of the select gate electrode. On the other hand, in the contact region to the diffusion layer, it is (2n+2g+2c+R). Since (2m+R) is usually smaller than (2n+2g+2c+R), the distance l between the select gate electrode SGS and the contact gate electrode CG15 can be n. Therefore, the distance between CG15 and CG15 facing each other via the contact region S1 can be small regardless of the limitations due to the area of the gate contact region, so that the area of the cell array region can be small.

Figure 68:
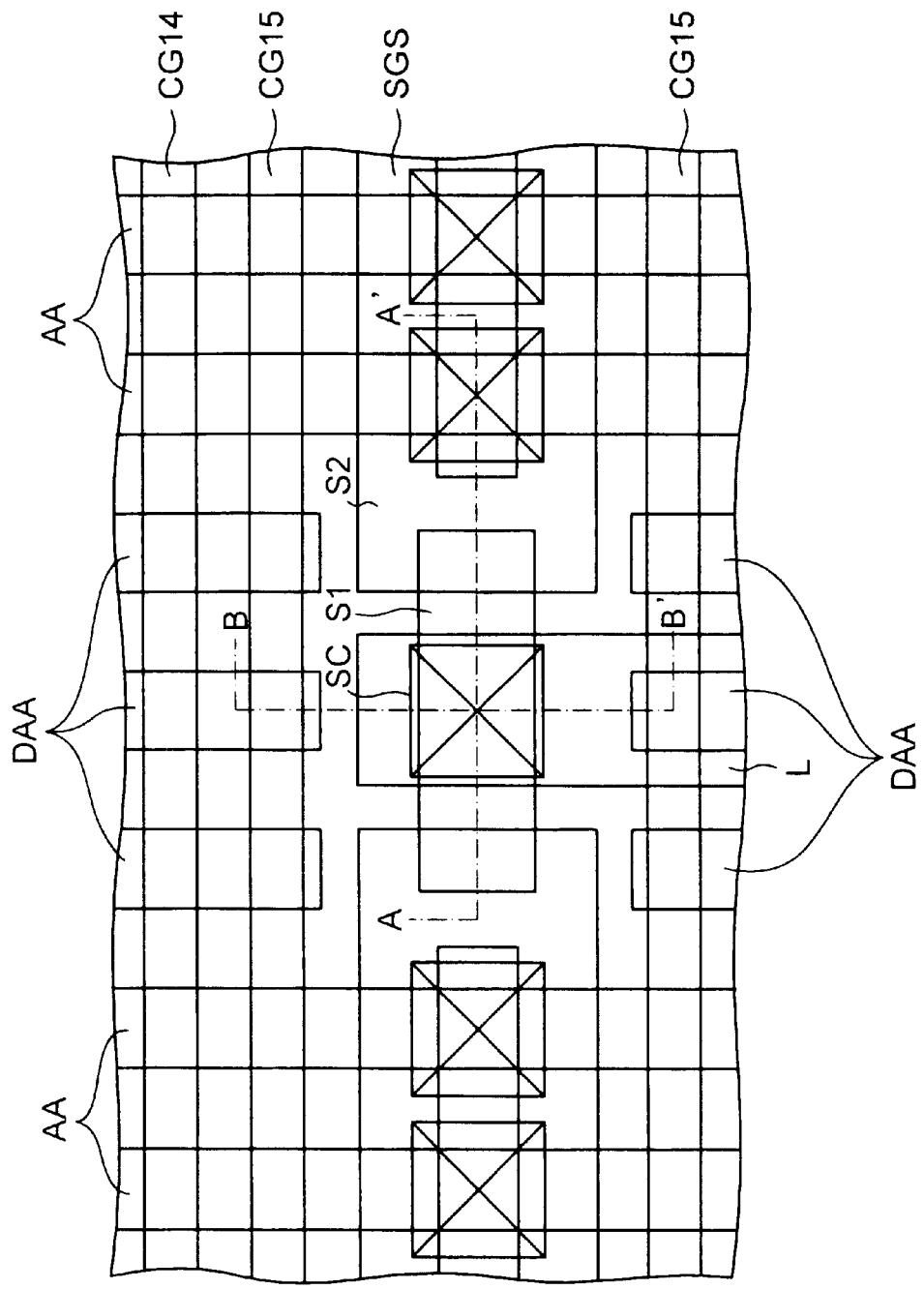
FIG. 68 is a plan view of the second preferred embodiment of a semiconductor integrated circuit device according to the present invention.
Figure 69:
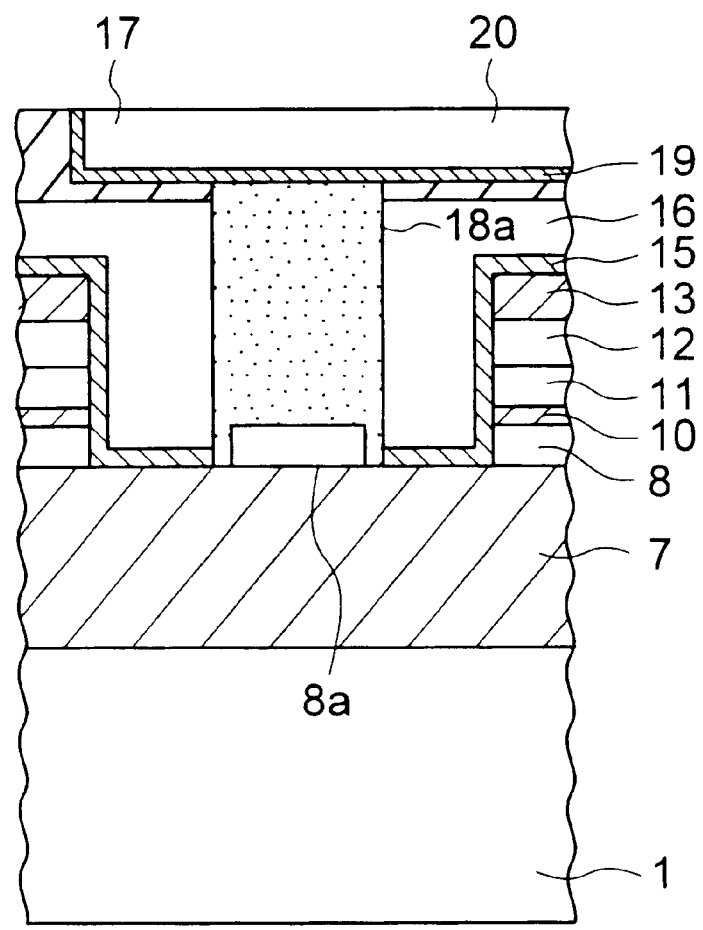
FIG. 69 is a sectional view taken along line B—B' of FIG. 65.

FIG. 68 shows a plane pattern of a contact region of a gate electrode of a source-side select gate transistor in a modified example of the fifth preferred embodiment of a NAND type flash EEPROM according to the present invention. A sectional view taken along line A—A' of FIG. 68 is the same as FIG. 65, and a sectional view taken along line B—B' of FIG. 65 is shown in FIG. 69.

With the scale down of elements, it is being difficult to form contacts arranged at small intervals, such as bit line contacts and source line contacts in the memory cell array. In order to solve this problem, there is a method for increasing the size of a contact PEP as shown in FIG. 68. By increasing the size of the contact PEP, the length of a side of the contact is sometimes greater than the length of the contact region S1 of the select gate electrode in column directions. In this case, as shown in FIG. 69, the polysilicon 18a constituting the contact with the select gate electrode is completely embedded in the contact hole, so that the select gate electrode 8a can be electrically connected to the wiring layer comprising a barrier metal 19 and a tungsten 20. That is, even if the size of the contact hole is increased, the area of the contact region of the select gate electrode can be decreased.

Furthermore, FIG. 68 shows a case where the length of the contact in column directions is determined by the distance between the select gate electrodes. However, the present invention should not be limited to a self-align contact.

A method for producing a memory cell array portion of the above described NAND type flash EEPROM will be described below.

Figure 70:
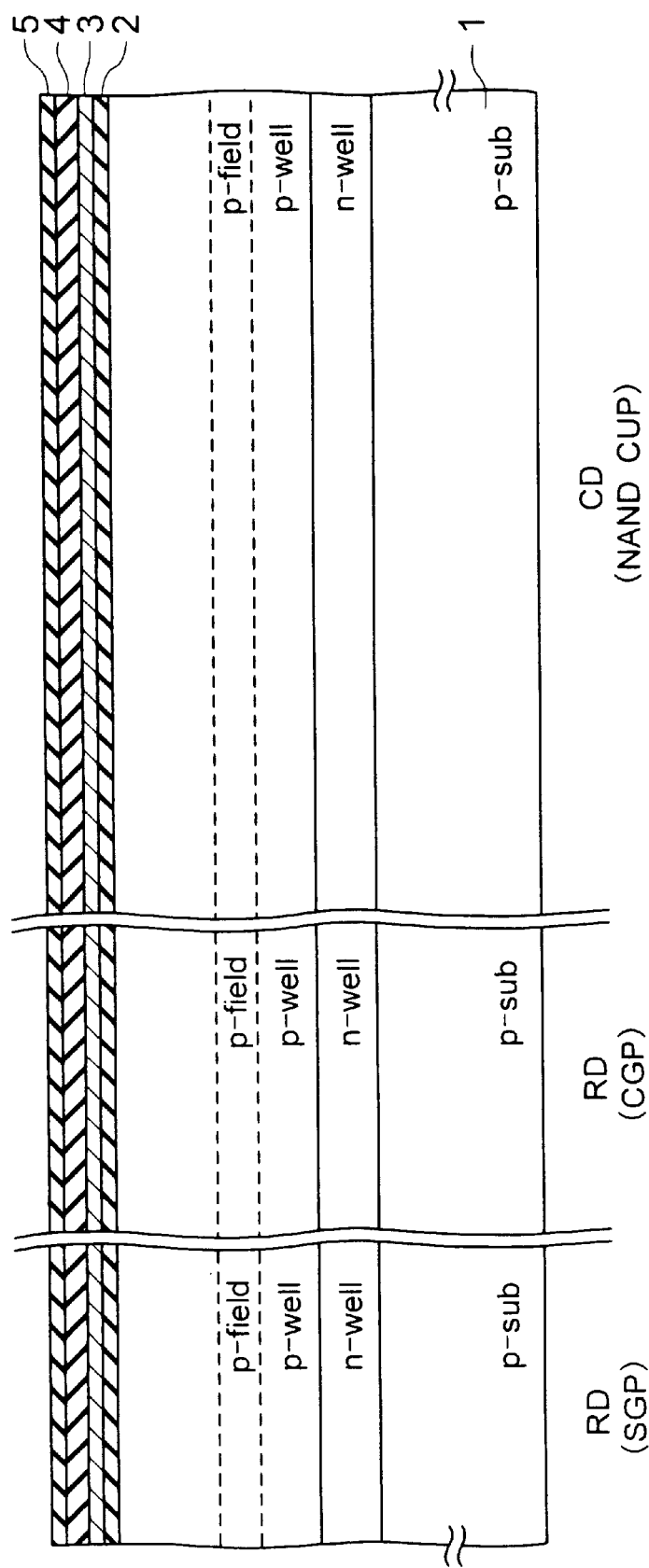
FIG. 70 is a sectional view showing a step of a method for producing an EEPROM according to the present invention.

In FIG. 70, RD denotes a row direction, CD denotes a column direction, SGP denotes a select gate portion, CGP denotes a control gate portion, and NANDUP denotes a NAND cell portion. First, as shown in FIG. 70, a dummy oxide film (not shown) is formed on a silicon substrate 1 by the thermal oxidation. Then, an n-type well preparing mask and a p-type well forming mask are used for forming an n-type well region, a p-type well region and a p-field region in the p-type well region, by the ion implantation. Thereafter, the dummy oxide film is removed, and a silicon oxide film 2, which is to be a gate insulating film, is formed on the silicon substrate 1 by the thermal oxidation to form a polysilicon film 3 containing an n-type impurity on the silicon oxide film 2. Thereafter, a silicon nitride film 4 is formed on the polysilicon film, and a silicon oxide film 5 is formed on the silicon nitride film 4.

Figure 71:
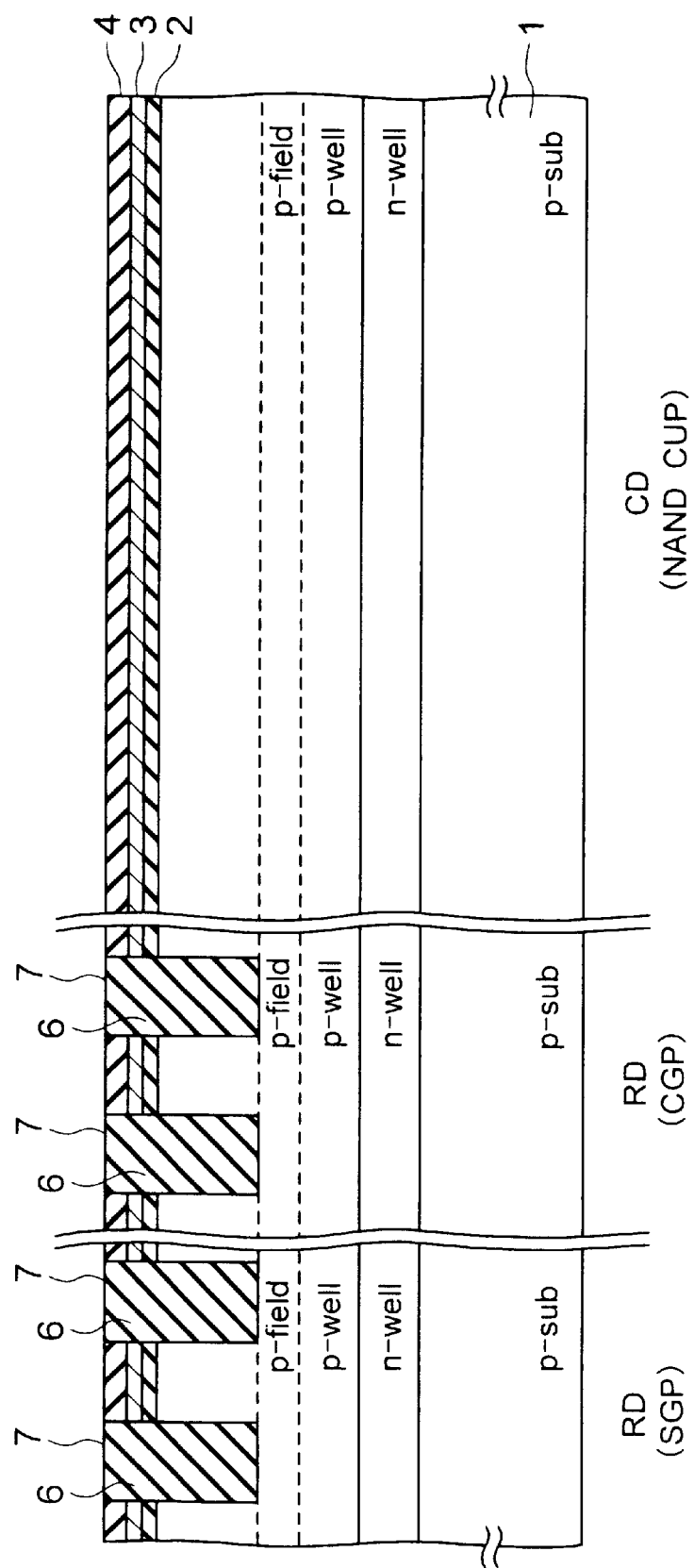
FIG. 71 is a sectional view showing a step of a method for producing an EEPROM according to the present invention.

Then, as can be seen from FIG. 71, a resist pattern is formed by the PEP, and the silicon oxide film 5 is etched by the RIE method. Moreover, after the silicon oxide film 5 is used as a mask to etch the silicon nitride film 4 by the RIE, the silicon oxide film 5 is removed. Thereafter, the silicon nitride film 4 is used as a mask to sequentially etch the polysilicon film 3, the silicon oxide film 2 and the silicon substrate 1 to form a trench 6, the bottom of which reaches the p-field region of the silicon substrate 1. Thereafter, a TEOS film 7 is formed on the silicon nitride film 4 so as to be sufficiently filled in the trench 6, and the CMP leaves the TEOS film 7 only in the trench 6 to complete an STI structure. At this time, the level of the surface of the TEOS film 7 is lower than the level of the surface of the silicon nitride film 4. Thereafter, the silicon nitride film 4 is removed.

Figure 72:
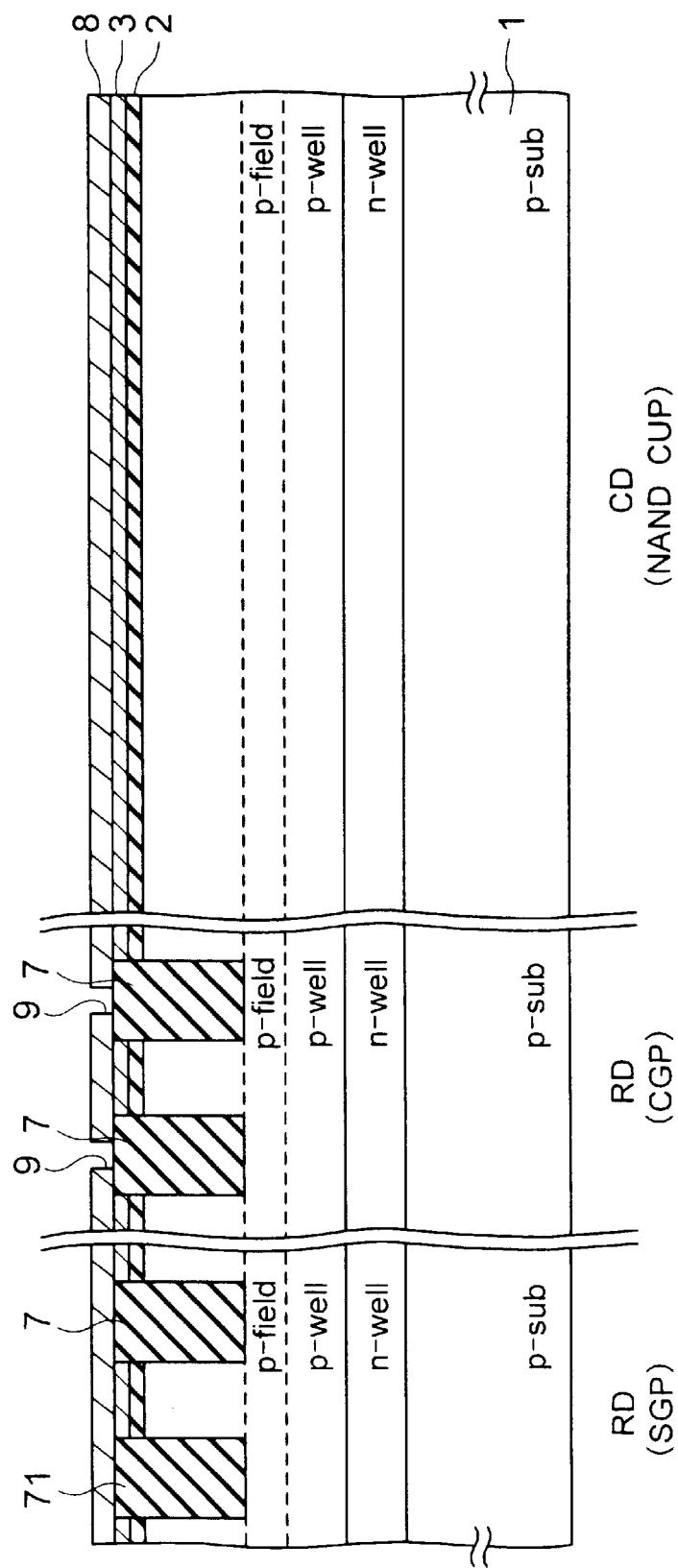
FIG. 72 is a sectional view showing a step of a method for producing an EEPROM according to the present invention.

Then, as shown in FIG. 72, a polysilicon film 8 containing an n-type impurity is formed. A silicon nitride film (not shown) is formed on the polysilicon film 8, and the silicon nitride film is patterned to be etched by the RIE. This silicon nitride film is used as a mask to etch the polysilicon film 8 by the RIE to form a slit 9. Thereafter, the silicon nitride film is removed.

Figure 73:
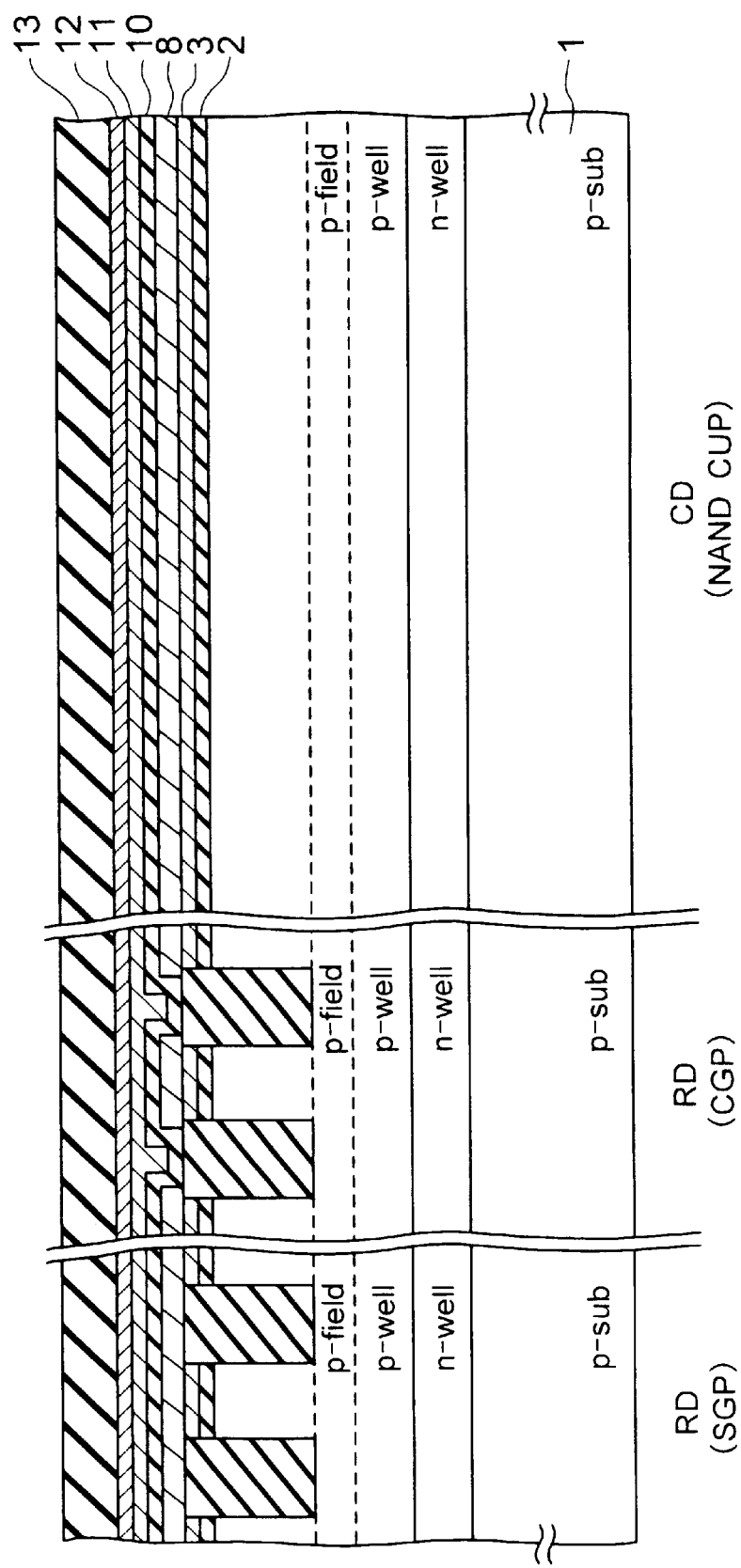
FIG. 73 is a sectional view showing a step of a method for producing an EEPROM according to the present invention.

Then, as shown in FIG. 73, an insulating film 10 comprising, e.g., a silicon oxide film, a silicon nitride film and a silicon oxide film (a so-called ONO film), is formed on the polysilicon film 8, and a polysilicon film 11 containing an n-type impurity is formed on the insulating film 10. Moreover, a tungsten silicide (WSi) film 12 is formed on the polysilicide film 11, and a silicon oxide film 13 is formed on the tungsten silicide film 12.

Figure 74:
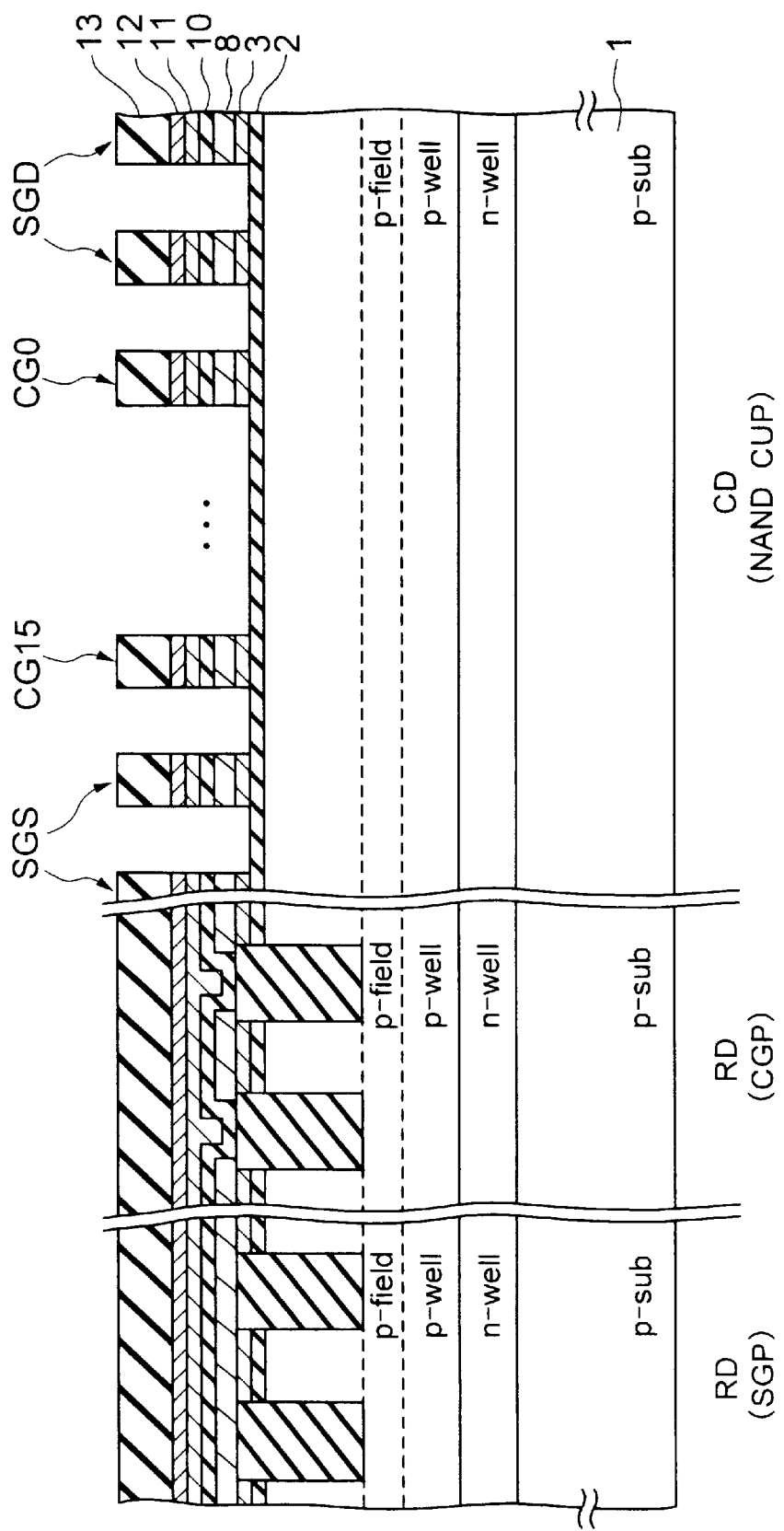
FIG. 74 is a sectional view showing a step of a method for producing an EEPROM according to the present invention.
Figure 77:
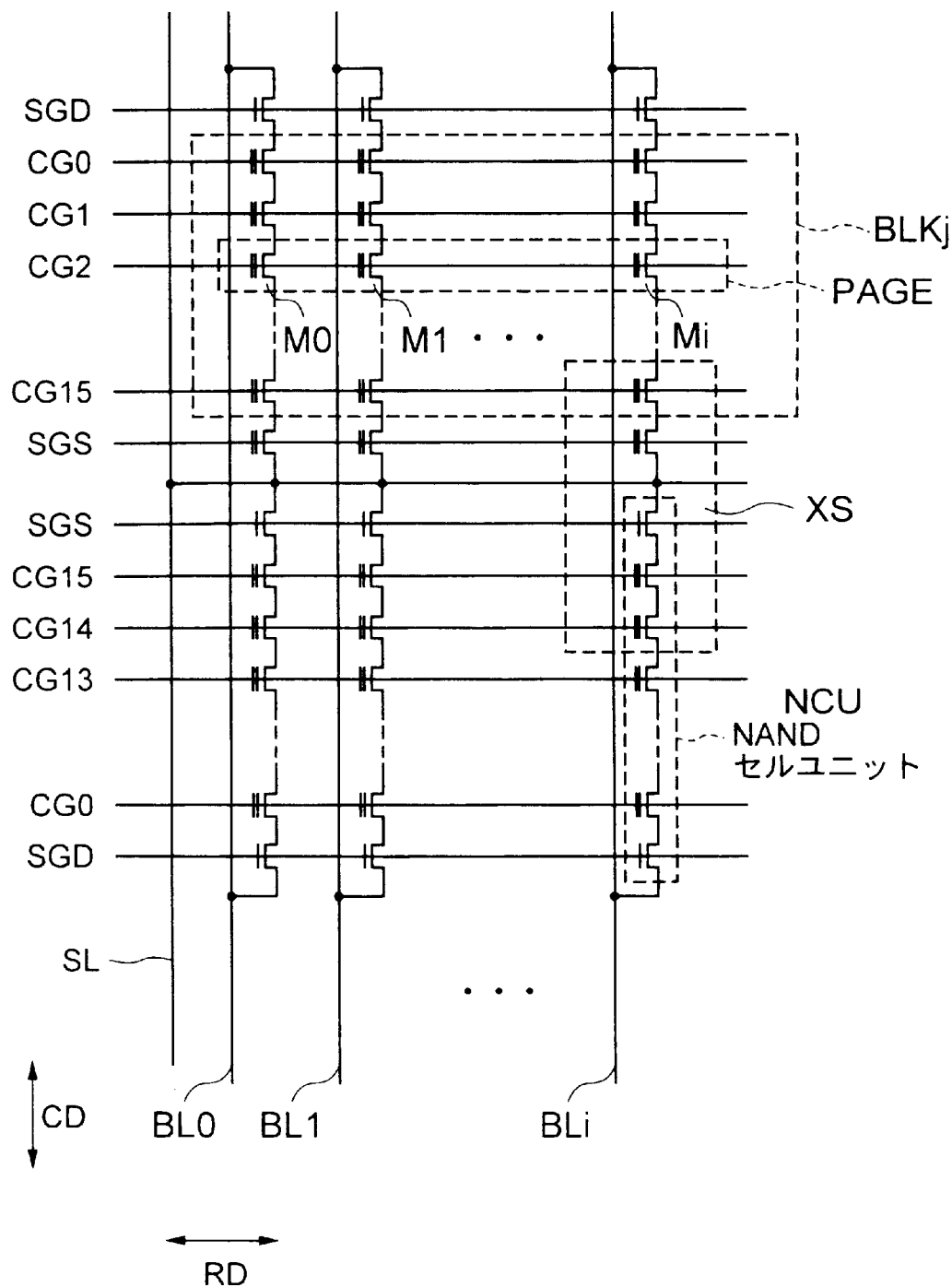
FIG. 77 is a circuit diagram showing the construction of a memory cell array part of a NAND type EEPROM.
Figure 78:
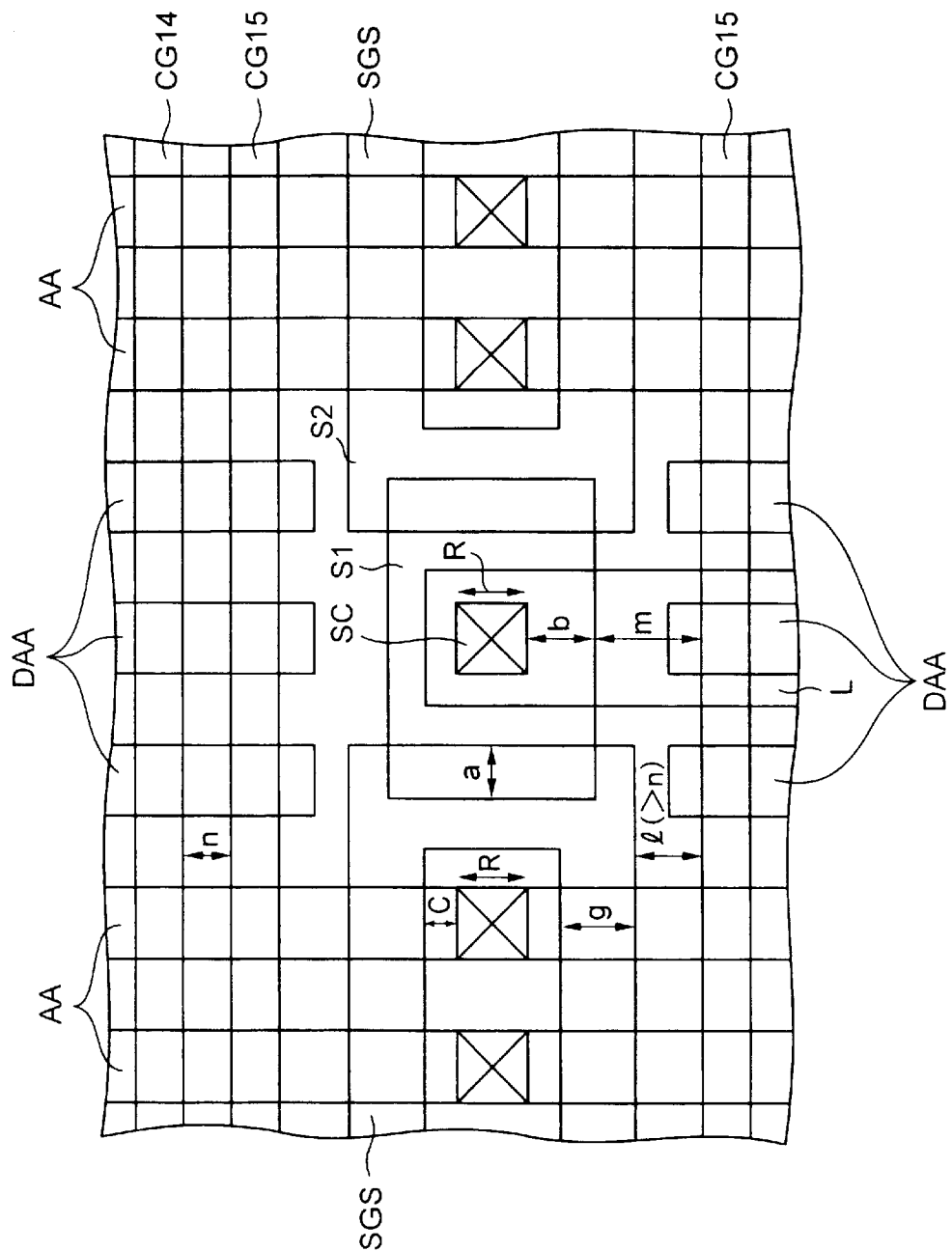
FIG. 78 is a plan view of a conventional NAND type EEPROM.

Then, as shown in FIG. 74, a resist pattern is formed by the PEP, and the resist pattern is used as a mask for etching the silicon oxide film 13 by the RIE. Moreover, the silicon oxide film 13 is used as a mask for sequentially etching the tungsten silicide film 12, the polysilicon film 11 and the insulating film 10. Thereafter, a region (S1 in FIG. 64) for contacting a select gate electrode is patterned by the PEP, and the resist pattern and the silicon oxide film 13 are used as masks for etching the polysilicon films 8 and 3. Thus, a gate electrode of a memory cell comprising select gate electrodes SGS and SGD, a control gate electrode CG and a floating gate electrode FG is completed as shown in FIG. 77. Thereafter, the resist pattern is removed.

Figure 75:
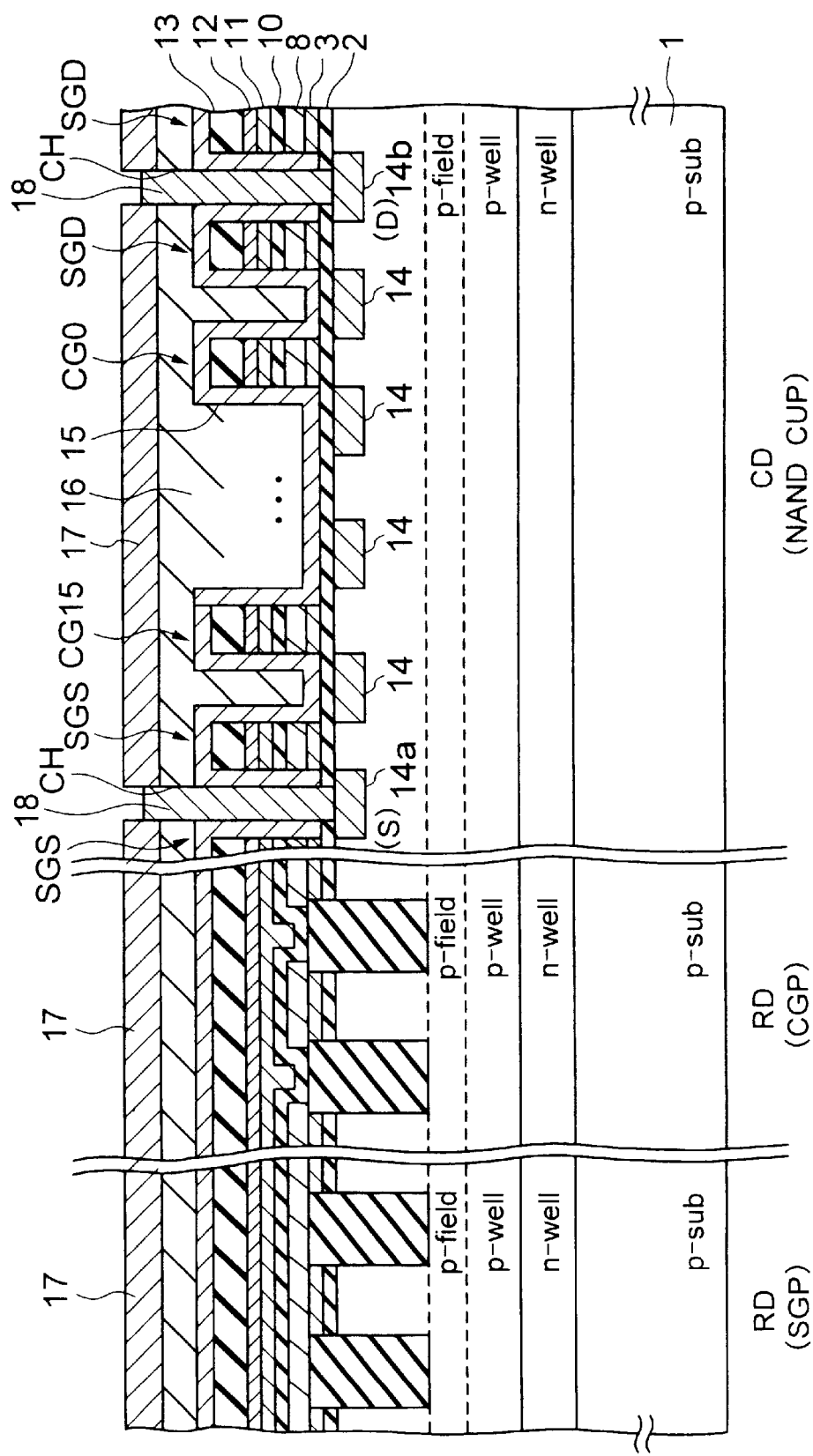
FIG. 75 is a sectional view showing a step of a method for producing an EEPROM according to the present invention.

Then, as shown in FIG. 75, the silicon oxide film 13 (the control gate electrode and the select gate electrode) is used as a mask for ion-implanting an n-type impurity into the p-type well region by the self-alignment to form n-type diffusion layers 14, 14a and 14b. Furthermore, the diffusion layer 14a serves as the source of the NAND cell unit, and the diffusion layer 14b serves as the drain of the NAND cell unit. Thereafter, a silicon nitride film 15 is formed on the side walls of CG0 through CG15, SGS, SGD and FG, and a BPSG film 16 is formed on the silicon nitride film 15. Then, after flattening is carried out by the CMP, a TEOS film 17 is formed on the BPSG film 16. Thereafter, a resist pattern is formed by the PEP, and the resist pattern is used as a mask for etching the TEOS film 17, the BPSG film 16, the silicon nitride film 15 and the silicon oxide film 2 by the RIE to form contact holes CH reaching the diffusion layers 14a and 14b. Simultaneously, the TEOS film 17, the BPSG film 16 and the silicon nitride film 15 are etched to form a contact hole reaching the select gate electrode (S1 in FIG. 64). Thereafter, a polysilicon 18 containing an n-type impurity is deposited in the contact hole CG, to form a structure the polysilicon 18 is filled only in the contact hole CH, by the CDE.

Figure 76:
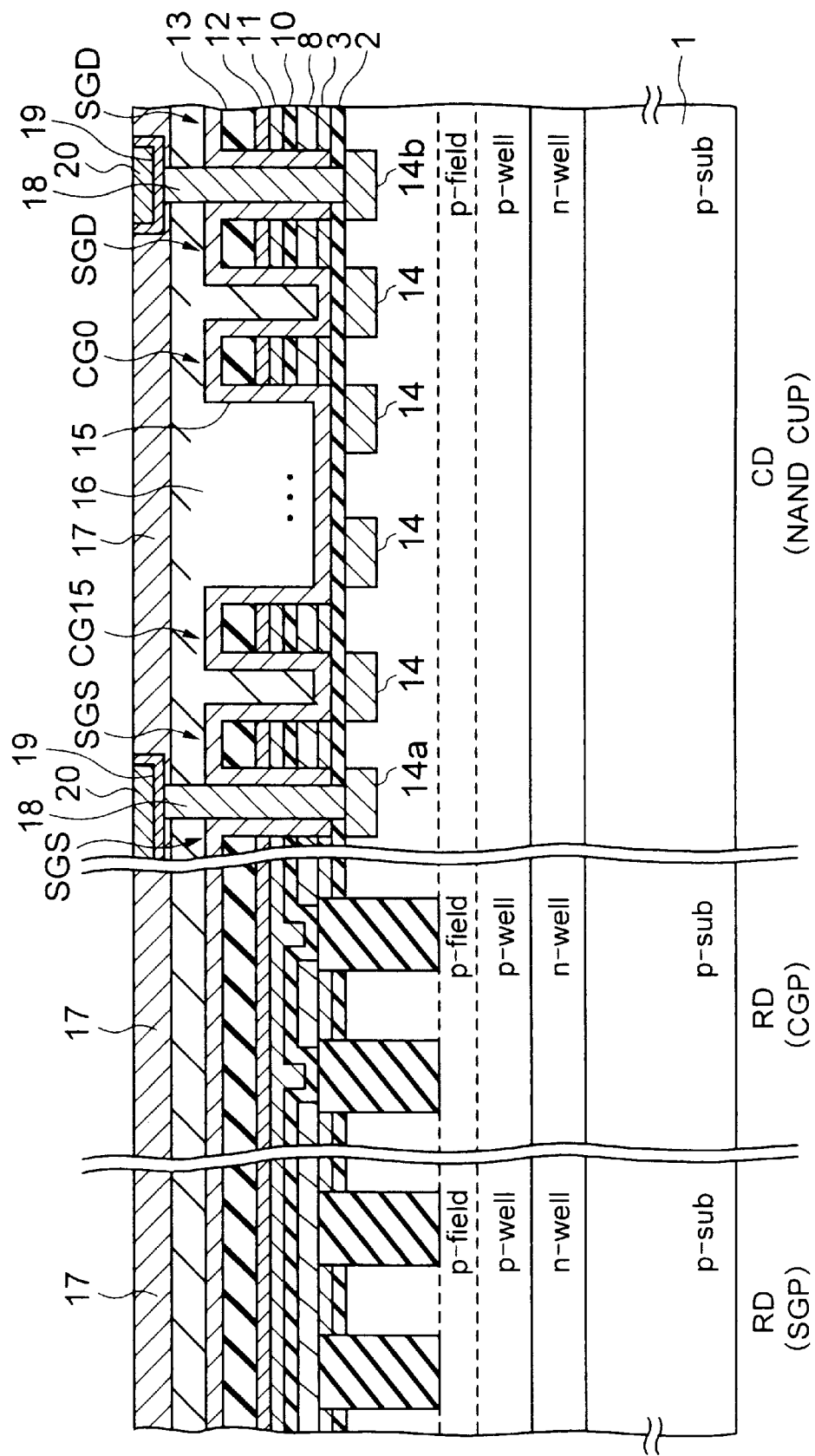
FIG. 76 is a sectional view showing a step of a method for producing an EEPROM according to the present invention.

Then as shown in FIG. 76, a resist pattern is formed by the PEP, and a resist pattern is used as a mask for etching the TEOS film 17 by the RIE to form a wiring groove. Thereafter, a barrier metal 19 of a stacked layer of, e.g., titanium and titanium nitride, is formed on the inner surface of the wiring groove. Moreover, a tungsten film 20 completely embedded in the wiring groove is formed to be polished by the CMP to be left only in the wiring groove.

Thereafter, the upper wiring layer is formed using a well-known method to complete a NAND type flash EEPROM.

As described above, according to the present invention, it is possible to prevent the contact from being bend, and it is possible to prevent failure from being caused by the bending of the contact. In addition, it is possible to omit the step of re-injecting ions after forming the contact hole, and the lithography step necessary therefor, so that it is possible to greatly reduce the costs necessary for the process. Moreover, it is possible to reduce the size of the high-voltage circuit portion without lowering the withstand voltage.

Moreover, according to the present invention, in an EEPROM equipped with a non-volatile memory cell having an NON film as an element, it is possible to reduce the number of steps and the area of the contact portion of a peripheral gate contact while the peripheral gate contact and a cell gate contact are simultaneously formed.

Moreover, according to the present invention, in a non-volatile semiconductor memory having a double-layer gate structure, the contact with a select gate electrode is formed of a polysilicon, so that it is not require to consider the alignment shift between the contact and the contact region of the select gate electrode. Therefore, it is possible to reduce the area of the contact electrode of the select gate electrode. The contact can be formed simultaneously with the contacts for connecting the source and drain of the memory cell to the source line and bit line, respectively, so that it is possible to obtain the above described effects without increasing the number of steps.

In addition, since the contact is formed of a polysilicon, a part of the contact projects from the contact region of the select gate electrode. Therefore, it is possible to reduce the area of the contact region of the select gate electrode regardless of the area of the contact. This structure is particularly effective when the size of the pattern of the contact must be increased by the limitations of the photolithography.

Figure 83:
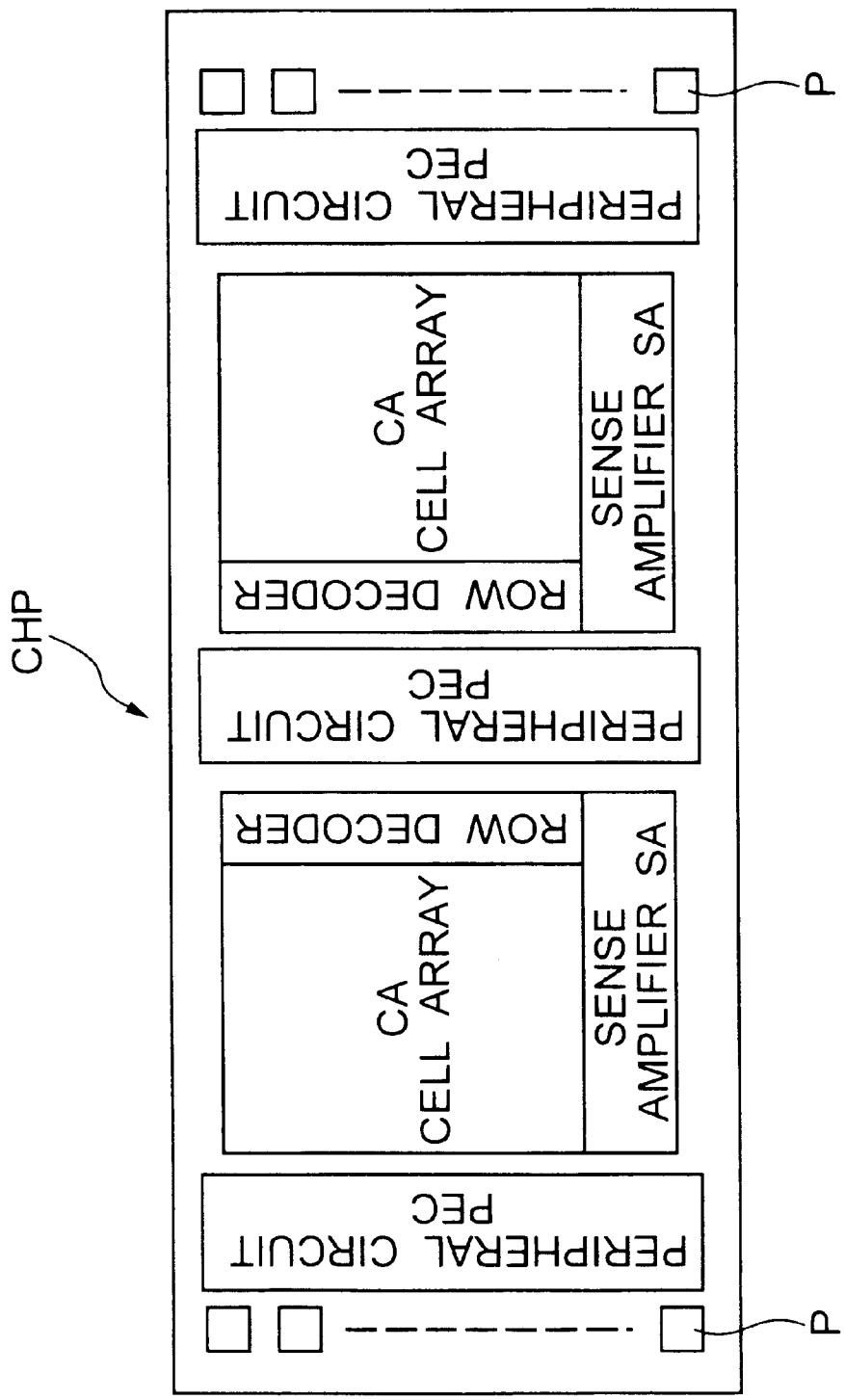
FIG. 83 is a schematic view showing the whole construction of a semiconductor device (chip), to which the present invention is applied.
Figure 84A:
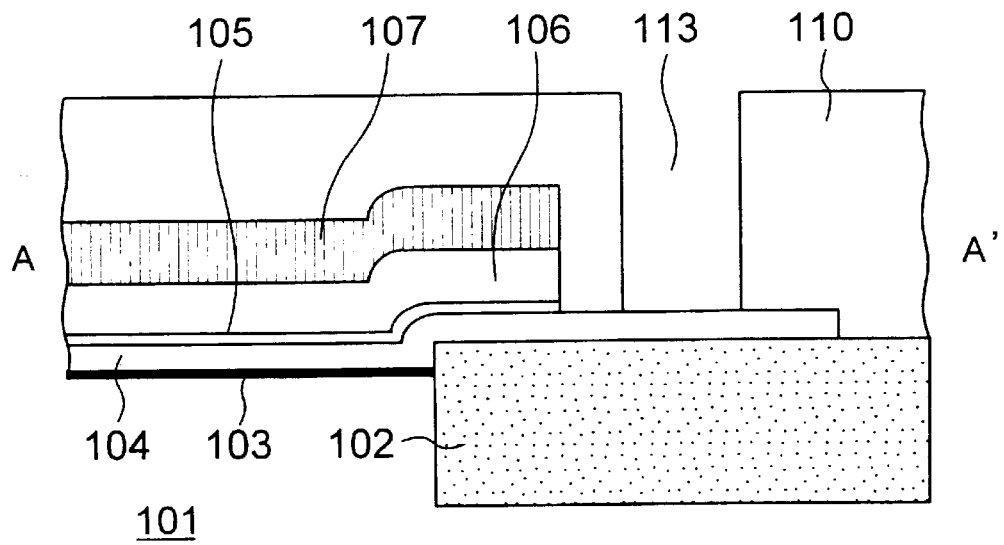
FIGS. 84(a) and 84(b) are sectional and plan views showing a producing process in a first related art.
Figure 84B:
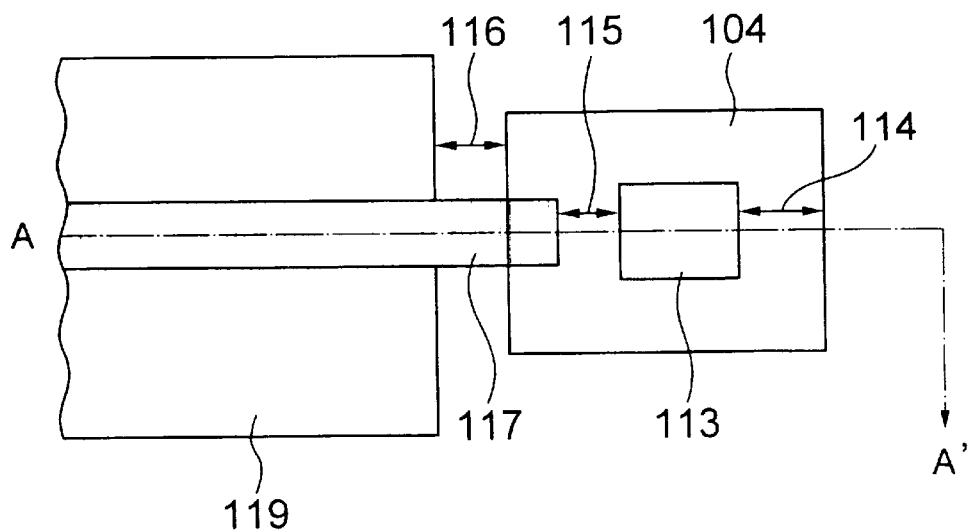

FIG. 83 is a schematic view showing the whole construction of a semiconductor device (chip), to which the present invention is applied. Since the whole construction itself of this chip CHP is well know, the detailed description thereof is omitted, but it will be briefly described as follows. That is, a pair of cell arrays CA are formed on the right and left sides of substantially the center. Peripheral circuits PEC are provided between the cell arrays CA and outside thereof. Pads P are formed outside of the outside peripheral circuits PEC. Thus, various circuits and circuit elements are formed in the region of the peripheral circuits PEC. As one of the circuit elements, a high resistive element in this preferred embodiment is formed in the region of the peripheral circuits PEC.

An example of this high resistive element will be described as the sixth and seventh preferred embodiment when it is formed as a peripheral circuit of a NAND type flash memory device having a double-layer gate electrode type transistor.

(6) Sixth Preferred Embodiment

In the sixth preferred embodiment, there is shown a first example wherein a higher resistance, lower polysilicon film (FG) of a double-layer gate, i.e., two films of a lower polysilicon film for floating gate and an upper polycide film for control gate, is used for preparing a high resistive element around the above described double-layer gate electrode type transistor array.

First, referring to FIGS. 79(a) through 81, a producing process will be described before describing the structure of the device.

Figure 79A:
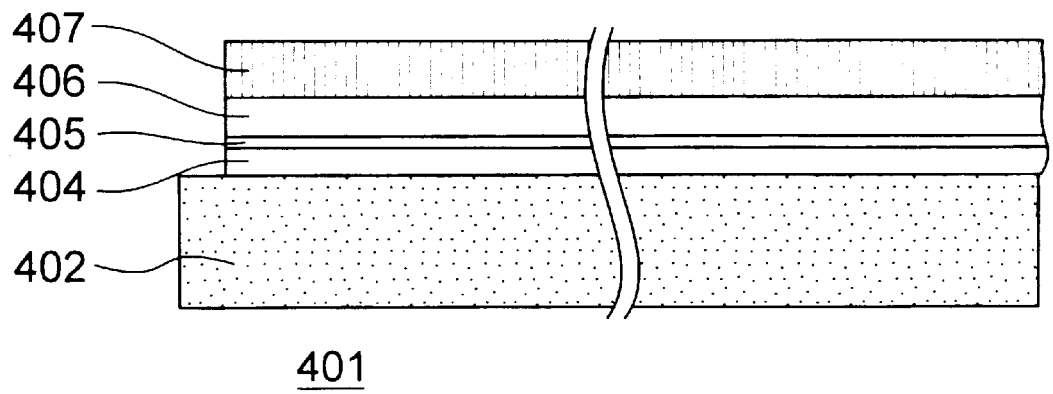
FIGS. 79(a) and 79(b) are sectional views showing a part of the first preferred embodiment of a producing process according to the present invention.
Figure 79B:
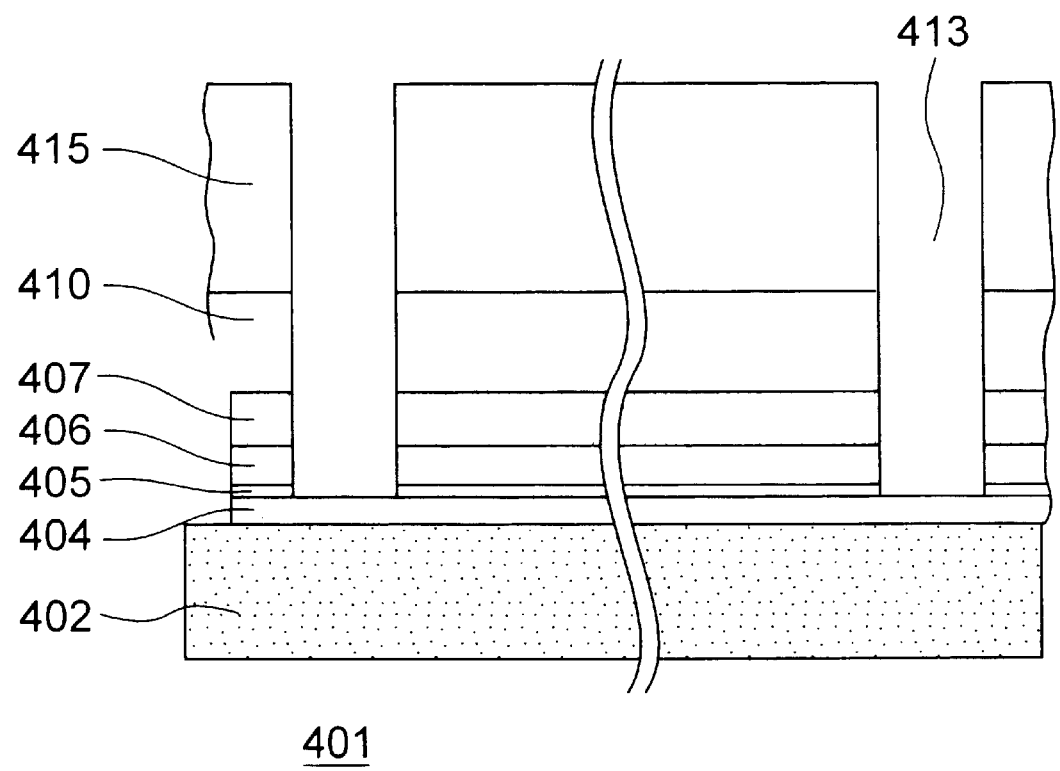

As can be seen from FIG. 79(a), a silicon oxide film 402 serving as an element isolating film is formed on a p-type silicon substrate 401 in the peripheral circuit portion. On the film 402, an N-type polysilicon film 404 serving as a floating gate of a memory cell transistor is formed so as to have a thickness of 200 nm. On this film 404, a composite film of three films, i.e., a silicon oxide film (10 nm), a silicon nitride film (15 nm) and a silicon oxide film (5 nm), is formed as an insulating film 405. On this film 405, a polycide film 406 of an N-type polysilicon film and a WS1 film is formed so as to have a thickness of 400 nm. Then, after a silicon nitride film 407 is formed so as to have a thickness of 200 nm, this film 407 is etched so as to have a pattern a desired gate electrode wiring layer and resistive element to prepare a mask. This mask is used for etching the polycide film 406, the insulating film 405 and the N-type polysilicon film 404.

Then, as can be seen from 79(b), after well known steps, such as a diffusion layer forming step and a post-oxidation forming step, which are necessary to form a memory transistor and a peripheral transistor, are carried out, a BPSG film 410 serving as a protective coat is formed so as to have a thickness of 500 nm. Then, a resist 415 is deposited to be patterned so as to have a desired contact hole intended pattern to prepare a mask. This mask is used for etching the BPSG film 410, the silicon nitride film 407, the polycide film 406 and the insulating film 405 to form a contact hole 413. At this time, with respect to the interior of the contact hole 413, the side wall of the polycide film 406 is exposed, and the surface of the N-type polysilicon 404 is exposed. This N-type polysilicon 404 is intended to be used as the material of a high resistive element. Although a step of forming the contact hole 413 is not shown, this step is carried out simultaneously with a step of forming a contact with an N-type polysilicon film serving as the gate electrode of a peripheral transistor formed on the same substrate, as can be seen by persons with ordinary skill in the art.

A step serving as one of greater features of the present invention will be described below.

Figure 80A:
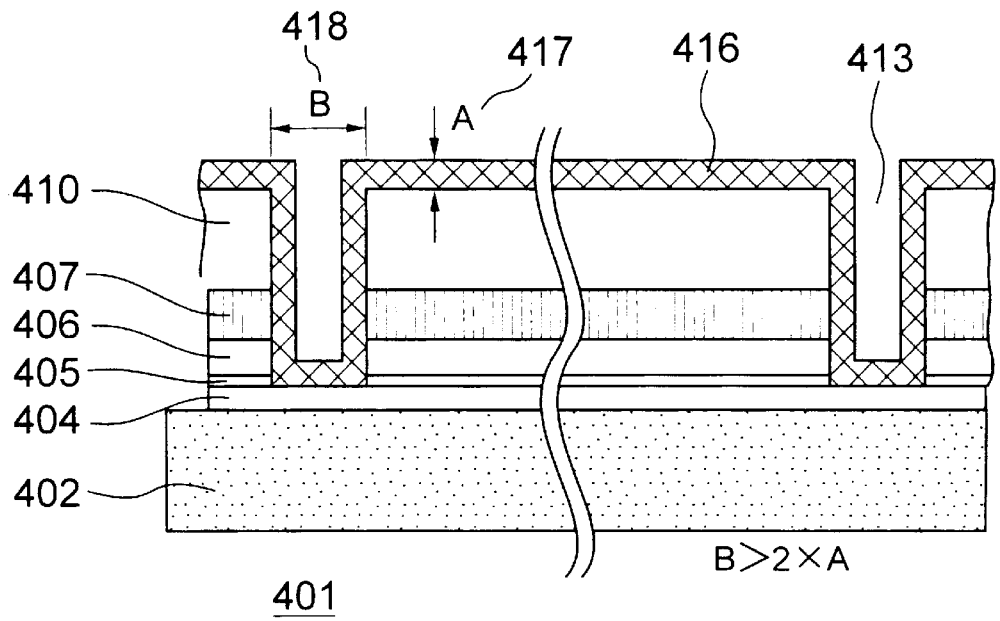
FIGS. 80(a) and 80(b) are sectional views showing a part of the first preferred embodiment of a producing process according to the present invention.

As can be seen from FIG. 80, the pattern of the resist having been used as the mask is peeled off. Thereafter, in the BPSG film 410 and the contact hole 413, a silicon film 416 is deposited as an insulating film by the well known LPCVD method so as to have a thickness of A (=15 nm). At this time, the diameter of the contact hole 413 has been set to be B (=0.5 μm) so as to meet the following expression (2).

$$B > 2 \times A \qquad (2)$$

This expression is a conditional expression which has been set to prevent the silicon nitride film 416 embedded in the contact hole 413 from being tightly embedded in the contact hole 413.

Figure 80B:
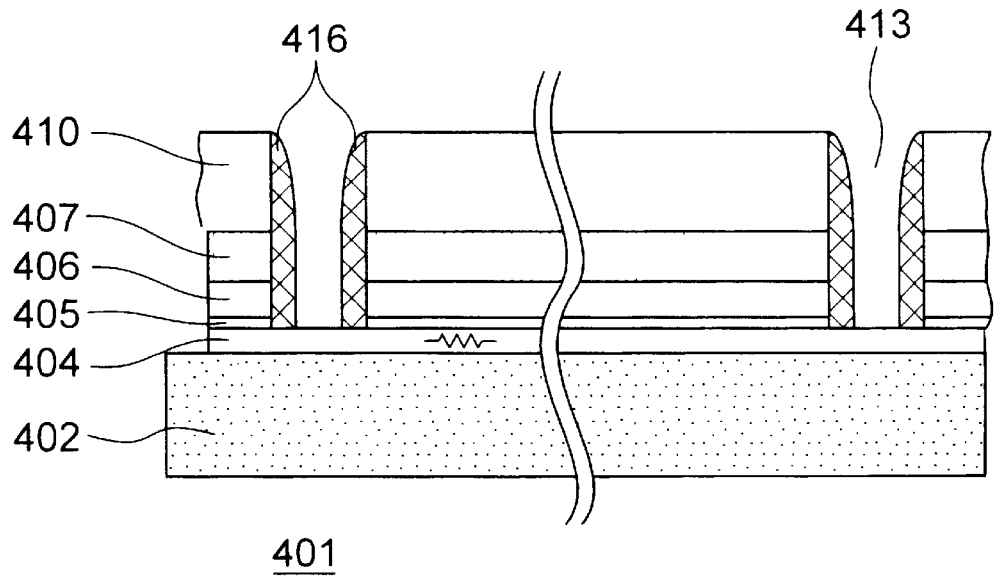

Then, as can be seen from FIG. 80(b), the silicon nitride film 416 is etched back so that the film 416 leaves only in the contact hole 413 as shown in the figure. Thus, the remaining silicon nitride film 416 covers the exposed side wall of the polycide film 406.

Figure 81:
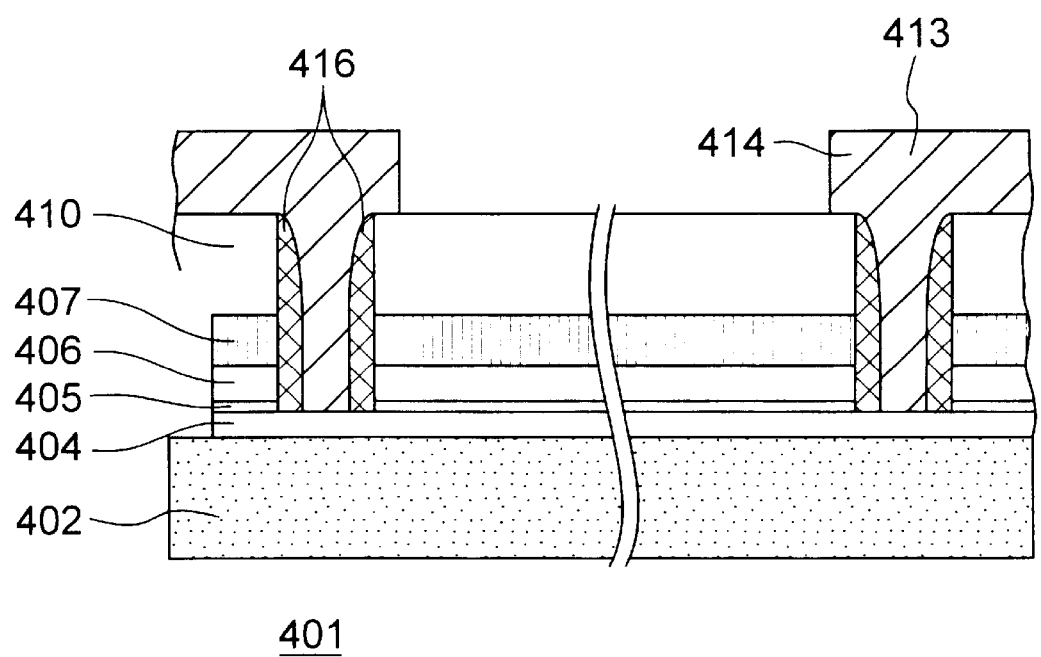
FIG. 81 is a sectional view showing a part of the first preferred embodiment of a producing process according to the present invention.

Then, as can be seen from FIG. 81, after a composite film of a Ti film and a TiN film is formed as a barrier metal so as to have a thickness of 40 nm, an AlSiCu film 414 is formed on the whole surface including the gap of the contact hole 413. This film 414 is patterned by a desired method so as to have a desired wiring pattern. Thus, a high resistive element shown in FIG. 3 is obtained. That is, in this element, the lowermost N-type polysilicon film 404 is connected between the AlSiCu films 414 and 414 in the right and left contact holes 413 and 413 in the figure. Furthermore, the polycide film 406 is electrically separated from the N-type polysilicon film 404 so as not to be connected in parallel thereto, so that the value of resistance is not lowered.

The device itself of FIG. 81 thus obtained will be described below. That is, in FIG. 81, as described above, this high resistive element is intended to be used for separating only the N-type polysilicon film 404, which serves as a lower floating gate material having a high resistance in a double-layer gate type memory cell transistor, from the polycide film 406 serving as the upper control gate material having a low resistance. Therefore, on the silicon oxide film 402 serving as an element isolating film on the semiconductor substrate 1, the N-type polysilicon film 404 serving as the floating gate material in the memory cell transistor is formed. Above the film 404, the insulating film 405, the polycide film 406 serving as the control gate material, the polycide film 407 and the BPSG film 410 are sequentially formed. In these films, there is formed a contact hole 413 which reaches the surface of the N-type polysilicon film 404 from the BPSG film 410 to expose the surface. The inner wall of the contact hole 413 is covered with the insulating silicon nitride film 416. Inside of the silicon nitride film 416 in the contact hole 413, the AlSiCu film 414 serving as an electrode material is embedded. The bottom surface of the film 414 contacts the exposed surface of the N-type polysilicon film 404 so as to electrically conduct therewith. Thus, the N-type polysilicon film 404 is connected between the two electrodes (films 414) to form a high resistive element.

The high resistive element with such a construction will be further described as follows.

In this element, between the polycide film 406 having a relatively low sheet resistance and the AlSiCu film 414, the silicon nitride film 416 serving as an insulating film exists in a side wall. Therefore, the polycide film 406 is electrically isolated. Thus, only the N-type polysilicon having a relatively high sheet resistance functions as a resistive element. Therefore, a resistive element having a high resistance of M Ω order can be formed in a slight region.

Furthermore, the insulating film 416 provided between the polycide film 406 and the AlSiCu film 414 is not required to be formed of a silicon nitride film. For example, it may be formed of a CVD-SiO$_2$ film. The CVD-SiO$_2$ film has a small etching selectivity to the BPSG film which is a protective coat. Therefore, at a side wall etchback step, the surface is flattened at the same time that a side wall of a SiO$_2$ film is formed and that the thickness of the BPSG film is slightly decreased. Therefore, the shape of a film, which will be subsequently formed and which underlies the AlSiCu film, becomes smooth, so that it is possible to prevent the AlSiCu film from being cut due to the distance in level and it is possible to ensure reliability.

In addition, even if a conductive film, such as a polymetal film or a polysilicon film, is substituted for the polycide gate electrode 406, it is naturally possible to obtain the same effects.

In addition, while the n-type polysilicon constituting the resistive element has been formed of the same material as at least a part of the floating gate electrode material constituting the memory cell transistor provided on the same substrate and at least a part of the gate electrode material constituting the peripheral transistor, the same effects can be obtained even if the resistive element is formed of a P-type polysilicon.

Figure 85:
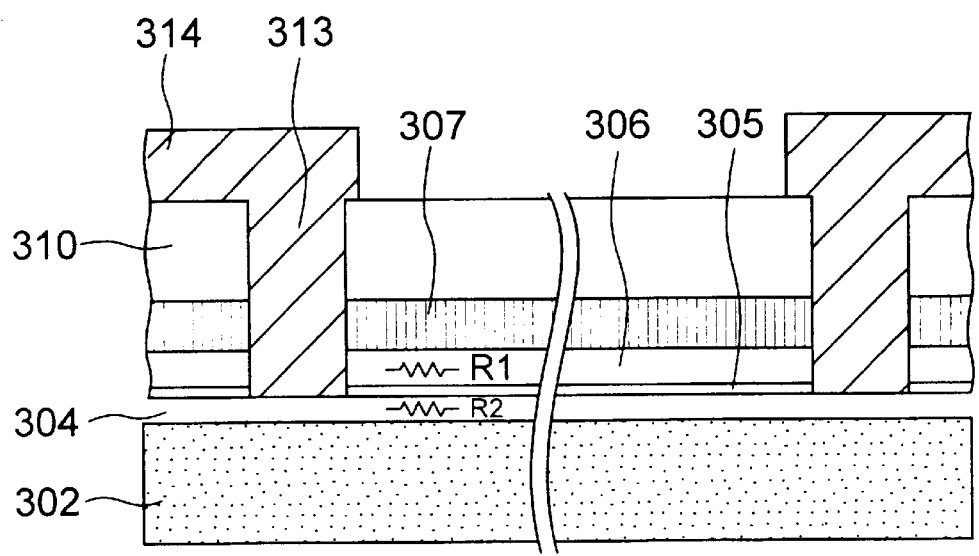
FIG. 85 is a sectional view showing a producing process in a second related art.

FIG. 85 is a sectional view for explaining the effects of the example of FIG. 81. In FIG. 85, a contact hole 313 passes through a control gate electrode material 306 in a memory cell transistor to contact a floating gate electrode material 304. In this case, one functioning as a resistive element is a parallel connection having a resistance value R1 of a floating gate electrode material 304, and a resistance value R2 of a control gate electrode material 306. In this case, assuming that the whole resistance value is R, the following expression is satisfied.

$$R=R1\times R2/(R1+R2) \tag{1}$$

This resistance R is smaller than the resistance value R1 of the control gate material 306 which is required to be a relatively low sheet resistance. On the other hand, according to the example of FIG. 81, such a low resistance does not occur.

(7) Seventh Preferred Embodiment

This preferred embodiment is characterized in that, in order to prevent a floating gate material and a control gate material from being connected in parallel between a pair of wiring materials, a control hole is simply formed to be filled with a wiring material to remove an upper control gate material 506 as can be particularly seen from FIG. 82.

Only the point of an element producing method shown in FIGS. 82(a) and 82(b) will be briefly described as follows.

Figure 82A:
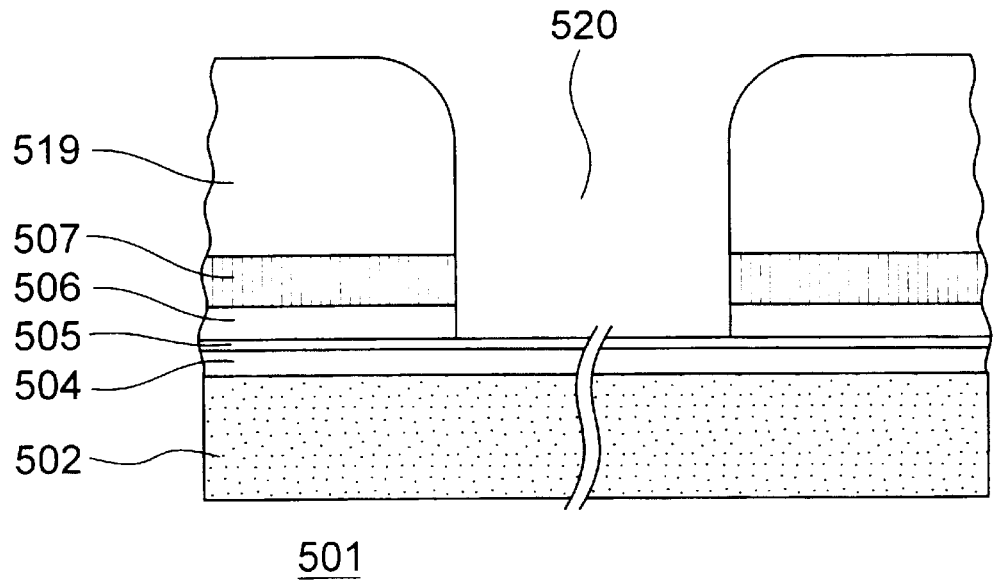
FIGS. 82(a) and 82(b) are sectional views showing a part of the second preferred embodiment of a producing process according to the present invention.

As can be seen from FIG. 82(a), after the step of FIG. 79(a), a resist 519 is patterned in the central portion on both sides of two contact hole intended regions in a resistive element intended region as shown in the figure. This is used as a mask for etching and removing a silicon nitride film 507 and a polycide film 506.

Figure 82B:
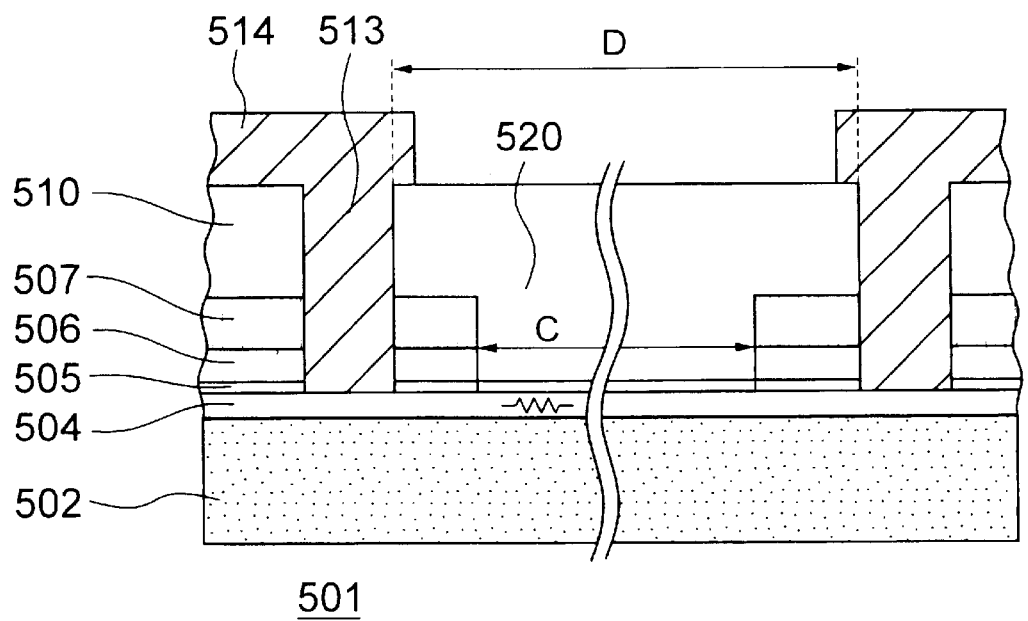

Then, as can be seen from FIG. 82(b), a polycide film 510 is formed. Thereafter, contact holes 513 and 513 are formed by a well known technique, and a composite film of a Ti film and a TiN film is formed as a barrier metal. Thereafter, an AlSiSu film 514 is formed to be patterned to form a desired wiring pattern. Thus, a high resistive element shown in FIG. 82(b) is obtained.

Furthermore, if necessary, as shown in FIG. 82(a), after a region 520 is formed, this may be used as a mask for self-aligningly introducing an impurity into an N-type polysilicon film 504 to vary the film 504 at the same step as a step of forming a diffusion layer in a process for producing a memory cell transistor.

That is, as can be seen from FIG. 82(b), this high resistive element is formed as follows. An n-type polysilicon film (a floating gate material) 504 is formed on an element isolating film 502 on a substrate 501. On the film 504, an insulating film 505, a polycide film (a control gate material) 506, a silicon nitride film 507 and a BPSG film 510 are formed. The silicon nitride film 507 and the polycide film 507 are removed at the central portion thereof. A contact hole 513 is formed on the right and left sides in the figure, and an electrode wiring layer 514 is embedded therein. The bottom face of the layer 514 is electrically connected to the top face of the N-type polysilicon film 504. Thus, the N-type polysilicon film 404 is connected by a distance C between the pair of electrode wiring layers 514 and 514 to form a high resistive element.

In this element, unlike the first preferred embodiment, the polycide film 506 having a relatively low sheet resistance is electrically connected to the electrode wiring layer 514 connected to the resistive element. However, since the polycide film 506 is interrupted in a region referenced by 520 in FIG. 83(b), a passage for bypassing as a resistance is closed, and one functioning as a resistive element comprises only an N-type polysilicon having a relatively high sheet resistance.

While one place of the polycide film 506 has been cut in the above description, a plurality of places may be cut.

Furthermore, the lower limit to the region (distance C) shown by reference number 520 in FIG. 82(b) may be defined by the insulation between two adjacent polycide films 506 is ensured. In addition, the distance D of the region 521 is a relatively large value since an element having a high resistance of MΩorder. Even if the sheet resistance of the N-type polysilicon film 504 is a very great value of about 500 Ω☐, the distance C is required to be 2 mm even if it is formed at a width of 1 μm. Therefore, it is not required to carry out a fine patterning technique in order to form the region 520.

In addition, the region (distance C) shown by reference number 520 in FIG. 82(b) can be freely controlled using a resist pattern 519. Thus, there is an advantage in that the resistance value can be finely controlled. The resistive value can be finely varied if the ion implantation for forming a diffusion layer constituting a memory cell transistor and peripheral transistor, which are to be formed on the same substrate, is carried out by using the silicon nitride 507, which has been etched by the resist pattern 519, as a mask to control an impurity introducing region for introducing an impurity into an N-type polysilicon film which is to be a resistive element. Naturally, in order to form an element having a higher resistance, the front face of a resistive element intended region may be covered at the ion implantation step of forming a diffusion layer constituting a memory cell transistor and peripheral transistor which are formed on the same substrate.

First, at a step shown in FIG. 82(a), the resist pattern 519 may be used as a mask to etch and remove the silicon nitride film 507 and the polycide film 506, and subsequently, the insulating film (the composite film comprising silicon oxide film/silicon nitride film/silicon oxide film) 505 may be etched and removed.

In addition, as described in the sixth preferred embodiment, the same effects can be obtained even if a conductive film, such as polymetal film or a polysilicon film, is substituted for the polycide gate electrode (506).

Moreover, while the N-type polysilicon constituting the resistive element has been formed of the same material as at least a part of the floating gate electrode material constituting the memory cell transistor and at least a part of the gate electrode material constituting the peripheral transistor, which have been formed on the same substrate, the same effects can be naturally obtained even if the resistive element is formed of a P-type polysilicon.

As can be seen from the foregoing, according to the sixth and seventh preferred embodiments, the following operations and effects can be obtained.

The parallel connection between the high resistive wiring layer (the first gate electrode material) and the low resistive wiring layer (the second gate electrode material), which increases the size of the high resistive element, can be electrically separated, and the electrode terminal can be self-aligningly formed only in the high resistive wiring layer. Thus, the high resistive element can be stably formed so as to have the minimum area. In addition, it is possible to form peripheral transistors at a high density without ensuring the alignment margin around the contact hole in the peripheral transistor. Moreover, while the separation of the low resistive element has prevented the deterioration of the resistance value due to the parallel connection between the high resistive wiring layer (the first gate electrode material) and the low resistive wiring layer (the second gate electrode material), the impurity can be self-aligningly introduced only into the resistive elements existing in the separated region, so that the resistance value can be finely adjusted at a desired resistance value. In addition, the impurity can finely adjust the resistance value by utilizing the impurity introducing step of forming the memory transistor or peripheral transistor which are provided on the same substrate, so that it is possible to easily carry out circuit design and design change.

Thus, according to the present invention, when a high resistive element is prepared as one of peripheral circuits of a semiconductor device having a double-layer electrode type transistor, a low resistive control gate material of the transistor can be separated to easily prepare a small high resistive element using a high resistive floating gate material in a process for preparing a double-layer gate electrode type transistor.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor device comprising:

a semiconductor substrate;

a plurality of first diffusion layers having a low impurity density, said first diffusion layers being formed on the surface of said semiconductor substrate;

a plurality of second diffusion layers having a high impurity density, said second diffusion layers being formed on the surface of said semiconductor substrate;

a plurality of first contacts, each of which contacts said first diffusion layers and each of which is formed of a semiconductor; and a plurality of second contacts, each of which contacts said second diffusion layers and each of which is formed of a metal.

2. A semiconductor device as set forth in claim 1, which further comprises a memory cell array and a peripheral circuit and wherein said plurality of first diffusion layers are formed in said memory cell array and a part of said peripheral circuit, and said plurality of second diffusion layers are formed in other part of said peripheral circuit.

3. A semiconductor device as set forth in claim 1, wherein each of said plurality of first diffusion layers is a diffusion layer, to which a high voltage is applied, and which is connected to a corresponding one of said first contacts of said semiconductor, and said each of said plurality of second diffusion layers is a diffusion layer, to which a high voltage is not applied, and which is connected to a corresponding one of said second contacts of said metal.

4. A semiconductor device as set forth in claim 1, which further comprises:

a high voltage circuit having a plurality of MOS transistors having a thick gate insulating film; and a low voltage circuit having a plurality of MOS transistors having a thin gate insulating film, wherein each of said plurality of first contacts is formed in said high voltage circuit portion, and each of said plurality of second contacts is formed in said low voltage circuit portion.

5. A semiconductor device as set forth in claim 1, wherein at least the bottom portion of each of said first contacts is formed of semiconductor material, said bottom portion being connected to a corresponding one of said first diffusion layers, and the remaining portion of each of said first contacts is formed of a metal.

6. A semiconductor device as set forth in claim 1, wherein said semiconductor material is a polycrystalline silicon or an amorphous silicon, and said metal is tungsten, aluminum or metal including at least one of tungsten, aluminum and titanium.

* * * * *